(12) United States Patent
Kinoshita et al.

(10) Patent No.: US 12,418,287 B2
(45) Date of Patent: Sep. 16, 2025

(54) SWITCH SYSTEM

(71) Applicant: Panasonic Intellectual Property Management Co., Ltd., Osaka (JP)

(72) Inventors: Yusuke Kinoshita, Kyoto (JP); Ryosuke Maeda, Osaka (JP); Satoshi Nakazawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 72 days.

(21) Appl. No.: 18/563,242

(22) PCT Filed: Mar. 24, 2022

(86) PCT No.: PCT/JP2022/013914
§ 371 (c)(1),
(2) Date: Nov. 21, 2023

(87) PCT Pub. No.: WO2022/249697
PCT Pub. Date: Dec. 1, 2022

(65) Prior Publication Data
US 2024/0259018 A1    Aug. 1, 2024

(30) Foreign Application Priority Data

May 27, 2021    (JP) .................................. 2021-089571

(51) Int. Cl.
*H03K 17/687*    (2006.01)
(52) U.S. Cl.
CPC .............................. *H03K 17/6871* (2013.01)

(58) Field of Classification Search
CPC .. H03K 17/6871; H03K 17/08; H03K 17/081; H03K 17/16
See application file for complete search history.

(56) References Cited

U.S. PATENT DOCUMENTS

| 6,087,877 A | 7/2000 | Gonda et al. |
| 2005/0168264 A1* | 8/2005 | Fukami .............. H03K 17/0822 |
| | | 327/535 |

(Continued)

FOREIGN PATENT DOCUMENTS

| DE | 102018112509 B4 * | 7/2021 | ............. H01L 23/60 |
| JP | H11-032429 A | 2/1999 | |

(Continued)

OTHER PUBLICATIONS

International Search Report dated Jun. 14, 2022 issued in International Patent Application No. PCT/JP2022/013914, with English translation.

*Primary Examiner* — Metasebia T Retebo
(74) *Attorney, Agent, or Firm* — Rimon P.C.

(57) ABSTRACT

In a switch system, a voltage clamping element is connected to a semiconductor switch in parallel. An active clamping circuit is connected between a control terminal and a first main terminal of the semiconductor switch. The active clamping circuit includes a first diode, a second diode, and a control switch. A second anode of the second diode is connected to a first anode of the first diode. The control switch is connected between the first anode of the first diode and the control terminal of the semiconductor switch. A second control unit controls the control switch. A breakdown voltage of the first diode is smaller than a clamp voltage of the voltage clamping element.

12 Claims, 25 Drawing Sheets

(56) References Cited

U.S. PATENT DOCUMENTS

| | | | | |
|---|---|---|---|---|
| 2005/0189965 A1* | 9/2005 | Tihanyi | ................ | H03K 17/302 327/108 |
| 2007/0008747 A1 | 1/2007 | Soldano et al. | | |
| 2009/0052211 A1* | 2/2009 | Asai | .................... | H02M 7/5387 363/56.05 |
| 2009/0296291 A1* | 12/2009 | Volke | ................ | H03K 17/0822 361/56 |
| 2010/0033230 A1 | 2/2010 | Lueders et al. | | |

FOREIGN PATENT DOCUMENTS

| | | | | |
|---|---|---|---|---|
| JP | 2002151989 A | * | 5/2002 | ......... H03K 17/0826 |
| JP | 2005-223399 A | | 8/2005 | |
| JP | 2007-028894 A | | 2/2007 | |
| JP | 2007-166734 A | | 6/2007 | |
| JP | 2008-539625 A | | 11/2008 | |
| JP | 2012-004979 A | | 1/2012 | |
| JP | 2017-022510 A | | 1/2017 | |

* cited by examiner

SWITCH SYSTEM

This application is the U.S. National Phase under 35 U.S.C. § 371 of International Patent Application No. PCT/JP2022/013914, filed on Mar. 24, 2022, which in turn claims the benefit of Japanese Patent Application No. 2021-089571, filed on May 27, 2021, the entire disclosures of which Applications are incorporated by reference herein.

TECHNICAL FIELD

The present disclosure generally relates to a switch system, and more particularly relates to a switch system including a semiconductor switch.

BACKGROUND ART

Patent Literature 1 discloses an active clamping circuit (switch system) including: a first switch element (semiconductor switch); a first diode causing breakdown due to an overvoltage across the first switch element; a first resistor for detecting a current flowing through the first diode; and a control circuit for controlling a current flowing through the first switch element by amplifying the voltage across the first resistor. The first switch element is implemented as an N-channel MOSFET.

In the switch system of Patent Literature 1, if the energy generated in the inductance component of the line of a load circuit connected across the semiconductor switch exceeds the quantity that the semiconductor switch can withstand, then the characteristics of the semiconductor switch may deteriorate even when the clamp voltage is stabilized.

CITATION LIST

Patent Literature

Patent Literature 1: JP 2012-4979 A

SUMMARY OF INVENTION

It is therefore an object of the present disclosure to provide a switch system with the ability to reduce a surge voltage applied to a semiconductor switch when the semiconductor switch turns off.

A switch system according to an aspect of the present disclosure includes a semiconductor switch, a voltage clamping element, an active clamping circuit, a first control unit, and a second control unit. The semiconductor switch has a control terminal, a first main terminal, and a second main terminal. The voltage clamping element is connected to the semiconductor switch in parallel. The active clamping circuit is connected between the control terminal and the first main terminal of the semiconductor switch. The first control unit controls the semiconductor switch. The second control unit controls the active clamping circuit. The active clamping circuit includes a first diode, a second diode, and a control switch. The first diode has a first anode and a first cathode. The first diode causes breakdown upon application of voltage between the first main terminal and the second main terminal of the semiconductor switch. The second diode has a second anode and a second cathode. The second anode of the second diode is connected to the first anode of the first diode. The control switch is connected between the first anode of the first diode and the control terminal of the semiconductor switch. The second control unit is configured to control the control switch. A breakdown voltage of the first diode is smaller than a clamp voltage of the voltage clamping element.

A switch system according to another aspect of the present disclosure includes a semiconductor switch, a voltage clamping element, an active clamping circuit, a first control unit, and a second control unit. The semiconductor switch has a control terminal, a first main terminal, and a second main terminal. The voltage clamping element is connected to the semiconductor switch in parallel. The active clamping circuit is connected between the control terminal and the first main terminal of the semiconductor switch. The first control unit controls the semiconductor switch. The second control unit controls the active clamping circuit. The active clamping circuit includes a first diode, a second diode, and a control switch. The first diode has a first anode and a first cathode. The first diode causes breakdown upon application of voltage between the first main terminal and the second main terminal of the semiconductor switch. The second diode has a second anode and a second cathode. The second anode of the second diode is connected to the first anode of the first diode. The control switch is connected between the first anode of the first diode and the control terminal of the semiconductor switch. The control switch is a pnp transistor having a base, a collector, and an emitter. The emitter of the pnp transistor is connected to the second cathode of the second diode. The collector of the pnp transistor is connected to the control terminal of the semiconductor switch. The second control unit includes a first resistor, a second resistor, a field effect transistor, and a delay circuit. The first resistor is connected between the base and the emitter of the pnp transistor. The second resistor is connected to the base of the pnp transistor and connected to the first resistor in series. The field effect transistor has a gate, a drain, and a source. The field effect transistor is connected between the second resistor and the second main terminal of the semiconductor switch. The delay circuit is connected between the first control unit and the gate of the field effect transistor. The delay circuit includes a gate resistor and a capacitor. The gate resistor is connected between the first control unit and the gate of the field effect transistor. The capacitor is connected between the gate and the source of the field effect transistor. A breakdown voltage of the first diode is smaller than a clamp voltage of the voltage clamping element.

A switch system according to still another aspect of the present disclosure includes a semiconductor switch, a voltage clamping element, an active clamping circuit, a first control unit, and a second control unit. The semiconductor switch has a control terminal, a first main terminal, and a second main terminal. The voltage clamping element is connected to the semiconductor switch in parallel. The active clamping circuit is connected between the control terminal and the first main terminal of the semiconductor switch. The first control unit controls the semiconductor switch. The second control unit controls the active clamping circuit. The active clamping circuit includes a first diode, a second diode, and a control switch. The first diode has a first anode and a first cathode. The first diode causes breakdown upon application of voltage between the first main terminal and the second main terminal of the semiconductor switch. The second diode has a second anode and a second cathode. The second cathode of the second diode is connected to the first cathode of the first diode. The control switch is connected between the first anode of the first diode and the control terminal of the semiconductor switch. The control switch is a field effect transistor having a gate, a drain, and a source. The drain of the field effect transistor is connected to the first anode of the first diode. The source of the field effect transistor is connected to the control terminal of the semiconductor switch. The second control unit includes a capacitor and a Zener diode. The capacitor has a first terminal and a second terminal. The first terminal of the capacitor is connected to the gate of the field effect transistor. The second terminal of the capacitor is connected to the first cathode of the first diode and the second cathode of the second diode. The Zener diode has a third anode and a third cathode. The third cathode of the Zener diode is connected to the first terminal of the capacitor and the gate of the field effect transistor. The third anode of the Zener diode is connected to the source of the field effect transistor.

DESCRIPTION OF EMBODIMENTS

First Embodiment

A switch system 20 according to a first embodiment will be described with reference to FIGS. 1 and 2.

(1.1) Overview

Figure 1:
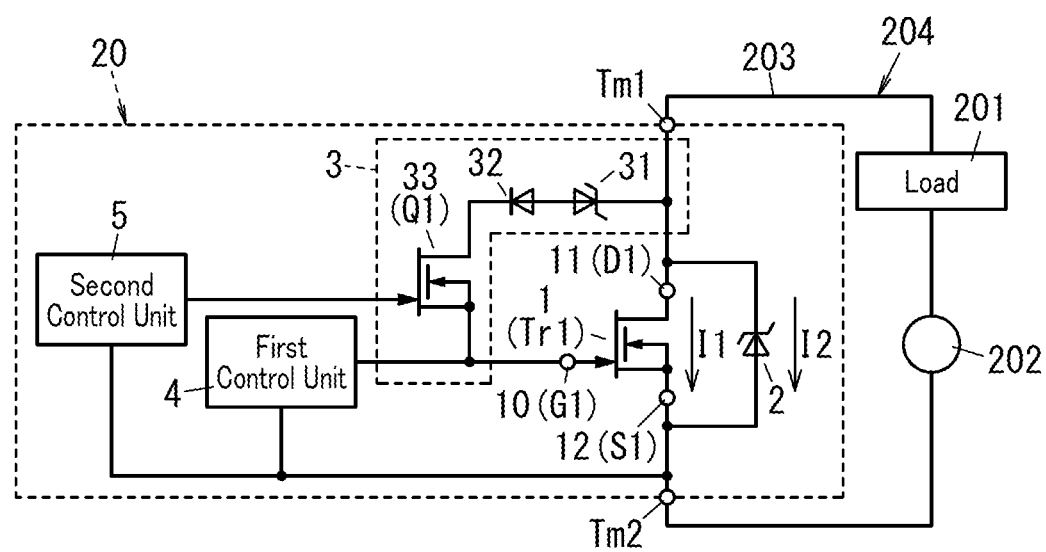
FIG. 1 is a circuit diagram of a switch system according to a first embodiment.

As shown in FIG. 1, the switch system 20 includes a semiconductor switch 1, a voltage clamping element 2, an active clamping circuit 3, a first control unit 4, and a second control unit 5. The semiconductor switch 1 has a control terminal 10, a first main terminal 11, and a second main terminal 12. The voltage clamping element 2 is connected to the semiconductor switch 1 in parallel. The active clamping circuit 3 is connected between the control terminal 10 and the first main terminal 11 of the semiconductor switch 1. The first control unit 4 controls the semiconductor switch 1. The second control unit 5 controls the active clamping circuit 3.

In the switch system 20, a load circuit 204 including a series circuit of a load 201 and a power supply 202 is connected between the first main terminal 11 and second main terminal 12 of the semiconductor switch 1, for example. The switch system 20 further includes a first external terminal Tm1, to which the first main terminal 11 of the semiconductor switch 1 is connected, and a second external terminal Tm2, to which the second main terminal 12 of the semiconductor switch 1 is connected, for example. In the switch system 20, the load circuit 204 is connected between the first external terminal Tm1 and the second external terminal Tm2, for example. The load 201 and the power supply 202 are not constituent elements of the switch system 20. The power supply 202 may be a DC power supply, for example. The DC power supply may have an output voltage of 100 V to 400 V, for example.

In the switch system 20, the first external terminal Tm1 and the second external terminal Tm2 are terminals, through which a main current I1 flowing through the semiconductor switch 1 flows, when the semiconductor switch 1 is in on state (i.e., electrically conductive).

(1.2) Respective Constituent Elements of Switch System
(1.2.1) Semiconductor Switch The semiconductor switch 1 may be, for example, a junction field effect transistor Tr1.

The junction field effect transistor Tr may be, for example, a GaN-based gate injection transistor (GIT). In this case, the junction field effect transistor Tr includes, for example, a substrate, a buffer layer, a first nitride semiconductor layer, a second nitride semiconductor layer, a source electrode, a gate electrode, a drain electrode, and a p-type layer. The buffer layer is formed on the substrate. The first nitride semiconductor layer is formed on the buffer layer. The second nitride semiconductor layer is formed on the first nitride semiconductor layer. The source electrode, the gate electrode, and the drain electrode are formed on the second nitride semiconductor layer. The p-type layer is interposed between the gate electrode and the second nitride semiconductor layer. In the junction field effect transistor Tr1, a diode structure is formed by the second nitride semiconductor layer and the p-type layer. The substrate may be a silicon substrate, for example. The buffer layer may be an undoped GaN layer, for example. The first nitride semiconductor layer may be, for example, an undoped GaN layer. The second nitride semiconductor layer may be, for example, an undoped AlGaN layer. The p-type layer may be, for example, a p-type AlGaN layer. Each of the buffer layer, the first nitride semiconductor layer, and the second nitride semiconductor layer may include impurities such as Mg, H, Si, C, and O to be inevitably contained during their growing process by metal-organic vapor phase epitaxy (MOVPE), for example.

The control terminal 10 of the semiconductor switch 1 is a gate terminal G1 connected to the gate electrode of the junction field effect transistor Tr1. The first main terminal 11 of the semiconductor switch 1 is a drain terminal D1 connected to the drain electrode of the junction field effect transistor Tr1. The second main terminal 12 of the semiconductor switch 1 is a source terminal S1 connected to the source electrode of the junction field effect transistor Tr1.

(1.2.2) Voltage Clamping Element

The voltage clamping element 2 is connected to the semiconductor switch 1 in parallel as described above. The voltage clamping element 2 has an overvoltage protection function of restricting the surge voltage applied to the semiconductor switch 1 when the semiconductor switch 1 turns off to a fixed clamp voltage. That is to say, the voltage clamping element 2 has the function of restricting the voltage between the first main terminal 11 and second main terminal 12 of the semiconductor switch 1 to the clamp voltage when the semiconductor switch 1 turns off. The voltage clamping element 2 may be, for example, a Zener diode (such as a TVS diode). In the Zener diode serving as the voltage clamping element 2, the anode thereof is connected to the second main terminal 12 of the semiconductor switch 1 and the cathode thereof is connected to the first main terminal 11 of the semiconductor switch 1. The voltage clamping element 2 does not have to be a Zener diode but may also be varistor. The voltage clamping element 2 has the function of reducing, when a voltage equal to or larger than a predetermined voltage value is applied thereto, the chances of the voltage across the voltage clamping element 2 increasing to a voltage value larger than the predetermined voltage value. In the meantime, an electric current I2 flows through the voltage clamping element 2.

The larger the current value of a current I2, flowing through the voltage clamping element 2 when the voltage clamping element 2 starts performing the clamping operation, is, the higher the clamp voltage of the voltage clamping element 2 is. That is why if the main current I1 flowing through the semiconductor switch 1 is cut off, the clamp voltage of the voltage clamping element 2 varies according to the magnitude of the current value of the main current I1 that flowed through the semiconductor switch 1 just before the main current I1 is cut off.

(1.2.3) Active Clamping Circuit

The active clamping circuit 3 includes a first diode 31, a second diode 32, and a control switch 33.

The first diode 31 has a first anode and a first cathode. In the first diode 31, the first cathode thereof is connected to the first main terminal 11 of the semiconductor switch 1. The first diode 31 causes breakdown upon application of voltage between the first main terminal 11 and the second main terminal 12 of the semiconductor switch 1. The breakdown voltage of the first diode 31 is smaller than the clamp voltage of the voltage clamping element 2. The first diode 31 may be, for example, a Zener diode.

The second diode 32 has a second anode and a second cathode. In the second diode 32, the second anode thereof is connected to the first anode of the first diode 31. The second cathode of the second diode 32 is connected to the control terminal 10 of the semiconductor switch 1 via the control switch 33.

The control switch 33 is connected between the second cathode of the second diode 32 and the control terminal 10 of the semiconductor switch 1. Thus, the control switch 33 is connected between the first anode of the first diode 31 and the control terminal 10 of the semiconductor switch 1.

The control switch 33 may be, for example, a field effect transistor Q1 having a gate, a drain, and a source. In the control switch 33, the drain of the field effect transistor Q1 is connected to the second cathode of the second diode 32, the source of the field effect transistor Q1 is connected to the control terminal 10 of the semiconductor switch 1, and the gate of the field effect transistor Q1 is connected to the second control unit 5. In this embodiment, the field effect transistor Q1 is a junction field effect transistor. However, this is only an example and should not be construed as limiting. Alternatively, the field effect transistor Q1 may also be, for example, a metal-oxide semiconductor field effect transistor (MOSFET).

(1.2.4) First Control Unit

The first control unit 4 controls the semiconductor switch 1. The first control unit 4 is connected to the control terminal 10 of the semiconductor switch 1. More specifically, the first control unit 4 is connected between the control terminal 10 and second main terminal 12 of the semiconductor switch 1. The first control unit 4 includes a first DC power supply (first drive power supply) and a first complementary metal-oxide semiconductor (CMOS) inverter. The first control unit 4 may output, as a first control signal for controlling the semiconductor switch 1, a first on signal to turn the semiconductor switch 1 on (e.g., a voltage signal of 15 V) or a first off signal to turn the semiconductor switch 1 off (e.g., a voltage signal of 0 V). The first control unit 4 may change the voltage value of the first control signal within the range from 0 V to 15 V, for example.

(1.2.5) Second Control Unit

The second control unit 5 is configured to control the control switch 33. The second control unit 5 is connected to the gate of the field effect transistor Q1 serving as the control switch 33.

The second control unit 5 is connected between the gate of the field effect transistor Q1 and the second main terminal 12 of the semiconductor switch 1. The second control unit 5 includes a second DC power supply (second drive power supply) and a second complementary metal-oxide semiconductor (CMOS) inverter. The second control unit 5 may output, as a second control signal for controlling the control switch 33, a second on signal to turn the field effect transistor Q1 on (e.g., a voltage signal of 15 V) or a second off signal to turn the field effect transistor Q1 off (e.g., a voltage signal of 0 V). The second control unit 5 may change the voltage value of the second control signal within the range from 0 V to 15 V, for example.

(1.3) Exemplary Operation of Switch System

Next, an exemplary operation of the switch system 20 will be described with reference to FIG. 2. The waveform labeled as "semiconductor switch (Tr1)" indicates how the first control signal supplied to the control terminal 10 of the semiconductor switch 1 (junction field effect transistor Tr1) changes with time. Also, in FIG. 2, the waveform labeled as "control switch (Q1)" indicates how the second control signal supplied to the control switch 33 (field effect transistor Q1) changes with time. Furthermore, in FIG. 2, "Vgs" denotes a voltage between the gate terminal G1 and the source terminal S1 with respect to the source terminal S1 of the junction field effect transistor Tr1. Thus, "Vgs" denotes the voltage between the control terminal 10 and second main terminal 12 of the semiconductor switch 1. Furthermore, in FIG. 2, "Vds" denotes a voltage between the drain terminal D1 and the source terminal S1 with respect to the source terminal S1 of the junction field effect transistor Tr1. Thus, "Vds" denotes the voltage between the first main terminal 11 and second main terminal 12 of the semiconductor switch 1. The voltage clamping element 2 is connected to the semiconductor switch 1 in parallel. Thus, the voltage across the voltage clamping element 2 is the same as the voltage Vds between the first main terminal 11 and second main terminal 12 of the semiconductor switch 1.

Figure 2:
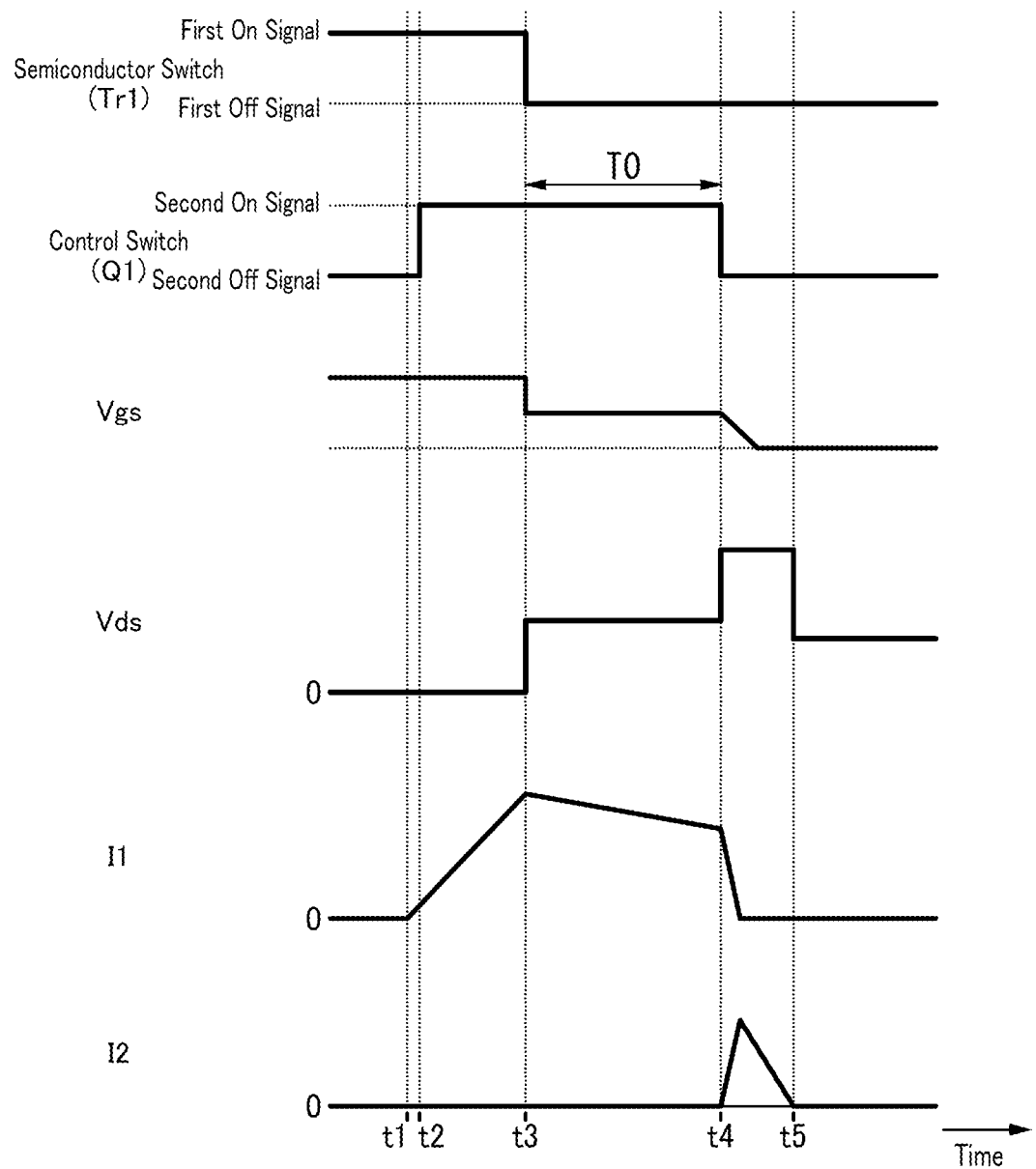
FIG. 2 illustrates how the switch system operates.

FIG. 2 illustrates how the switch system 20 operates, for example, in a situation where a short-circuit failure occurs to the load circuit 204 at a time t1 to cause the main current I1 of the semiconductor switch 1 to start to increase.

When the second control signal output from the second control unit 5 changes from an off signal (second off signal) into an on signal (second on signal) at a time t2, the control switch 33 of the active clamping circuit 3 is turned on.

Thereafter, when the main current I1 reaches a threshold value at a time t3 to cause the first control signal output from the first control unit 4 to change from an on signal (first on signal) into an off signal (first off signal), for example, the semiconductor switch 1 is turned off. In this switch system 20, the breakdown voltage of the first diode 31 is smaller than the clamp voltage of the voltage clamping element 2. Thus, the first diode 31 causes breakdown earlier than the voltage clamping element 2 and the current flowing through the first diode 31 flows into the control terminal 10 of the semiconductor switch 1 via the voltage clamping element 2 and the control switch 33. Consequently, the semiconductor switch 1 makes a transition from an off state (non-conductive state) into a semiconductive state where a main current I1 flows to make the voltage value of the voltage Vds between the first main terminal 11 and second main terminal 12 of the semiconductor switch 1 approximately equal to the clamp voltage of the first diode 31. As a result, the voltage Vds between the first main terminal 11 and second main terminal 12 of the semiconductor switch 1 is clamped by the active clamping circuit 3 and part of the energy stored in the inductance component of a line 203 of the load circuit 204 is consumed by the semiconductor switch 1. The main current I1 flowing through the semiconductor switch 1 starts to decrease at the time t3. The semiconductive state is an intermediate state between the non-conductive state (off state) and the conductive state (on state). The semiconductive state may be, for example, a state where a voltage of 200 V is applied to the semiconductor switch 1 when the power supply 202 as a DC power supply has an output voltage of 400 V and the active clamping circuit 3 has a clamp voltage of 200 V. That is to say, the semiconductive state herein refers to a state where the product of the resistance value of the semiconductor switch 1 and a leakage current flowing through the semiconductor switch 1 (i.e., the main current I1) is 200 V.

At a time t4, when a predetermined period T0 passes since the time t3, the second control signal output from the second control unit 5 changes from an on signal (second on signal) into an off signal (second off signal). In response, the semiconductor switch 1 turns off, a current I2 starts to flow through the voltage clamping element 2, the voltage Vds between the first main terminal 11 and second main terminal 12 of the semiconductor switch 1 is clamped at the clamp voltage of the voltage clamping element 2, and the absolute value of a current variation ratio (−dI1/dt) of the main current I1 of the semiconductor switch 1 increases to cause the main current I1 to decrease steeply to zero. Then, the current I2 of the voltage clamping element 2 starts to decrease.

When the current I2 of the voltage clamping element 2 goes zero at a time t5, the voltage Vds between the first main terminal 11 and second main terminal 12 of the semiconductor switch 1 becomes a constant voltage lower than the clamp voltage.

The switch system 20 may make the current value of the main current I1 flowing through the semiconductor switch 1 at the time t4 smaller than the current value of the main current I1 flowing through the semiconductor switch 1 at the time t3. This allows the switch system 20 to reduce the clamp voltage of the voltage clamping element 2 and thereby lower the voltage Vds between the first main terminal 11 and second main terminal 12 of the semiconductor switch 1.

In the switch system 20, while the first control unit 4 is outputting the first on signal to turn the semiconductor switch 1 on before outputting the first off signal to turn the semiconductor switch 1 off, the second control unit 5 outputs a second on signal to turn the control switch 33 on. Also, in this switch system 20, when the predetermined period T0 has passed since the output of the first off signal from the first control unit 4, the second control unit 5 outputs a second off signal that turns the control switch 33 off. The switch system 20 includes a timing control unit for controlling the first control unit 4 and the second control unit 5 when any error occurs to the load circuit 204, for example. The timing control unit controls the first control unit 4 and the second control unit 5 when an error occurs to the load circuit 204 to make the main current I1 flowing through the semiconductor switch 1 larger than a threshold value.

(1.4) Advantages

A switch system 20 according to the first embodiment includes a semiconductor switch 1, a voltage clamping element 2, an active clamping circuit 3, a first control unit 4, and a second control unit 5. The semiconductor switch 1 has a control terminal 10, a first main terminal 11, and a second main terminal 12. The voltage clamping element 2 is connected to the semiconductor switch 1 in parallel. The active clamping circuit 3 is connected between the control terminal 10 and the first main terminal 11 of the semiconductor switch 1. The first control unit 4 controls the semiconductor switch 1. The second control unit 5 controls the active clamping circuit 3. The active clamping circuit 3 includes a first diode 31, a second diode 32, and a control switch 33. The first diode 31 has a first anode and a first cathode. The first diode 31 causes breakdown upon application of voltage between the first main terminal 11 and the second main terminal 12 of the semiconductor switch 1. The second diode 32 has a second anode and a second cathode. The second anode of the second diode 32 is connected to the first anode of the first diode 31. The control switch 33 is connected between the first anode of the first diode 31 and the control terminal 10 of the semiconductor switch 1. The second control unit 5 is configured to control the control switch 33. A breakdown voltage of the first diode 31 is smaller than a clamp voltage of the voltage clamping element 2.

The switch system 20 according to the first embodiment may reduce a surge voltage applied to the semiconductor switch 1 when the semiconductor switch 1 turns off. More specifically, the switch system 20 according to the first embodiment may reduce the current value of the main current I1 flowing through the semiconductor switch 1 and thereby reduce the clamp voltage when the voltage clamping element 2 clamps the voltage Vds between the first main terminal 11 and second main terminal 12 of the semiconductor switch 1. This allows the switch system 20 to reduce the surge voltage applied between the first main terminal 11 and the second main terminal 12 of the semiconductor switch 1 when the semiconductor switch 1 turns off. Consequently, the switch system 20 may reduce deterioration in the characteristics of the semiconductor switch 1 and the voltage clamping element 2 (e.g., may reduce the chances of the semiconductor switch 1 and the voltage clamping element 2 coming to have a shorter life). In addition, the switch system 20 may reduce the clamp voltage, and therefore, may also reduce deterioration in the characteristics of the load 201 of the load circuit 204.

Second Embodiment

Figure 3:
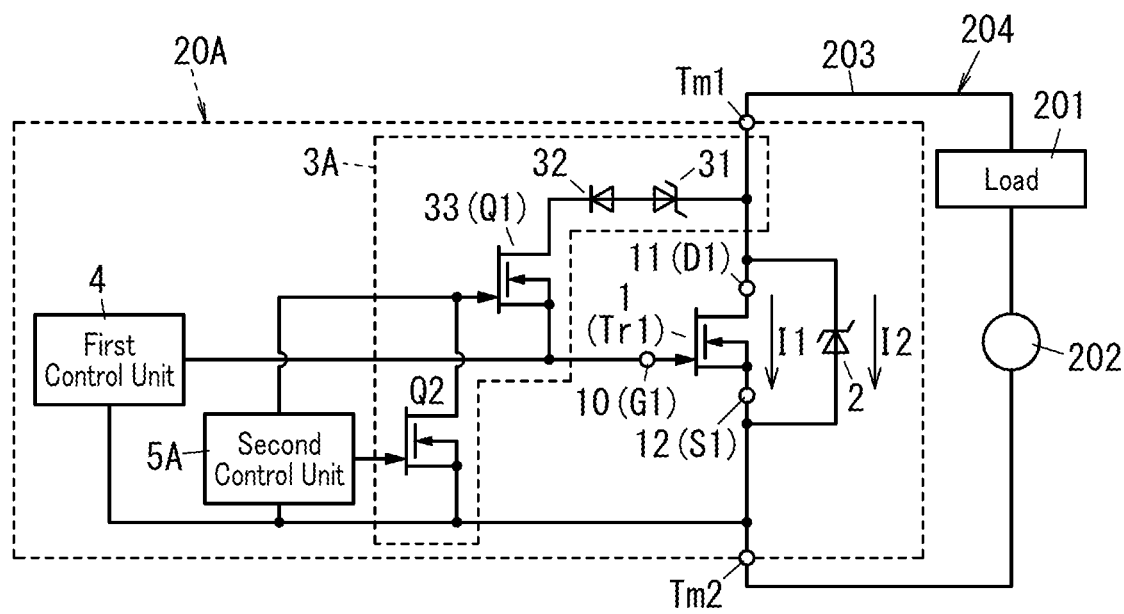
FIG. 3 is a circuit diagram of a switch system according to a second embodiment.

Next, a switch system 20A according to a second embodiment will be described with reference to FIG. 3.

The switch system 20A according to the second embodiment is substantially the same as the switch system 20 according to the first embodiment (refer to FIG. 1) but includes an active clamping circuit 3A and a second control unit 5A instead of the active clamping circuit 3 and the second control unit 5, respectively, which is a difference from the switch system 20 according to the first embodiment. In the following description, any constituent element of the switch system 20A according to this second embodiment, having the same function as a counterpart of the switch system 20 according to the first embodiment, will be designated by the same reference numeral as that counterpart's, and description thereof will be omitted herein.

The active clamping circuit 3A, as well as the active clamping circuit 3, includes a first diode 31, a second diode 32, and a control switch 33. In the following description, a field effect transistor Q1 serving as the control switch 33 will be hereinafter sometimes referred to as a "first field effect transistor Q1" and the gate, drain, and source of the field effect transistor Q1 will be hereinafter sometimes referred to as a first gate, a first drain, and a first source, respectively.

The active clamping circuit 3A further includes a second field effect transistor Q2. The second field effect transistor Q2 has a second gate, a second drain, and a second source. The second field effect transistor Q2 is connected between the first gate of the first field effect transistor Q1 and the second main terminal 12 of the semiconductor switch 1. In the second field effect transistor Q2, the second drain thereof is connected to the first gate of the first field effect transistor Q1, the second source thereof is connected to the second main terminal 12 of the semiconductor switch 1, and the second gate thereof is connected to the second control unit 5. In this embodiment, the second field effect transistor Q2 is a junction field effect transistor. However, this is only an example and should not be construed as limiting. Alternatively, the second field effect transistor Q2 may also be a MOSFET.

The second control unit 5A controls the first field effect transistor Q1 and the second field effect transistor Q2.

The switch system 20A turns the first field effect transistor Q1 off by making the second control unit 5A turn the second field effect transistor Q2 on. When a predetermined period has passed since the turn on of the first field effect transistor Q1, the second control unit 5A turns the second field effect transistor Q2 on, thereby turning the first field effect transistor Q1 off. This allows the second control unit 5A to keep the control switch 33 of the active clamping circuit 3A on only for the predetermined period.

In the switch system 20A, as well as in the switch system 20, the breakdown voltage of the first diode 31 is smaller than the clamp voltage of the voltage clamping element 2. Thus, in the switch system 20A, when the control switch 33 (first field effect transistor Q1) is turned on to turn the semiconductor switch 1 off, the voltage between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. In the switch system 20A, when the control switch 33 of the active clamping circuit 3A turns from on to off, the voltage between the first main terminal 11 and second main terminal 12 of the semiconductor switch 1 is clamped by the voltage clamping element 2.

The switch system 20A according to the second embodiment, as well as the switch system 20 according to the first embodiment, may also reduce the surge voltage applied to the semiconductor switch 1 when the semiconductor switch 1 turns off.

Third Embodiment

Figure 4:
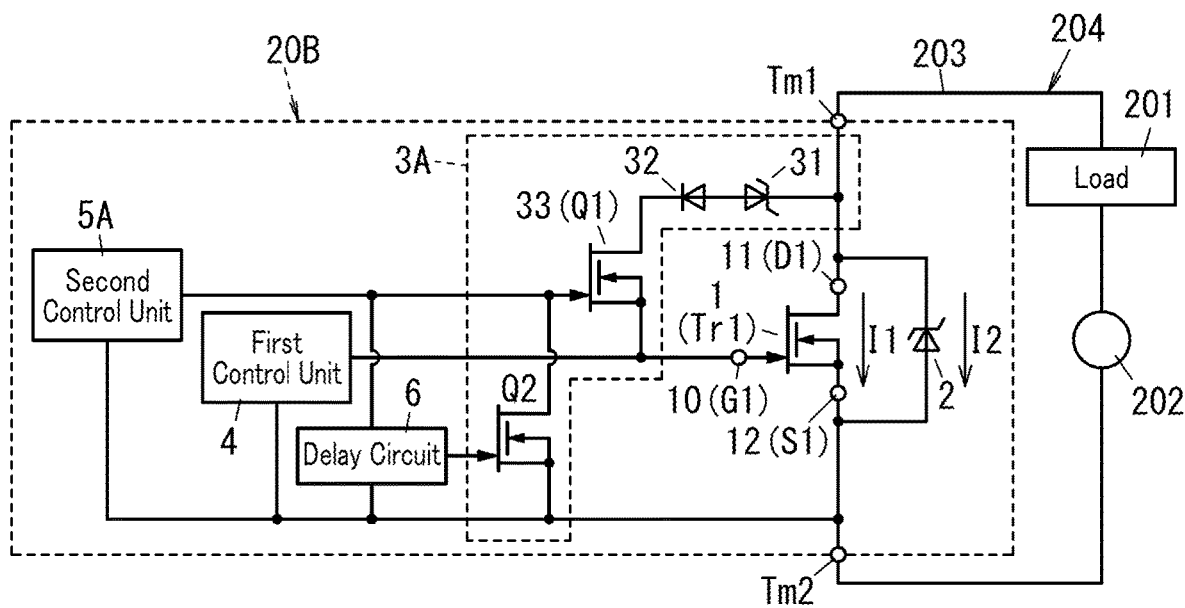
FIG. 4 is a circuit diagram of a switch system according to a third embodiment.

Next, a switch system 20B according to a third embodiment will be described with reference to FIG. 4.

The switch system 20B according to the third embodiment is substantially the same as the switch system 20A according to the second embodiment (refer to FIG. 3) but further includes a delay circuit 6, which is a difference from the switch system 20A according to the second embodiment. In the following description, any constituent element of the switch system 20B according to this third embodiment, having the same function as a counterpart of the switch system 20A according to the second embodiment, will be designated by the same reference numeral as that counterpart's, and description thereof will be omitted herein.

The delay circuit 6 is connected between a signal path that connects the second control unit 5A to the first gate of the first field effect transistor Q1 and the second gate of the second field effect transistor Q2. Thus, in this switch system 20B, the second gate of the second field effect transistor Q2 is connected to the second control unit 5A via the delay circuit 6.

In this switch system 20B, the first field effect transistor Q1 and the second field effect transistor Q2 turn on and off in response to the second control signal supplied from the second control unit 5A. The switching operation of the second field effect transistor Q2 trails by a predetermined period (i.e., the time delay introduced by the delay circuit 6) behind the switching operation of the first field effect transistor Q1. This causes the active clamping circuit 3A to turn off when the predetermined period has passed since the turn on of the first field effect transistor Q1 serving as the control switch 33.

In the switch system 20B, as well as in the switch system 20A, the breakdown voltage of the first diode 31 is smaller than the clamp voltage of the voltage clamping element 2. Thus, in the switch system 20B, when the control switch 33 (first field effect transistor Q1) is turned on to turn the semiconductor switch 1 off, the voltage between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. In the switch system 20B, when the control switch 33 of the active clamping circuit 3A turns from on to off, the voltage between the first main terminal 11 and second main terminal 12 of the semiconductor switch 1 is clamped by the voltage clamping element 2.

The switch system 20B according to the third embodiment, as well as the switch system 20A according to the second embodiment, may also reduce the surge voltage applied to the semiconductor switch 1 when the semiconductor switch 1 turns off.

Fourth Embodiment

Figure 5:
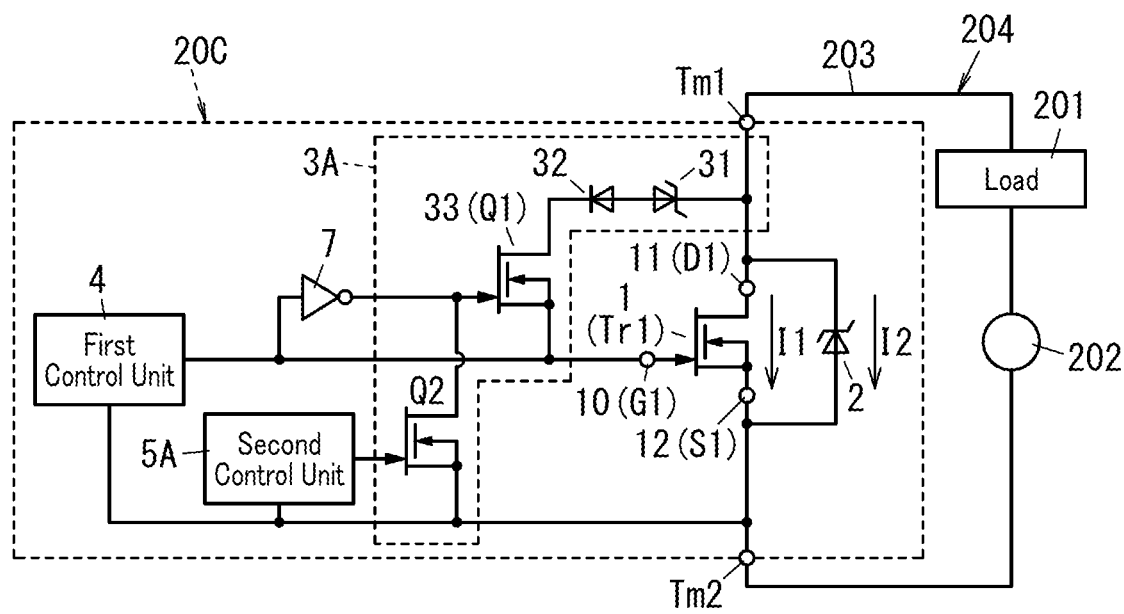
FIG. 5 is a circuit diagram of a switch system according to a fourth embodiment.

Next, a switch system 20C according to a fourth embodiment will be described with reference to FIG. 5.

The switch system 20C according to the fourth embodiment is substantially the same as the switch system 20A according to the second embodiment (refer to FIG. 3) but further includes a NOT circuit 7, which is a difference from the switch system 20A according to the second embodiment. In the following description, any constituent element of the switch system 20C according to this fourth embodiment, having the same function as a counterpart of the switch system 20A according to the second embodiment, will be designated by the same reference numeral as that counterpart's, and description thereof will be omitted herein.

The NOT circuit 7 is connected between a signal path that connects the first control unit 4 to the control terminal 10 of the semiconductor switch 1 and the first gate of the first field effect transistor Q1. The second control unit 5A is connected to the second gate of the second field effect transistor Q2.

When the first control signal output from the first control unit 4 to control the semiconductor switch 1 changes from an on signal into an off signal, the NOT circuit 7 outputs an on signal to the first field effect transistor Q1. Thus, in the switch system 20C, when the semiconductor switch 1 turns off, the voltage between the first main terminal 11 and second main terminal 12 of the semiconductor switch 1 increases to energize the active clamping circuit 3A. When a predetermined period has passed, the second control unit 5A will turn on the second field effect transistor Q2 in the off state. As a result, in the switch system 20C, the first field effect transistor Q1 turns off. Then, in the switch system 20C, the semiconductor switch 1 turns completely off. Consequently, the voltage between the first main terminal 11 and second main terminal 12 of the semiconductor switch 1 further increases, thus causing the voltage clamping element 2 to start performing the clamping operation.

In the switch system 20C, as well as in the switch system 20A, the breakdown voltage of the first diode 31 is smaller than the clamp voltage of the voltage clamping element 2. Thus, in the switch system 20C, when the control switch 33 (first field effect transistor Q1) is turned on to turn the semiconductor switch 1 off, the voltage between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. In the switch system 20C, when the control switch 33 of the active clamping circuit 3A turns from on to off, the voltage between the first main terminal 11 and second main terminal 12 of the semiconductor switch 1 is clamped by the voltage clamping element 2.

The switch system 20C according to the fourth embodiment, as well as the switch system 20A according to the second embodiment, may also reduce the surge voltage applied to the semiconductor switch 1 when the semiconductor switch 1 turns off.

Fifth Embodiment

Figure 6:
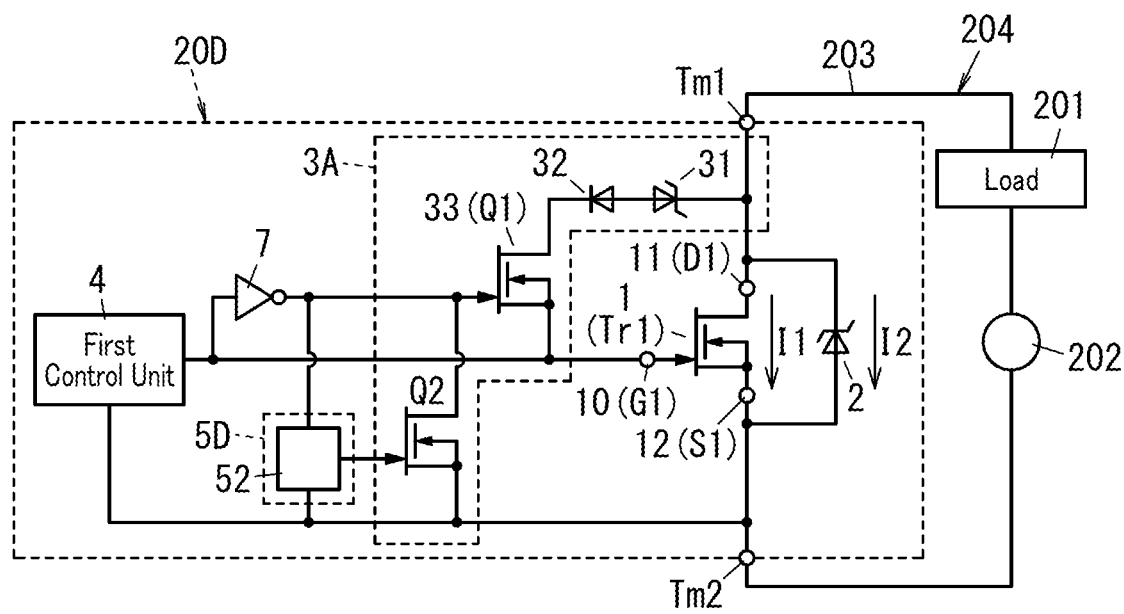
FIG. 6 is a circuit diagram of a switch system according to a fifth embodiment.

Next, a switch system 20D according to a fifth embodiment will be described with reference to FIG. 6.

The switch system 20D according to the fifth embodiment is substantially the same as the switch system 20C according to the fourth embodiment (refer to FIG. 5) but includes a second control unit 5D instead of the second control unit 5A, which is a difference from the switch system 20C according to the fourth embodiment. In the following description, any constituent element of the switch system 20D according to this fifth embodiment, having the same function as a counterpart of the switch system 20C according to the fourth embodiment, will be designated by the same reference numeral as that counterpart's, and description thereof will be omitted herein.

In the switch system 20D, the second control unit 5D includes a delay circuit 52. The delay circuit 52 is connected between a signal path that connects the output terminal of the NOT circuit 7 to the first field effect transistor Q1 and the second gate of the second field effect transistor Q2. The delay circuit 52 outputs a signal produced by delaying the input signal for the predetermined period. The delay circuit 52 may be, but does not have to be, an analog delay circuit, for example. Alternatively, the delay circuit 52 may also be timer IC or implemented as an integrated circuit (IC) including the first control unit 4.

The signal supplied to the delay circuit 52 of the second control unit 5D is produced by having the first control signal output from the first control unit 4 inverted by the NOT circuit 7. An output signal of the second control unit 5D is produced by having the signal supplied to the delay circuit 52 delayed for the predetermined period by the delay circuit 52. Thus, the timing when the second field effect transistor Q2 is switched is delayed by the predetermined period from the timing when the field effect transistor Q1 is switched.

In the switch system 20D, when the first control signal changes from a first on signal into a first off signal, the second control signal changes from a second off signal into a second on signal. As a result, while the semiconductor switch 1 turns off, the first field effect transistor Q1 turns from off to on. When the predetermined period has passed since the turn on of the first field effect transistor Q1, the second field effect transistor Q2 will turn from off to on. When the second field effect transistor Q2 turns on, the first field effect transistor Q1 turns from on to off.

In the switch system 20D, as well as in the switch system 20C, the breakdown voltage of the first diode 31 is smaller than the clamp voltage of the voltage clamping element 2. Thus, in the switch system 20D, when the control switch 33 (first field effect transistor Q1) is turned on to turn the semiconductor switch 1 off, the voltage between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. In the switch system 20D, when the control switch 33 of the active clamping circuit 3A turns from on to off, the voltage between the first main terminal 11 and second main terminal 12 of the semiconductor switch 1 is clamped by the voltage clamping element 2.

The switch system 20D according to the fifth embodiment, as well as the switch system 20C according to the fourth embodiment, may also reduce the surge voltage applied to the semiconductor switch 1 when the semiconductor switch 1 turns off.

Sixth Embodiment

Figure 7:
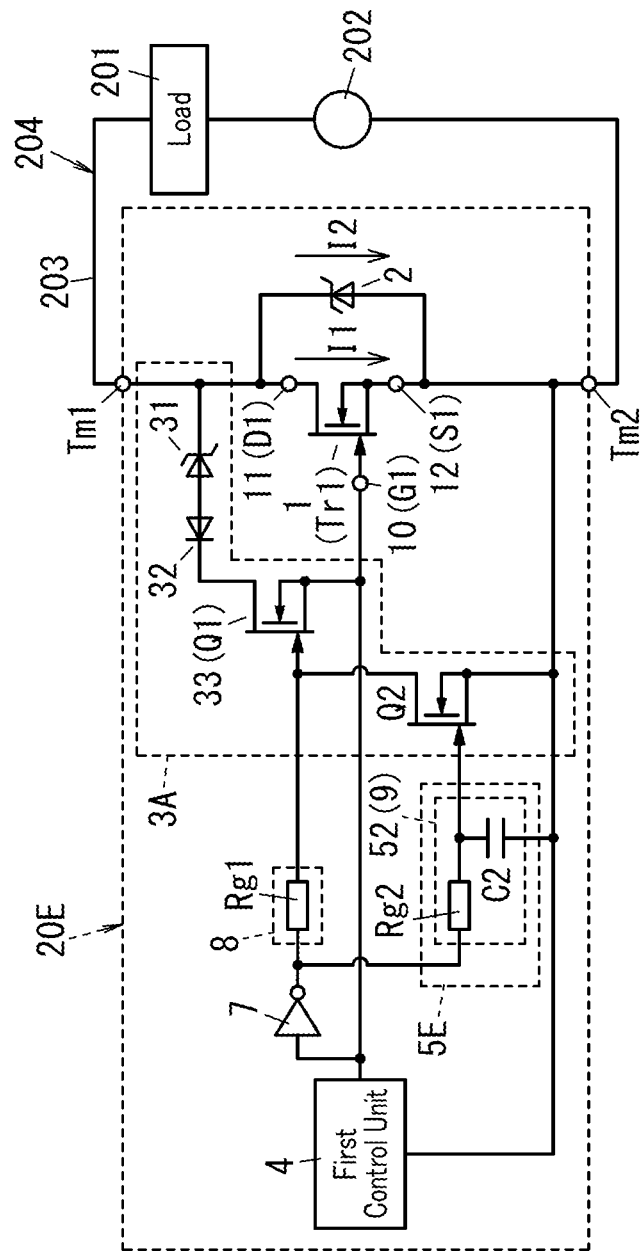
FIG. 7 is a circuit diagram of a switch system according to a sixth embodiment.

Next, a switch system 20E according to a sixth embodiment will be described with reference to FIG. 7.

The switch system 20E according to the sixth embodiment is substantially the same as the switch system 20D according to the fifth embodiment (refer to FIG. 6) but further includes a first drive circuit 8, which is a difference from the switch system 20D according to the fifth embodiment. In addition, the switch system 20E according to the sixth embodiment includes a second control unit 5E instead of the second control unit 5D of the switch system 20D according to the fifth embodiment, which is another difference from the switch system 20D according to the fifth embodiment. In the following description, any constituent element of the switch system 20E according to this sixth embodiment, having the same function as a counterpart of the switch system 20D according to the fifth embodiment, will be designated by the same reference numeral as that counterpart's, and description thereof will be omitted herein.

The first drive circuit 8 includes a first gate resistor Rg1. The first gate resistor Rg1 is connected between the output terminal of the NOT circuit 7 and the first gate of the first field effect transistor Q1. In the second control unit 5E, the delay circuit 52 is implemented as a second drive circuit 9 including a second gate resistor Rg2 and a capacitor C2. The second gate resistor Rg2 is connected between the output terminal of the NOT circuit 7 and the second gate of the second field effect transistor Q2. The capacitor C2 is connected between the second gate and second source of the second field effect transistor Q2.

In this switch system 20E, when the control signal supplied from the first control unit 4 changes from a first on signal into a first off signal while the semiconductor switch 1 is being turned off, the first field effect transistor Q1 turns on. In the predetermined period, the second field effect transistor Q2 will turn on as well. In the active clamping circuit 3A, when the second field effect transistor Q2 turns on, the first field effect transistor Q1 turns off.

In the switch system 20E, as well as in the switch system 20D, the breakdown voltage of the first diode 31 is smaller than the clamp voltage of the voltage clamping element 2. Thus, in the switch system 20E, when the control switch 33 (first field effect transistor Q1) is turned on to turn the semiconductor switch 1 off, the voltage between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. In the switch system 20E, when the control switch 33 of the active clamping circuit 3A turns from on to off, the voltage between the first main terminal 11 and second main terminal 12 of the semiconductor switch 1 is clamped by the voltage clamping element 2.

The switch system 20E according to the sixth embodiment, as well as the switch system 20D according to the fifth embodiment, may also reduce the surge voltage applied to the semiconductor switch 1 when the semiconductor switch 1 turns off.

In addition, in the switch system 20E according to the sixth embodiment, the delay circuit 52 may be implemented as a combination of the second gate resistor Rg2 and the capacitor C2, thus contributing to cutting down the cost.

Seventh Embodiment

Figure 8:
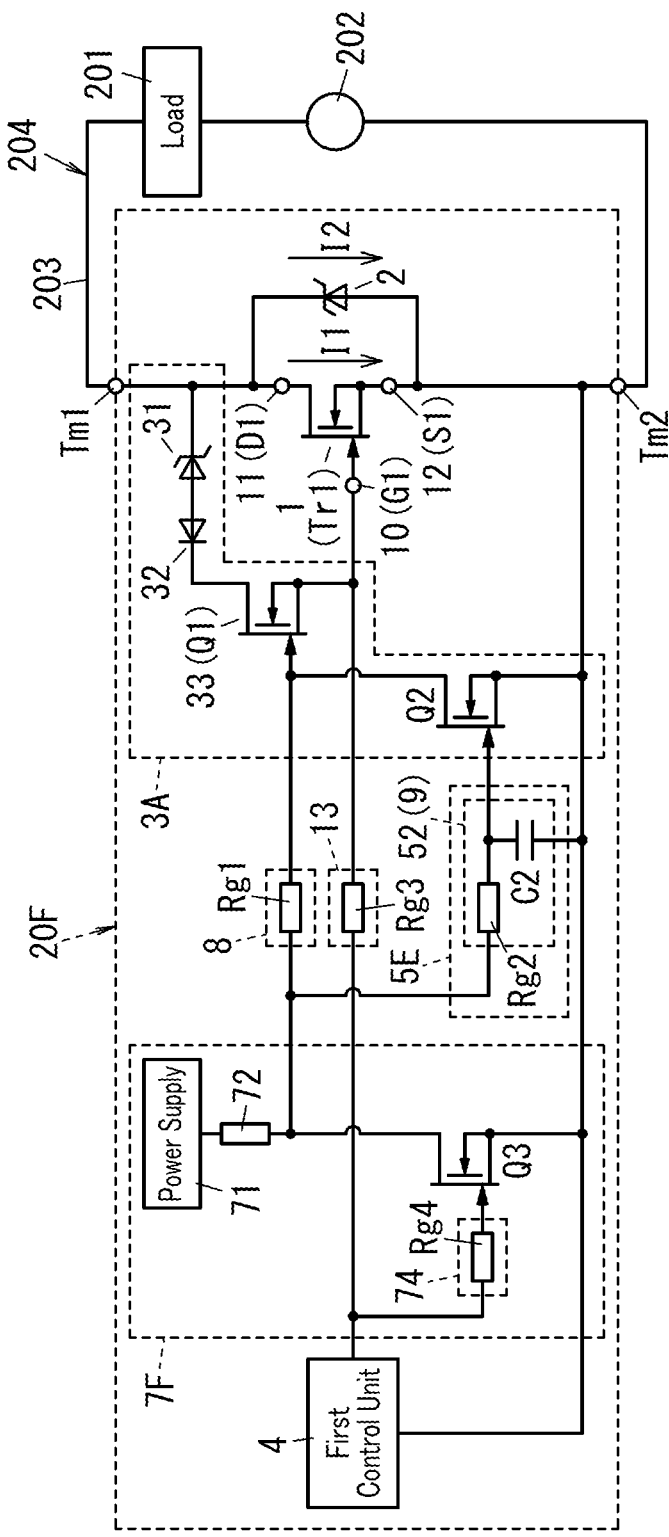
FIG. 8 is a circuit diagram of a switch system according to a seventh embodiment.

Next, a switch system 20F according to a seventh embodiment will be described with reference to FIGS. 8 and 9.

The switch system 20F according to the seventh embodiment is substantially the same as the switch system 20E according to the sixth embodiment (refer to FIG. 7) but further includes a third drive circuit 13, which is a difference from the switch system 20E according to the sixth embodiment. In addition, the switch system 20F according to the seventh embodiment includes a NOT circuit 7F instead of the NOT circuit 7 of the switch system 20E according to the sixth embodiment, which is another difference from the switch system 20E according to the sixth embodiment. In the following description, any constituent element of the switch system 20F according to this seventh embodiment, having the same function as a counterpart of the switch system 20E according to the sixth embodiment, will be designated by the same reference numeral as that counterpart's, and description thereof will be omitted herein.

The third drive circuit 13 is connected between the first control unit 4 and the control terminal 10 of the semiconductor switch 1. The third drive circuit 13 includes a third gate resistor Rg3 connected between the first control unit 4 and the control terminal 10 of the semiconductor switch 1.

The NOT circuit 7F includes a power supply 71, a resistor 72, a third field effect transistor Q3, and a fourth drive circuit 74. The power supply 71 is a DC power supply. The resistor 72 is connected to the power supply 71 in series. The third field effect transistor Q3 has a third gate, a third drain, and a third source. The third field effect transistor Q3 is connected to the resistor 72 in series. In the third field effect transistor Q3, the third drain thereof is connected to the resistor 72 and the third source thereof is connected to the second source of the second field effect transistor Q2 and the second main terminal 12 of the semiconductor switch 1. In this embodiment, the third field effect transistor Q3 is a junction field effect transistor. However, this is only an example and should not be construed as limiting. Alternatively, the third field effect transistor Q3 may also be a MOSFET, for example. The fourth drive circuit 74 is connected between the first control unit 4 and the third gate of the third field effect transistor Q3. The fourth drive circuit 74 includes a gate resistor Rg4 (fourth gate resistor Rg4) connected between the first control unit 4 and the third gate of the third field effect transistor Q3.

In the switch system 20F according to the seventh embodiment, when the control signal output from the first control unit 4 changes from a first on signal into a first off signal to turn the semiconductor switch 1 off, the time it takes to turn the first field effect transistor Q1 on is shorter than the time it takes for the semiconductor switch 1 to start turning off. In addition, in the switch system 20F, when a predetermined period has passed since the turn on of the first field effect transistor Q1, the second field effect transistor Q2 turns on. In the switch system 20F, when the second field effect transistor Q2 turns on, the first field effect transistor Q1 turns off.

Next, an exemplary operation of the switch system 20F will be described with reference to FIG. 9. In FIG. 9, the waveform labeled as "semiconductor switch (Tr1)" indicates how the first control signal supplied to the control terminal 10 of the semiconductor switch 1 (junction field effect transistor Tr1) changes with time. Also, in FIG. 9, the waveform labeled as "control switch (Q1)" indicates how the second control signal supplied to the control switch 33 (first field effect transistor Q1) changes with time. In FIG. 9, the waveform labeled as "second FET (Q2)" indicates how a third control signal supplied to the second gate of the second field effect transistor Q2 changes with time. In FIG. 9, the waveform labeled as "third FET (Q3)" indicates how a control signal supplied to the third gate of the third field effect transistor Q3 changes with time. Furthermore, in FIG. 9, "Vgs" denotes a voltage between the gate terminal G1 and the source terminal S1 with respect to the source terminal S1 of the junction field effect transistor Tr1. Thus, "Vgs" denotes the voltage between the control terminal 10 and second main terminal 12 of the semiconductor switch 1. Furthermore, in FIG. 9, "Vds" denotes a voltage between the drain terminal D1 and the source terminal S1 with respect to the source terminal S1 of the junction field effect transistor Tr1. Thus, "Vds" denotes the voltage between the first main terminal 11 and second main terminal 12 of the semiconductor switch 1. The voltage clamping element 2 is connected to the semiconductor switch 1 in parallel. Therefore, the voltage across the voltage clamping element 2 is the same as the voltage Vds between the first main terminal 11 and second main terminal 12 of the semiconductor switch 1.

Figure 9:
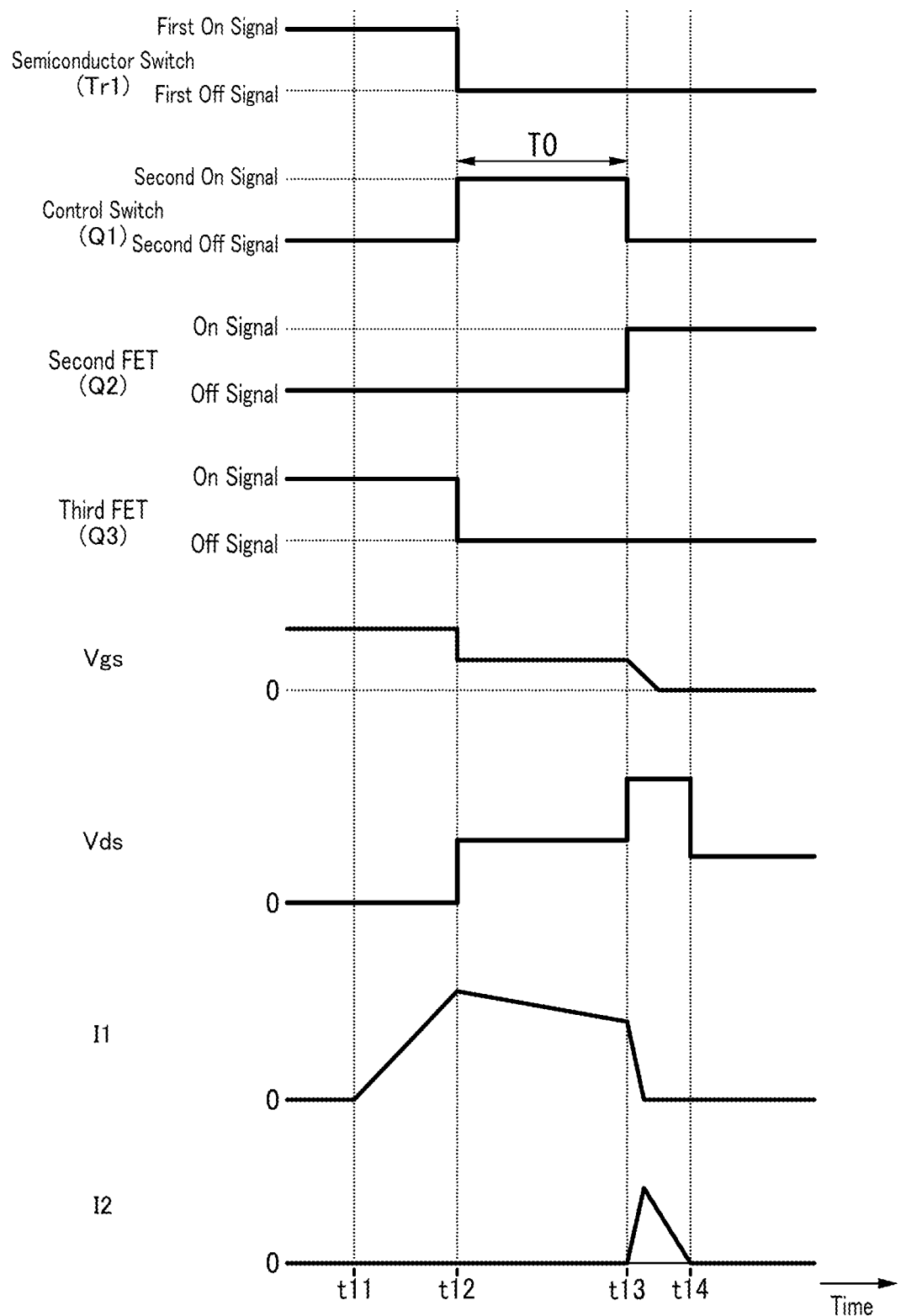
FIG. 9 illustrates how the switch system operates.

FIG. 9 illustrates how the switch system 20F operates, for example, in a situation where a short-circuit failure occurs to the load circuit 204 at a time t1 to cause the main current I1 of the semiconductor switch 1 to start to increase.

At a time t12, the first control signal changes from a first on signal into a first off signal, the second control signal changes from a second off signal into a second on signal, and the control signal for the third field effect transistor Q3 changes from an on signal into an off signal. This causes not only the semiconductor switch 1 to start turning off but also the control switch 33 (first field effect transistor Q1) of the active clamping circuit 3 to turn on. When the control switch 33 of the active clamping circuit 3 turns on, the voltage Vds between the first main terminal 11 and second main terminal 12 of the semiconductor switch 1 is clamped by the active clamping circuit 3. As a result, part of the energy stored in the inductance component of the line 203 of the load circuit 204 is consumed by the semiconductor switch 1. The main current I1 flowing through the semiconductor switch 1 starts to decrease at the time t12.

At a time t13, when the predetermined period T0 passes since the time t12, the third control signal for the second field effect transistor Q2 changes from an off signal into an on signal and the second control signal for the control switch 33 changes from the on signal (second on signal) into the off signal (second off signal). In response, a current I2 starts to flow through the voltage clamping element 2, the voltage Vds between the first main terminal 11 and second main terminal 12 of the semiconductor switch 1 is clamped at the clamp voltage of the voltage clamping element 2, and the absolute value of a current variation ratio (−dI1/dt) of the main current I1 of the semiconductor switch 1 increases to cause the main current I1 to decrease steeply to zero. Then, the current I2 of the voltage clamping element 2 starts to decrease.

When the current I2 of the voltage clamping element 2 goes zero at a time t14, the voltage Vds between the first main terminal 11 and second main terminal 12 of the semiconductor switch 1 becomes a constant voltage lower than the clamp voltage.

The switch system 20F may make the current value of the main current I1 flowing through the semiconductor switch 1 at the time t13 smaller than the current value of the main current I1 flowing through the semiconductor switch 1 at the time t12. This allows the switch system 20F to reduce the clamp voltage of the voltage clamping element 2.

In the switch system 20F, as well as in the switch system 20E, the breakdown voltage of the first diode 31 is smaller than the clamp voltage of the voltage clamping element 2. Thus, in the switch system 20F, when the control switch 33 (first field effect transistor Q1) is turned on to turn the semiconductor switch 1 off, the voltage between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. In the switch system 20F, when the control switch 33 of the active clamping circuit 3A turns from on to off, the voltage between the first main terminal 11 and second main terminal 12 of the semiconductor switch 1 is clamped by the voltage clamping element 2.

The switch system 20F according to the seventh embodiment, as well as the switch system 20E according to the sixth embodiment, may also reduce the surge voltage applied to the semiconductor switch 1 when the semiconductor switch 1 turns off.

Eighth Embodiment

Figure 10:
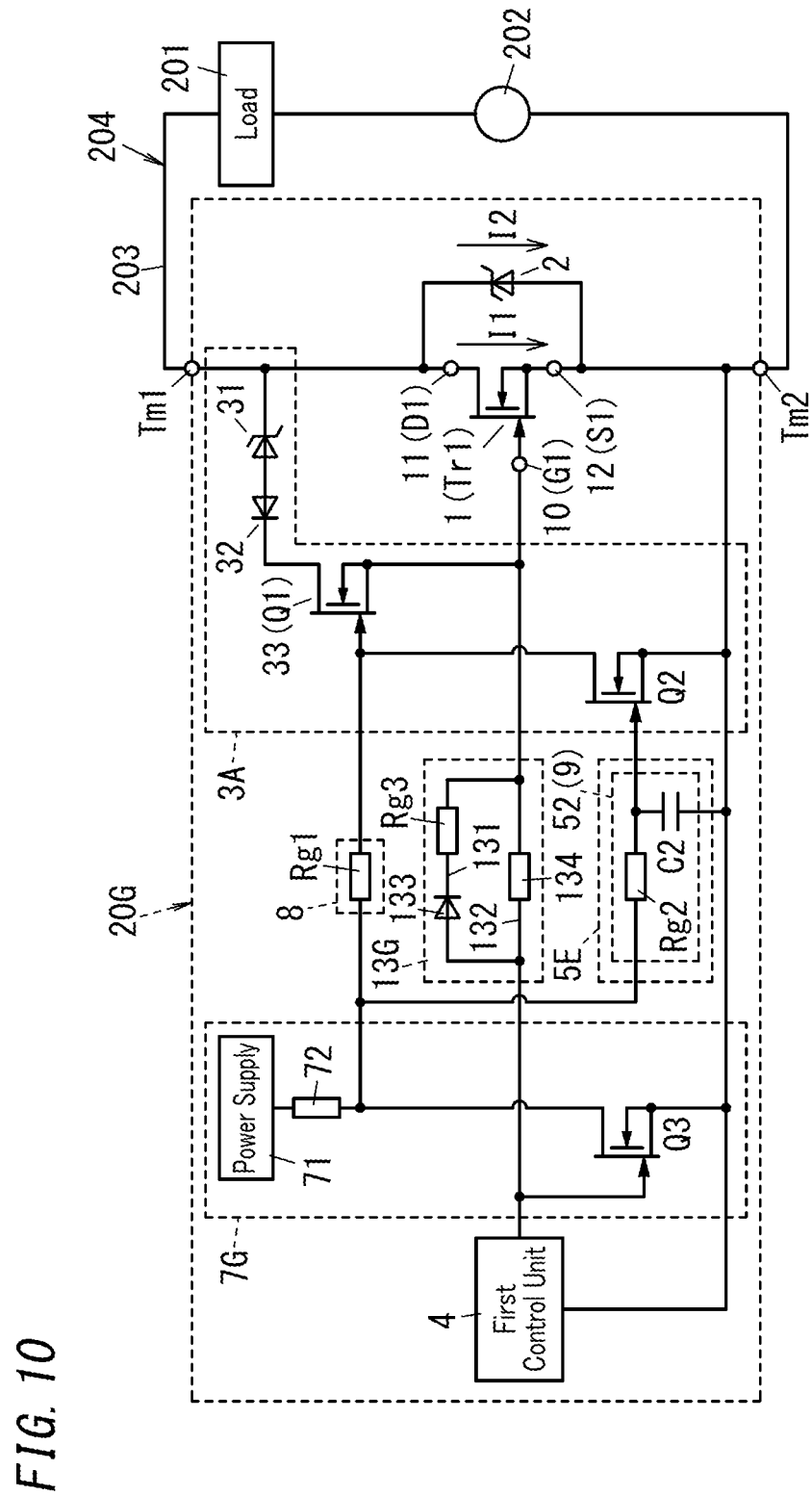
FIG. 10 is a circuit diagram of a switch system according to an eighth embodiment.

Next, a switch system 20G according to an eighth embodiment will be described with reference to FIG. 10.

The switch system 20G according to the eighth embodiment is substantially the same as the switch system 20F according to the seventh embodiment (refer to FIG. 8) but includes a third drive circuit 13G instead of the third drive circuit 13 of the switch system 20F according to the seventh embodiment, which is a difference from the switch system 20F according to the seventh embodiment. In addition, the switch system 20G according to the eighth embodiment includes a NOT circuit 7G instead of the NOT circuit 7F of the switch system 20F according to the seventh embodiment, which is another difference from the switch system 20F according to the seventh embodiment. The NOT circuit 7G does not include the fourth drive circuit 74 of the NOT circuit 7F. Thus, the third gate of the third field effect transistor Q3 is directly connected to the first control unit 4. In the following description, any constituent element of the switch system 20G according to this eighth embodiment, having the same function as a counterpart of the switch system 20F according to the seventh embodiment, will be designated by the same reference numeral as that counterpart's, and description thereof will be omitted herein.

The third drive circuit 13G has a first path 131 to turn the semiconductor switch 1 on and a second path 132 to turn the semiconductor switch 1 off. As used herein, the first path 131 to turn the semiconductor switch 1 on refers to a charging path for charging the control terminal 10 of the semiconductor switch 1 with electric charges. The second path 132 to turn the semiconductor switch 1 off refers to a discharging path for discharging electric charges from the control terminal 10 of the semiconductor switch 1.

The first path 131 includes a third diode 133 and a third gate resistor Rg3. The third diode 133 has a third anode and a third cathode. The third cathode of the third diode 133 is connected to the control terminal 10 of the semiconductor switch 1. The third anode of the third diode 133 is connected to the first control unit 4. The third gate resistor Rg3 is connected to the third diode 133 in series. In the first path 131, the third cathode of the third diode 133 is control terminal 10 of the semiconductor switch 1 via the third gate resistor Rg3. However, this is only an example and should not be construed as limiting. Alternatively, the third cathode of the third diode 133 may be directly connected to the control terminal 10 of the semiconductor switch 1 and the third anode of the third diode 133 may be connected to the first control unit 4 via the third gate resistor Rg3. As used herein, the expression "the third cathode of the third diode 133 is directly connected to the control terminal 10 of the semiconductor switch 1" means that the third cathode of the third diode 133 is connected to the control terminal 10 of the semiconductor switch 1 not via any other circuit component (such as the third gate resistor Rg3).

The second path 132 includes a resistor 134. The resistor 134 is connected between the first control unit 4 and the control terminal 10 of the semiconductor switch 1. More specifically, in the second path 132, one end of the resistor 134 is connected to the first control unit 4 and the other end of the resistor 134 is connected to the control terminal 10 of the semiconductor switch 1. In the switch system 20G, the first field effect transistor Q1 of the active clamping circuit 3A turns on before the semiconductor switch 1 turns off. The resistance value of the resistor 134 on the second path 132 is smaller than the resistance value of the third gate resistor Rg3 on the first path 131. This allows the switch system 20G to reduce, when the junction field effect transistor Tr serving as the semiconductor switch 1 is a GaN-based GIT, for example, the effect of the resistor 134 on the turn-on characteristic when the semiconductor switch 1 is turned on. In addition, in the switch system 20G, when the semiconductor switch 1 is turned off, not the first path 131 but the second path 132 is used, thus preventing the semiconductor switch 1 from turning off before the control switch 33 of the active clamping circuit 3A turns on.

In the switch system 20G, as well as in the switch system 20F, the breakdown voltage of the first diode 31 is smaller than the clamp voltage of the voltage clamping element 2. Thus, in the switch system 20G, when the control switch 33 (first field effect transistor Q1) is turned on to turn the semiconductor switch 1 off, the voltage between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. In the switch system 20G, when the control switch 33 of the active clamping circuit 3A turns from on to off, the voltage between the first main terminal 11 and second main terminal 12 of the semiconductor switch 1 is clamped by the voltage clamping element 2.

The switch system 20G according to the eighth embodiment, as well as the switch system 20F according to the seventh embodiment, may also reduce the surge voltage applied to the semiconductor switch 1 when the semiconductor switch 1 turns off.

Ninth Embodiment

Figure 11:
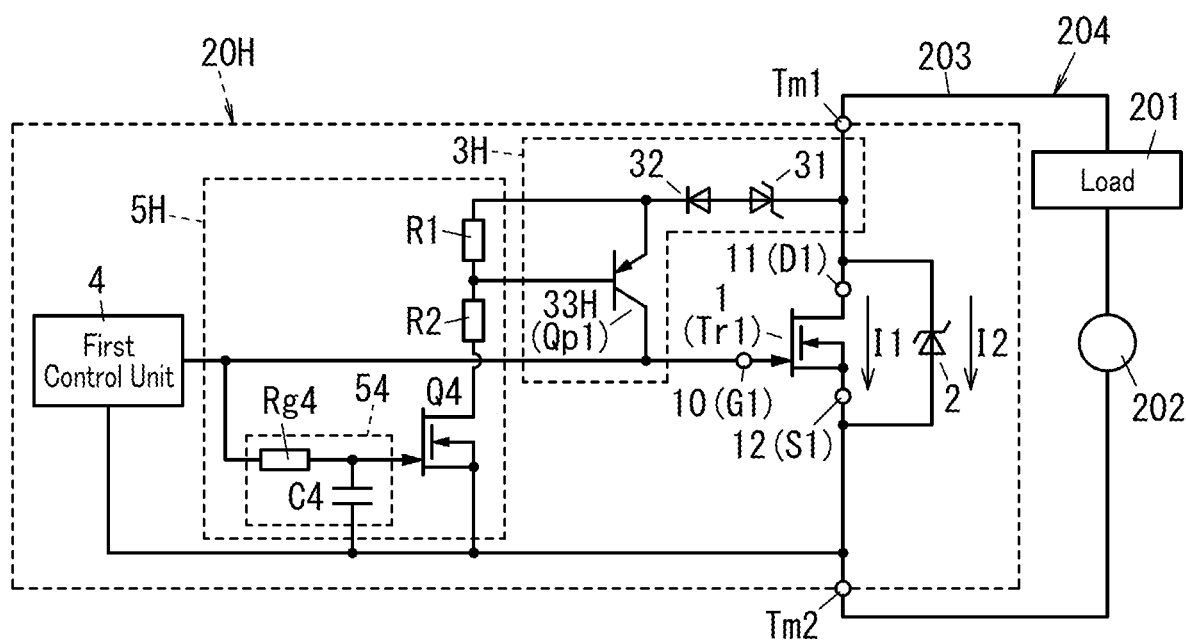
FIG. 11 is a circuit diagram of a switch system according to a ninth embodiment.

Next, a switch system 20H according to a ninth embodiment will be described with reference to FIGS. 11 and 12.

The switch system 20H according to the ninth embodiment is substantially the same as the switch system 20 according to the first embodiment (refer to FIG. 1) but includes an active clamping circuit 3H and a second control unit 5H instead of the active clamping circuit 3 and the second control unit 5 of the switch system 20 according to the first embodiment, which is a difference from the switch system 20 according to the first embodiment. In the following description, any constituent element of the switch system 20H according to this ninth embodiment, having the same function as a counterpart of the switch system 20 according to the first embodiment, will be designated by the same reference numeral as that counterpart's, and description thereof will be omitted herein.

The active clamping circuit 3H is connected between the control terminal 10 and first main terminal 11 of the semiconductor switch 1. The active clamping circuit 3H includes a control switch 33H instead of the control switch 33 of the active clamping circuit 3 of the switch system 20 according to the first embodiment. The control switch 33H is connected between the first anode of the first diode 31 and the control terminal 10 of the semiconductor switch 1. The control switch 33H is a pnp transistor Qp1 having a base, a collector, and an emitter. The emitter of the pnp transistor Qp1 is connected to the second cathode of the second diode 32. The collector of the pnp transistor Qp1 is connected to the control terminal 10 of the semiconductor switch 1. Thus, the collector of the pnp transistor Qp1 is connected to the signal path between the first control unit 4 and the control terminal 10 of the semiconductor switch 1.

The second control unit 5H controls the active clamping circuit 3H. The second control unit 5H includes a first resistor R1, a second resistor R2, a field effect transistor Q4, and a delay circuit 54.

The first resistor R1 is connected between the base and the emitter of the pnp transistor Qp1. Thus, the first resistor R1 is connected to the second cathode of the second diode 32. The second resistor R2 is connected to the base of the pnp transistor Qp1 and connected to the first resistor R1 in series.

The field effect transistor Q4 has a gate, a drain, and a source. The field effect transistor Q4 is connected between the second resistor R2 and the second main terminal 12 of the semiconductor switch 1. In this embodiment, the field effect transistor Q4 is implemented as a junction field effect transistor. However, this is only an example and should not be construed as limiting. Alternatively, the field effect transistor Q4 may also be a MOSFET.

The delay circuit 54 is connected between the first control unit 4 and the gate of the field effect transistor Q4. The delay circuit 54 includes a gate resistor Rg4 and a capacitor C4. The gate resistor Rg4 is connected between the first control unit 4 and the gate of the field effect transistor Q4. The capacitor C4 is connected between the gate and the source of the field effect transistor Q4. The delay circuit 54 delays the first control signal, supplied from the first control unit 4 to the semiconductor switch 1, for a predetermined period and provides the first control signal thus delayed to the gate of the field effect transistor Q4 of the active clamping circuit 3H.

In the switch system 20H, as well as in the switch system 20, the breakdown voltage of the first diode 31 is also smaller than the clamp voltage of the voltage clamping element 2.

Next, an exemplary operation of the switch system 20H will be described with reference to FIG. 12. In FIG. 12, the waveform labeled as "semiconductor switch (Tr1)" indicates how the first control signal supplied to the control terminal 10 of the semiconductor switch 1 (junction field effect transistor Tr1) changes with time. Also, in FIG. 12, the waveform labeled as "control switch (Qp1)" indicates how the state of the control switch 33H (pnp transistor Qp1)

changes with time. In FIG. 12, the waveform labeled as "Q4" indicates how the control signal supplied to the gate of the field effect transistor Q4 changes with time. Furthermore, in FIG. 12, "Vgs" denotes a voltage between the gate terminal G1 and the source terminal S1 with respect to the source terminal S1 of the junction field effect transistor Tr1. Thus, "Vgs" denotes the voltage between the control terminal 10 and second main terminal 12 of the semiconductor switch 1. Furthermore, in FIG. 12, "Vds" denotes a voltage between the drain terminal D1 and the source terminal S1 with respect to the source terminal S1 of the junction field effect transistor Tr1. Thus, "Vds" denotes the voltage between the first main terminal 11 and second main terminal 12 of the semiconductor switch 1. The voltage clamping element 2 is connected to the semiconductor switch 1 in parallel. Thus, the voltage across the voltage clamping element 2 is the same as the voltage Vds between the first main terminal 11 and second main terminal 12 of the semiconductor switch 1.

Figure 12:
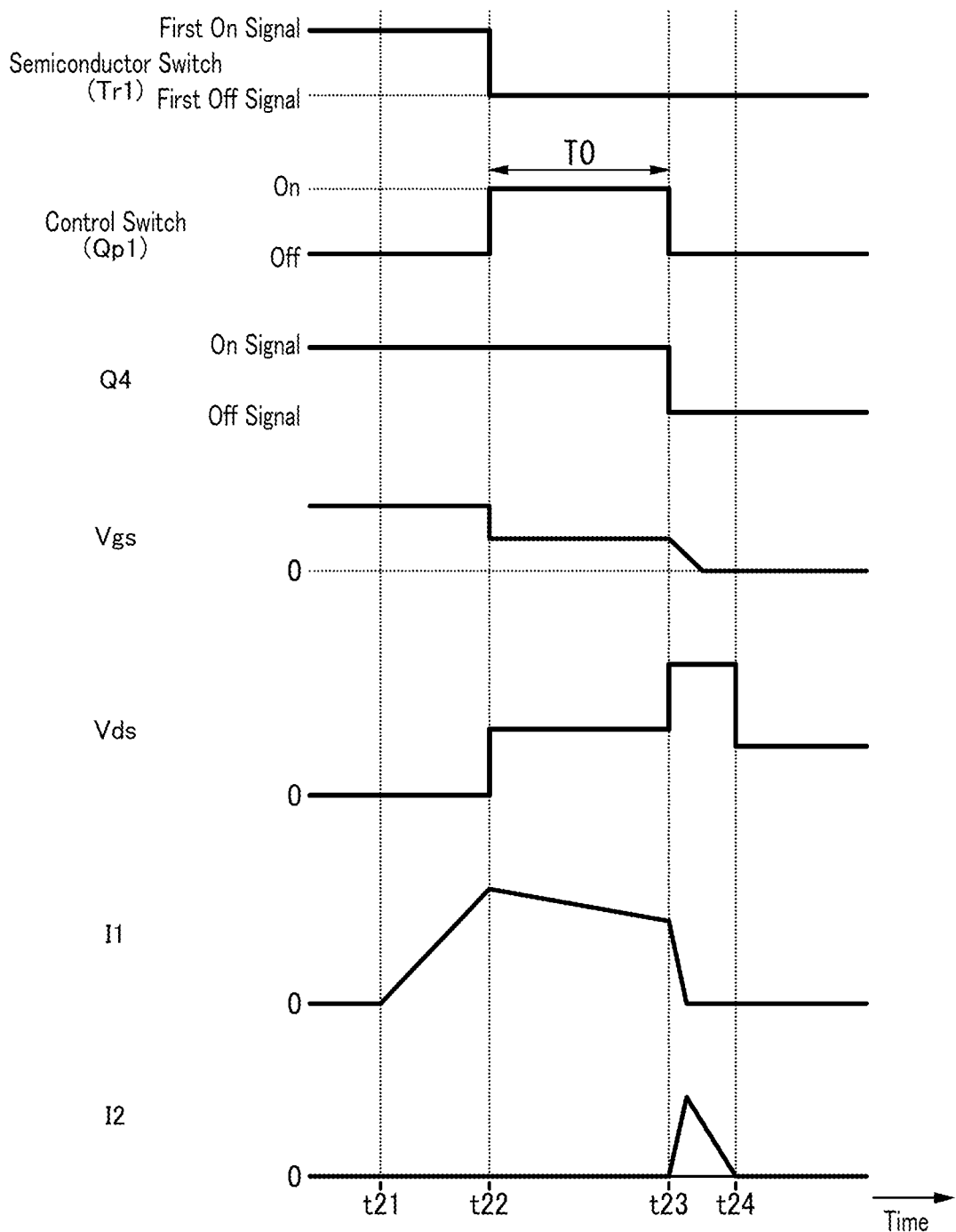
FIG. 12 illustrates how the switch system operates.

FIG. 12 illustrates how the switch system 20H operates, for example, in a situation where a short-circuit failure occurs to the load circuit 204 at a time t21 to cause the main current I1 of the semiconductor switch 1 to start to increase.

At a time t22, the first control signal changes from a first on signal into a first off signal. This causes the semiconductor switch 1 to start turning off. The field effect transistor Q4 is caused by the delay circuit 54 to start turning off later than the semiconductor switch 1. Thus, at the time t22, the field effect transistor Q4 is still in on state. As the voltage Vds between the first main terminal 11 and second main terminal 12 of the semiconductor switch 1 increases at the time t22, the first diode 31 causes breakdown to allow a current to flow through the first resistor R1, the second resistor R2, and the field effect transistor Q4. As a result, the pnp transistor Qp1 turns on. When the control switch 33 of the active clamping circuit 3H turns on, the voltage Vds between the first main terminal 11 and second main terminal 12 of the semiconductor switch 1 is clamped by the active clamping circuit 3H. As a result, part of the energy stored in the inductance component of the line 203 of the load circuit 204 is consumed by the semiconductor switch 1. The main current I1 flowing through the semiconductor switch 1 starts to decrease at the time t22.

At a time t23, when the predetermined period T0 passes since the time t22, the control signal for the field effect transistor Q4 changes from an on signal into an off signal to cause the control switch 33H to turn off. In response, in the switch system 20H, a current I2 starts to flow through the voltage clamping element 2, the voltage Vds between the first main terminal 11 and second main terminal 12 of the semiconductor switch 1 is clamped at the clamp voltage of the voltage clamping element 2, and the absolute value of a current variation ratio (−dI1/dt) of the main current I1 of the semiconductor switch 1 increases to cause the main current I1 to decrease steeply to zero. Then, the current I2 of the voltage clamping element 2 starts to decrease.

When the current I2 of the voltage clamping element 2 goes zero at a time t24, the voltage Vds between the first main terminal 11 and second main terminal 12 of the semiconductor switch 1 becomes a constant voltage lower than the clamp voltage.

The switch system 20F may make the current value of the main current I1 flowing through the semiconductor switch 1 at the time t23 smaller than the current value of the main current I1 flowing through the semiconductor switch 1 at the time t22. This allows the switch system 20H to reduce the clamp voltage of the voltage clamping element 2.

A switch system 20H according to the ninth embodiment described above includes a semiconductor switch 1, a voltage clamping element 2, an active clamping circuit 3H, a first control unit 4, and a second control unit 5H. The semiconductor switch 1 has a control terminal 10, a first main terminal 11, and a second main terminal 12. The voltage clamping element 2 is connected to the semiconductor switch 1 in parallel. The active clamping circuit 3H is connected between the control terminal 10 and the first main terminal 11 of the semiconductor switch 1. The first control unit 4 controls the semiconductor switch 1. The second control unit 5H controls the active clamping circuit 3H. The active clamping circuit 3H includes a first diode 31, a second diode 32, and a control switch 33H. The first diode 31 has a first anode and a first cathode. The first diode 31 causes breakdown upon application of voltage between the first main terminal 11 and the second main terminal 12 of the semiconductor switch 1. The second diode 32 has a second anode and a second cathode. The second anode of the second diode 32 is connected to the first anode of the first diode 31. The control switch 33H is connected between the first anode of the first diode 31 and the control terminal 10 of the semiconductor switch 1. The control switch 33H is a pnp transistor Qp1 having a base, a collector, and an emitter. The emitter of the pnp transistor Qp1 is connected to the second cathode of the second diode 32. The collector of the pnp transistor Qp1 is connected to the control terminal 10 of the semiconductor switch 1. The second control unit 5H includes a first resistor R1, a second resistor R2, a field effect transistor Q4, and a delay circuit 54. The first resistor R1 is connected between the base and the emitter of the pnp transistor Qp1. The second resistor R2 is connected to the base of the pnp transistor Qp1 and connected to the first resistor R1 in series. The field effect transistor Q4 has a gate, a drain, and a source. The field effect transistor Q4 is connected between the second resistor R2 and the second main terminal 12 of the semiconductor switch 1. The delay circuit 54 is connected between the first control unit 4 and the gate of the field effect transistor Q4. The delay circuit 54 includes a gate resistor Rg4 and a capacitor C4. The gate resistor Rg4 is connected between the first control unit 4 and the gate of the field effect transistor Q4. The capacitor C4 is connected between the gate and the source of the field effect transistor Q4. A breakdown voltage of the first diode 31 is smaller than a clamp voltage of the voltage clamping element 2.

The switch system 20H according to the ninth embodiment may reduce the surge voltage applied to the semiconductor switch 1 when the semiconductor switch 1 turns off. More specifically, the switch system 20H according to the ninth embodiment may reduce the current value of the main current I1 flowing through the semiconductor switch 1 when the voltage clamping element 2 clamps the voltage Vds between the first main terminal 11 and second main terminal 12 of the semiconductor switch 1 (i.e., may reduce the clamp voltage). Consequently, the switch system 20H may reduce deterioration in the characteristics of the semiconductor switch 1 (e.g., may reduce the chances of the semiconductor switch 1 coming to have a shorter life).

Tenth Embodiment

Figure 13:
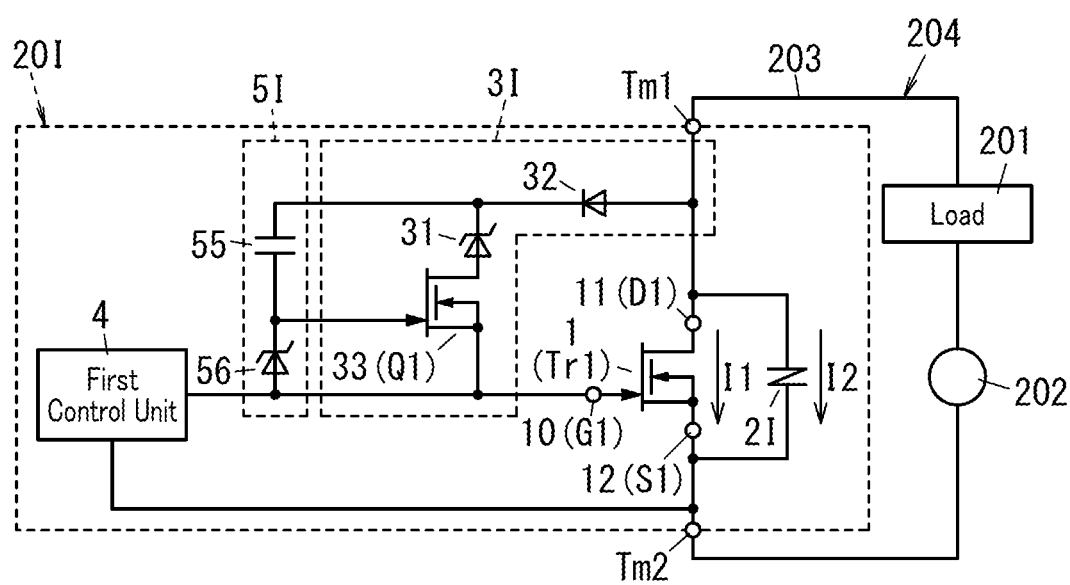
FIG. 13 is a circuit diagram of a switch system according to a tenth embodiment.

Next, a switch system 20I according to a tenth embodiment will be described with reference to FIGS. 13 and 14.

The switch system 20I according to the tenth embodiment is substantially the same as the switch system 20 according to the first embodiment (refer to FIG. 1) but includes an active clamping circuit 3I and a second control unit 5I instead of the active clamping circuit 3 and the second control unit 5 of the switch system 20 according to the first embodiment, which is a difference from the switch system 20 according to the first embodiment. In addition, the switch system 20I according to the tenth embodiment includes a voltage clamping element 2I instead of the voltage clamping element 2 of the switch system 20 according to the first embodiment, which is another difference from the switch system 20 according to the first embodiment. In the following description, any constituent element of the switch system 20I according to this tenth embodiment, having the same function as a counterpart of the switch system 20 according to the first embodiment, will be designated by the same reference numeral as that counterpart's, and description thereof will be omitted herein.

The active clamping circuit 3I is connected between the control terminal 10 and first main terminal 11 of the semiconductor switch 1. The active clamping circuit 3I includes a first diode 31, a second diode 32, and a control switch 33. In the active clamping circuit 3I, the second anode of the second diode 32 is connected to the first main terminal 11 of the semiconductor switch 1, and the second cathode of the second diode 32 is connected to the control switch 33 via the first diode 31. The second cathode of the second diode 32 is connected to the first cathode of the first diode 31. The control switch 33 is connected between the first anode of the first diode 31 and the control terminal 10 of the semiconductor switch 1. The first diode 31 causes breakdown upon application of voltage between the first main terminal 11 and the second main terminal 12 of the semiconductor switch 1. The control switch 33 is a field effect transistor Q1. The drain of the field effect transistor Q1 is connected to the first anode of the first diode 31. The source of the field effect transistor Q1 is connected to the control terminal 10 of the semiconductor switch 1.

The second control unit 5I controls the active clamping circuit 3I. The second control unit 5I includes a capacitor 55 and a Zener diode 56. The capacitor 55 has a first terminal and a second terminal. In the capacitor 55, the first terminal thereof is connected to the gate of the field effect transistor Q1, and the second terminal thereof is connected to the first cathode of the first diode 31 and the second cathode of the second diode 32. The Zener diode 56 has a third anode and a third cathode. In the Zener diode 56, the third cathode thereof is connected to the first terminal of the capacitor 55 and the gate of the field effect transistor Q1 and the third anode thereof is connected to the source of the field effect transistor Q1. Thus, the third anode of the Zener diode 56 is connected to the signal path between the first control unit 4 and the control terminal 10 of the semiconductor switch 1.

The voltage clamping element 2I is connected to the semiconductor switch 1 in parallel. More specifically, the voltage clamping element 2I is connected between the first main terminal 11 and the second main terminal 12 of the semiconductor switch 1. The voltage clamping element 2I may be a varistor, for example. However, the voltage clamping element 2I does not have to be a varistor but may also be a Zener diode (such as a TVS diode).

Next, an exemplary operation of the switch system 20I will be described with reference to FIG. 14. In FIG. 14, the waveform labeled as "semiconductor switch (Tr1)" indicates how the first control signal supplied to the control terminal 10 of the semiconductor switch 1 (junction field effect transistor Tr1) changes with time. Also, in FIG. 14, the waveform labeled as "control switch (Q1)" indicates how the state of the control switch 33 (field effect transistor Q1) changes with time. Furthermore, in FIG. 14, "Vgs" denotes a voltage between the gate terminal G1 and the source terminal S1 with respect to the source terminal S1 of the junction field effect transistor Tr1. Thus, "Vgs" denotes the voltage between the control terminal 10 and second main terminal 12 of the semiconductor switch 1. Furthermore, in FIG. 14, "Vds" denotes a voltage between the drain terminal D1 and the source terminal S1 with respect to the source terminal S1 of the junction field effect transistor Tr. Thus, "Vds" denotes the voltage between the first main terminal 11 and second main terminal 12 of the semiconductor switch 1. The voltage clamping element 2 is connected to the semiconductor switch 1 in parallel. Thus, the voltage across the voltage clamping element 2 is the same as the voltage Vds between the first main terminal 11 and second main terminal 12 of the semiconductor switch 1.

Figure 14:
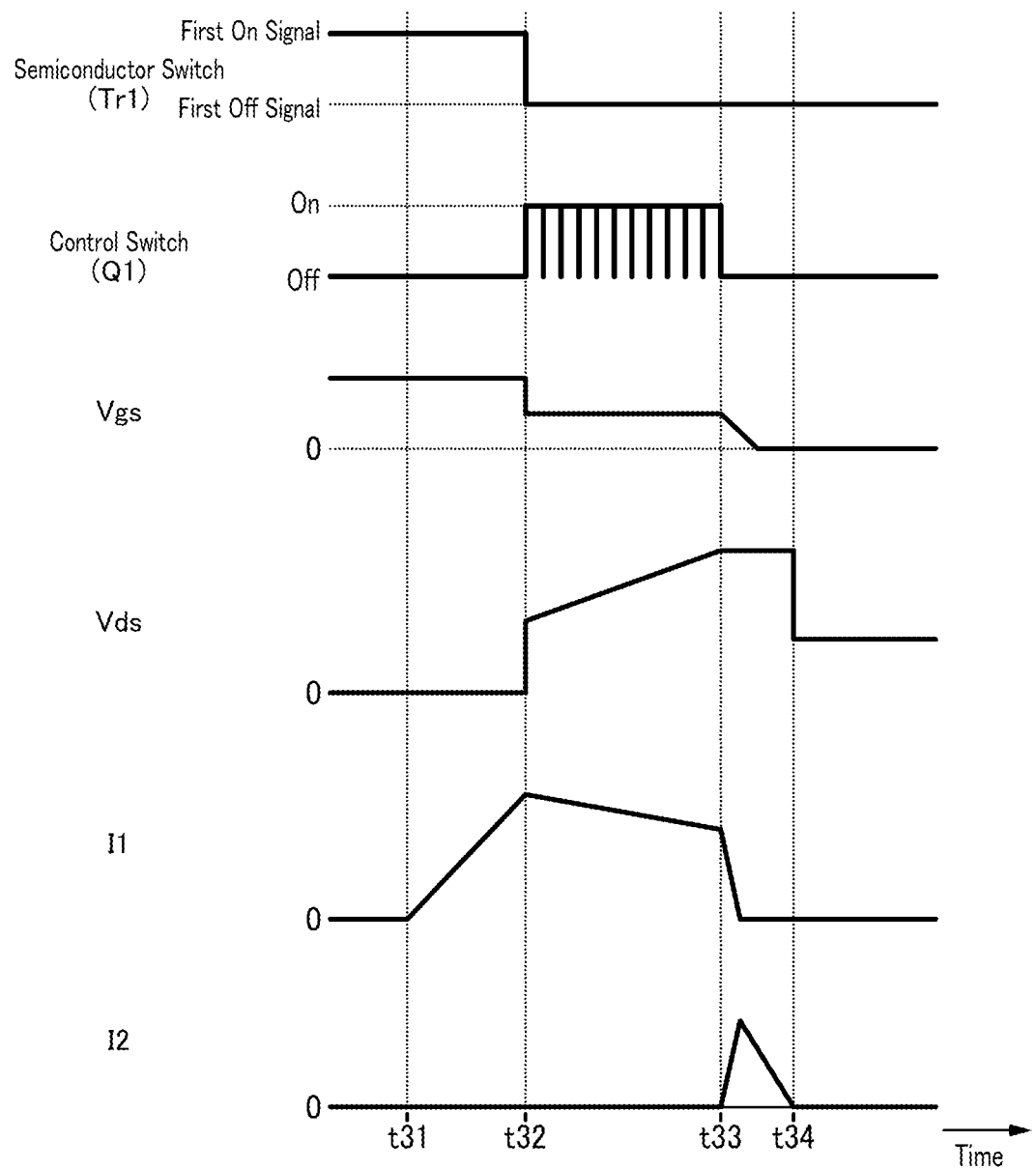
FIG. 14 illustrates how the switch system operates.

FIG. 14 illustrates how the switch system 20I operates, for example, in a situation where a short-circuit failure occurs to the load circuit 204 at a time t31 to cause the main current I1 of the semiconductor switch 1 to start to increase.

At a time t32, the first control signal output from the first control unit 4 changes from a first on signal into a first off signal. In response, the semiconductor switch 1 is turned off and the voltage Vds between the first main terminal 11 and second main terminal 12 of the semiconductor switch 1 increases. Then, the gate of the field effect transistor Q1 is charged through the capacitor 55 of the second control unit 5I to turn the field effect transistor Q1 on. In the switch system 20I, when the field effect transistor Q1 turns on, the voltage Vds between the first main terminal 11 and second main terminal 12 of the semiconductor switch 1 stops increasing, thus turning the field effect transistor Q1 off. In the switch system 20I, when the field effect transistor Q1 turns off, the voltage Vds between the first main terminal 11 and second main terminal 12 of the semiconductor switch 1 increases, and the gate of the field effect transistor Q1 is charged through the capacitor 55 of the second control unit 5I, thus turning the field effect transistor Q1 on. In the switch system 20I, the field effect transistor Q1 alternately turns on and off repeatedly, thus causing an increase in the voltage Vds between the first main terminal 11 and second main terminal 12 of the semiconductor switch 1. In the switch system 20I, when the voltage Vds between the first main terminal 11 and second main terminal 12 of the semiconductor switch 1 increases to reach the clamp voltage of the voltage clamping element 2I at a time t33, the supply of power to the gate of the field effect transistor Q1 via the capacitor 55 is stopped. That is to say, in the switch system 20I, the active clamping circuit 3I finishes performing the clamping operation. As a result, in the switch system 20I, the voltage clamping element 2I clamps the voltage Vds between the first main terminal 11 and second main terminal 12 of the semiconductor switch 1. In the switch system 20I, in the period between the times t32 and t33, part of the energy stored in the inductance component of the line 203 of the load circuit 204 is consumed by the semiconductor switch 1. The main current I1 flowing through the semiconductor switch 1 starts decreasing at the time t33.

At the time t33, the voltage clamping element 2I clamps the voltage Vds between the first main terminal 11 and second main terminal 12 of the semiconductor switch 1. Then, the absolute value of a current variation ratio (−dI1/dt) of the main current I1 of the semiconductor switch 1 increases to cause the main current I1 to decrease steeply to zero. When the main current I1 flowing through the semiconductor switch 1 goes zero, the current I2 flowing through the voltage clamping element 2I decreases. Thereafter, at a time t34, the current I2 flowing through the voltage clamping element 2I goes zero and the voltage Vds between the first main terminal 11 and second main terminal 12 of the semiconductor switch 1 becomes a constant voltage lower than the clamp voltage.

The switch system 20I may make the current value of the main current I1 flowing through the semiconductor switch 1 at the time t33 smaller than the current value of the main current I1 flowing through the semiconductor switch 1 at the time t32. This allows the switch system 20I to reduce the clamp voltage of the voltage clamping element 2I and thereby reduce the voltage Vds between the first main terminal 11 and second main terminal 12 of the semiconductor switch 1.

A switch system 20I according to the tenth embodiment described above includes a semiconductor switch 1, a voltage clamping element 2I, an active clamping circuit 3I, a first control unit 4, and a second control unit 5I. The semiconductor switch 1 has a control terminal 10, a first main terminal 11, and a second main terminal 12. The voltage clamping element 2I is connected to the semiconductor switch 1 in parallel. The active clamping circuit 3I is connected between the control terminal 10 and the first main terminal 11 of the semiconductor switch 1. The first control unit 4 controls the semiconductor switch 1. The second control unit 5I controls the active clamping circuit 3I. The active clamping circuit 3I includes a first diode 31, a second diode 32, and a control switch 33. The first diode 31 has a first anode and a first cathode. The first diode 31 causes breakdown upon application of voltage between the first main terminal 11 and the second main terminal 12 of the semiconductor switch 1. The second diode 32 has a second anode and a second cathode. The second cathode of the second diode 32 is connected to the first cathode of the first diode 31. The control switch 33 is connected between the first anode of the first diode 31 and the control terminal 10 of the semiconductor switch 1. The control switch 33 is a field effect transistor Q1 having a gate, a drain, and a source. The drain of the field effect transistor Q1 is connected to the first anode of the first diode 31. The source of the field effect transistor Q1 is connected to the control terminal 10 of the semiconductor switch 1. The second control unit 5I includes a capacitor 55 and a Zener diode 56. The capacitor 55 has a first terminal and a second terminal. The first terminal of the capacitor 55 is connected to the gate of the field effect transistor Q1. The second terminal of the capacitor 55 is connected to the first cathode of the first diode 31 and the second cathode of the second diode 32. The Zener diode 56 has a third anode and a third cathode. The third cathode of the Zener diode 56 is connected to the first terminal of the capacitor 55 and the gate of the field effect transistor Q1. The third anode of the Zener diode 56 is connected to the source of the field effect transistor Q1.

The switch system 20I according to the tenth embodiment may reduce the surge voltage applied to the semiconductor switch 1 when the semiconductor switch 1 turns off. More specifically, the switch system 20I according to the tenth embodiment may reduce the current value of the main current I1 flowing through the semiconductor switch 1 when the voltage clamping element 2I clamps the voltage between the first main terminal 11 and second main terminal 12 of the semiconductor switch 1 (i.e., may reduce the clamp voltage). Consequently, the switch system 20I may reduce deterioration in the characteristics of the semiconductor switch 1 (e.g., may reduce the chances of the semiconductor switch 1 coming to have a shorter life).

Eleventh Embodiment

Figure 15:
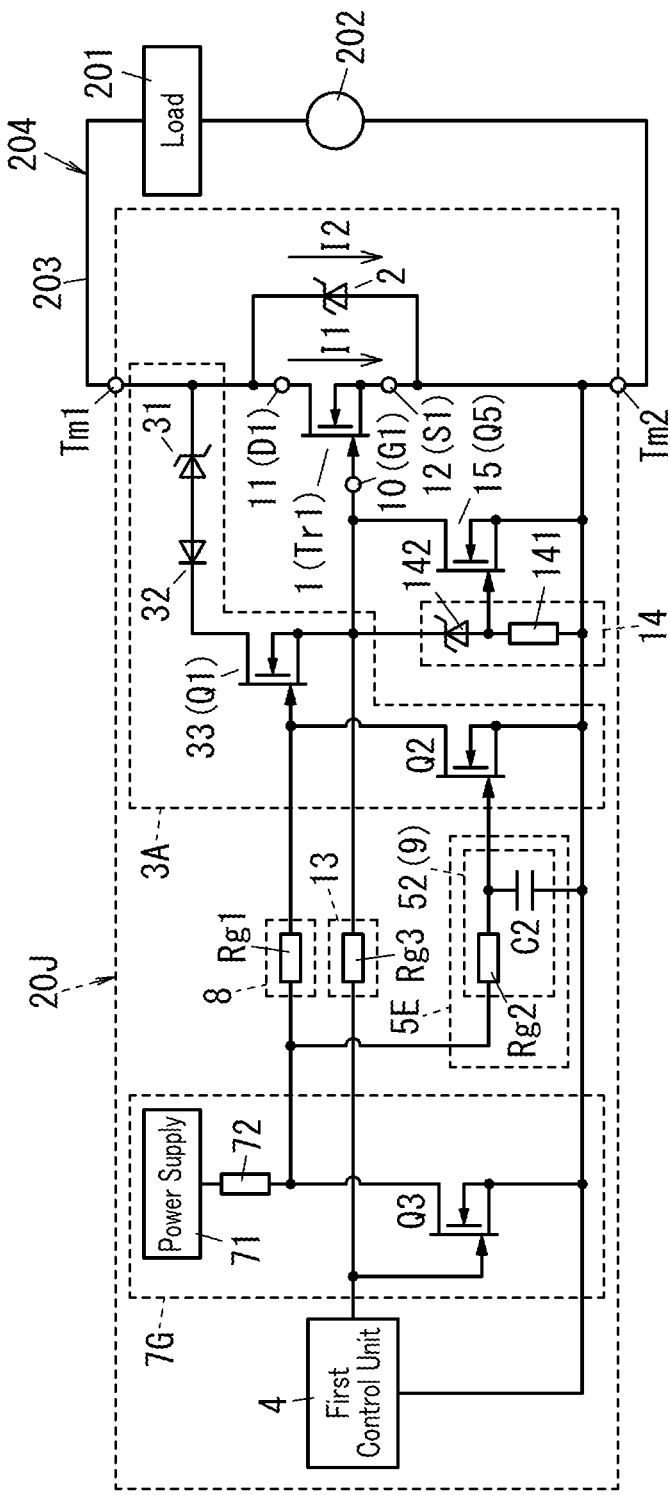
FIG. 15 is a circuit diagram of a switch system according to an eleventh embodiment.

Next, a switch system 20J according to an eleventh embodiment will be described with reference to FIGS. 15 and 16.

The switch system 20J according to the eleventh embodiment is substantially the same as the switch system 20F according to the seventh embodiment (refer to FIG. 8) but further includes a detection circuit 14 and a switch element 15, which is a difference from the switch system 20F according to the seventh embodiment. In addition, the switch system 20J according to the eleventh embodiment includes the NOT circuit 7G of the switch system 20G according to the eighth embodiment instead of the NOT circuit 7F of the switch system 20F according to the seventh embodiment (refer to FIG. 8), which is another difference from the switch system 20F according to the seventh embodiment. In the following description, any constituent element of the switch system 20J according to this eleventh embodiment, having the same function as a counterpart of the switch system 20F according to the seventh embodiment, will be designated by the same reference numeral as that counterpart's, and description thereof will be omitted herein.

The detection circuit 14 is connected between the control terminal 10 and the second main terminal 12 of the semiconductor switch 1. The detection circuit 14 detects voltage between the control terminal 10 and the second main terminal 12 of the semiconductor switch 1. The detection circuit 14 includes a Zener diode 142 and a resistor 141. The Zener diode 142 has an anode and a cathode. The cathode of the Zener diode 142 is connected to the control terminal 10 of the semiconductor switch 1 and the anode of the Zener diode 142 is connected to the second main terminal 12 of the semiconductor switch 1 via the resistor 141.

The switch element 15 is connected between the control terminal 10 and the second main terminal 12 of the semiconductor switch 1. The switch element 15 is a field effect transistor Q5 having a gate, a drain, and a source. In the field effect transistor Q5, the drain thereof is connected to the control terminal 10 of the semiconductor switch 1, the source thereof is connected to the second main terminal 12 of the semiconductor switch 1, and the gate thereof is connected to the anode of the Zener diode 142. Thus, the resistor 141 is connected between the gate and source of the field effect transistor Q5.

In the switch system 20J, the switch element 15 turns on when the voltage detected by the detection circuit 14 exceeds a threshold voltage Vth. The threshold voltage Vth of the detection circuit 14 may be determined by a Zener voltage of the Zener diode 142. The threshold voltage Vth may be 5 V, for example, which is larger than the gate voltage Vg1 (of 3 V, for example) of the junction field effect transistor Tr in on state and smaller than the output voltage (of 15 V, for example) of the first DC power supply included in the first control unit 4.

In the switch system 20J, the semiconductor switch 1 is a junction field effect transistor Tr1. If a MOSFET were adopted as the semiconductor switch 1, then the output voltage of the first DC power supply of the first control unit 4 would be equal to the gate voltage of the MOSFET in on state. The threshold voltage Vth of the detection circuit 14 should be set at a value (e.g., 20V) larger than the output voltage of the first DC power supply included in the first control unit 4 in that case.

In the switch system 20J on the other hand, the semiconductor switch 1 is a junction field effect transistor Tr1. Thus, if neither the load circuit 204 nor the junction field effect transistor Tr has caused any error, then the gate voltage Vg1 of the junction field effect transistor Tr in on state is smaller than the output voltage of the first DC power supply of the first control unit 4, as for the gate voltage Vgs of the junction field effect transistor Tr1. The voltage value of the first on signal of the first control signal output from the first control unit 4 is the same as the output voltage of the first DC power supply of the first control unit 4. In the switch system 20J, the semiconductor switch 1 is the junction field effect transistor Tr1. Thus, the threshold voltage Vth for use in the detection circuit 14 may be a voltage value larger than the gate voltage Vg1 of the junction field effect transistor Tr in on state and smaller than the output voltage of the first DC power supply of the first control unit 4. The threshold voltage Vth does not have to be 5 V but may also be a voltage value falling within the range from 6 V to 14 V, for example.

Next, an exemplary operation of the switch system 20J will be described with reference to FIG. 16. In FIG. 16, the waveform labeled as "semiconductor switch (Tr1)" indicates how the first control signal supplied to the control terminal 10 of the semiconductor switch 1 (junction field effect transistor Tr1) changes with time. Also, in FIG. 16, the waveform labeled as "control switch (Q1)" indicates how the second control signal supplied to the control switch 33 (field effect transistor Q1) changes with time. In FIG. 16, the waveform labeled as "second FET (Q2)" indicates how a third control signal supplied to the second gate of the second field effect transistor Q2 changes with time. In FIG. 16, the waveform labeled as "third FET (Q3)" indicates how a control signal supplied to the third gate of the third field effect transistor Q3 changes with time. In FIG. 16, the waveform labeled as "switch element (Q5)" indicates how a control signal supplied to the gate of the field effect transistor Q5 changes with time. Furthermore, in FIG. 16, "Vgs" denotes a voltage between the gate terminal G1 and the source terminal S1 with respect to the source terminal S1 of the junction field effect transistor Tr1. Thus, "Vgs" denotes the voltage between the control terminal 10 and second main terminal 12 of the semiconductor switch 1 and denotes the gate voltage of the junction field effect transistor Tr1. Furthermore, in FIG. 16, "Vds" denotes a voltage between the drain terminal D1 and the source terminal S1 with respect to the source terminal S1 of the junction field effect transistor Tr1. Thus, "Vds" denotes the voltage between the first main terminal 11 and second main terminal 12 of the semiconductor switch 1. The voltage clamping element 2 is connected to the semiconductor switch 1 in parallel. Thus, the voltage across the voltage clamping element 2 is the same as the voltage Vds between the first main terminal 11 and second main terminal 12 of the semiconductor switch 1.

Figure 16:
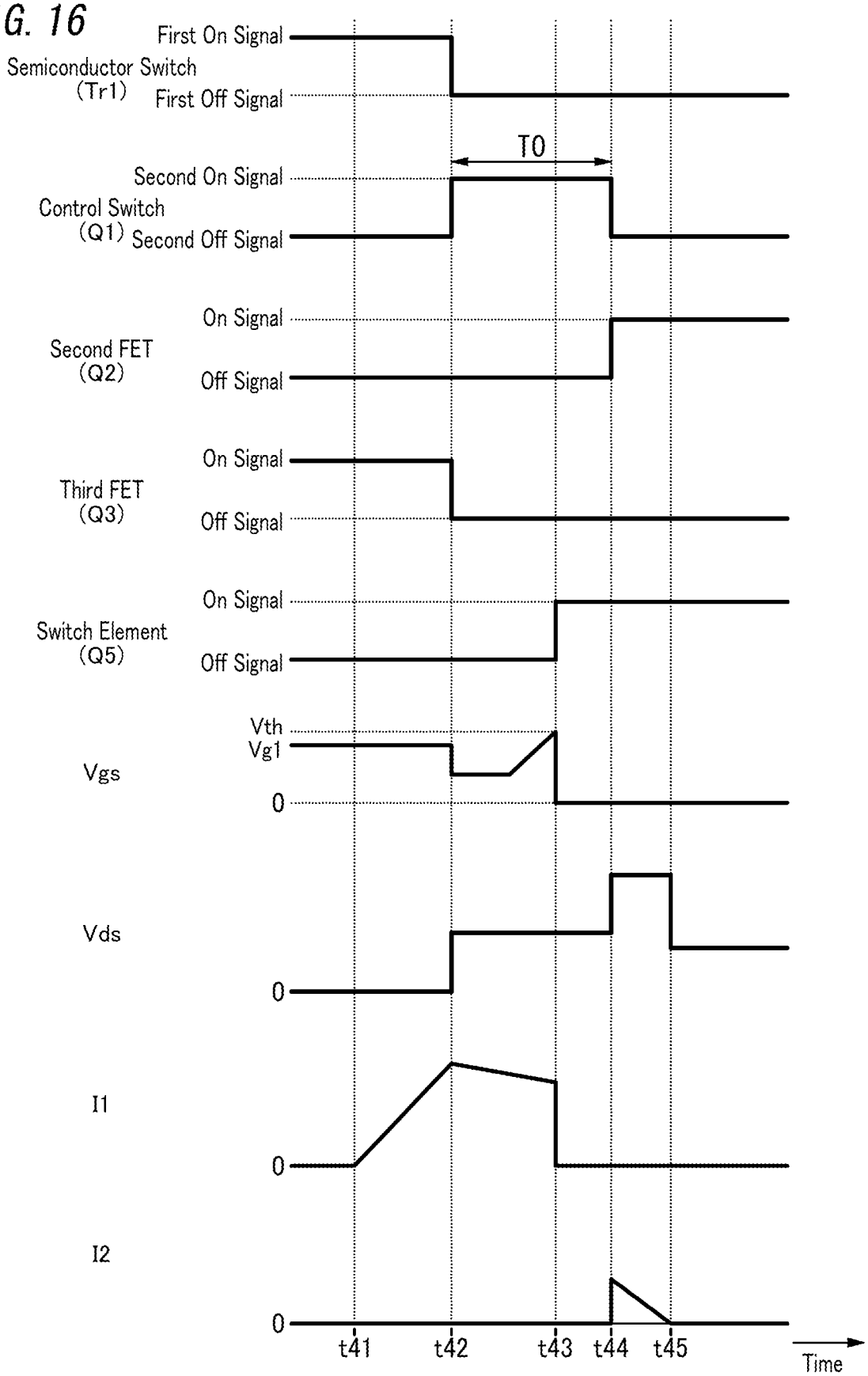
FIG. 16 illustrates how the switch system operates.

FIG. 16 illustrates how the switch system 20J operates, for example, in a situation where a short-circuit failure occurs to the load circuit 204 at a time t41 to cause the main current I1 of the semiconductor switch 1 to start to increase.

At a time t42, the first control signal changes from a first on signal into a first off signal, the second control signal changes from a second off signal into a second on signal, and the control signal for the third field effect transistor Q3 changes from an on signal into an off signal. This causes not only the semiconductor switch 1 to start turning off but also the control switch 33 (first field effect transistor Q1) of the active clamping circuit 3A to turn on. When the control switch 33 of the active clamping circuit 3A turns on, the voltage Vds between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. The main current I1 flowing through the semiconductor switch 1 starts to decrease at the time t42.

Before a time t44, when the predetermined period TO passes since the time t42, the gate voltage Vgs starts to increase. Thereafter, when the gate voltage Vgs detected by the detection circuit 14 becomes equal to or larger than the threshold voltage Vth at a time t43, an on signal is supplied from the detection circuit 14 to the switch element 15 to turn the switch element Q5 on. In the switch system 20J, when the switch element 15 turns on, the gate voltage Vgs of the junction field effect transistor Tr goes zero, the semiconductor switch 1 turns off, and the main current I1 of the semiconductor switch 1 goes zero. In the period from the time t43 to the time t44, the main current I1 that flowed through the semiconductor switch 1 may either become a current flowing through only the first diode 31, out of the first diode 31 and the voltage clamping element 2 (hereinafter referred to as a "first case") or be shunted into two currents flowing through the first diode 31 and the voltage clamping element 2 separately (hereinafter referred to as a "second case"). In FIG. 16, the first case is illustrated. The first case is a situation where the first diode 31 may maintain an amount of current flowing through the semiconductor switch 1. If the switch system 20J needs to operate in the first case scenario, components that allow the amount of current expected to flow through the semiconductor switch 1 may be selected as for the first diode 31 and the control switch 33. As the first diode 31, a varistor may be used, for example. In the second case, the first diode 31 is a diode, of which the specification prevents the first diode 31 from allowing the amount of current that flowed through the semiconductor switch 1 to flow therethrough. Thus, in the second case, the current that flowed through the semiconductor switch 1 flows through the voltage clamping element 2 and the clamp voltage of the voltage clamping element 2 is applied to the semiconductor switch 1. Also, the clamp voltage of the voltage clamping element 2 is also applied to a series circuit of the first diode 31, the second diode 32, the control switch 33, and the switch element 15. In the series circuit, the voltage applied to the first diode 31 is the greatest. Therefore, a diode, of which the peak inverse voltage is larger than the clamp voltage of the voltage clamping element 2, is preferably selected as the first diode 31. In addition, in each of the first and second cases, in the period from the time t43 to the time t44, a large amount of current, which is significantly different from the current flowing when the active clamping circuit 3A is in a normal operating state as in the period from the time t42 to the time t43, flows through the active clamping circuit 3A. Alternatively, in the period from the time t43 to the time t44, a high voltage, which is significantly different from the voltage applied when the active clamping circuit 3A is in a normal operating state as in the period from the time t42 to the time t43, is applied to the active clamping circuit 3A. That is why the period from the time t43 to the time t44 is preferably as short as possible. Therefore, when the switch system 20J is designed, the predetermined period TO may be determined to reduce deterioration in the characteristics of the active clamping circuit 3A in the period from the time t43 to the time t44, for example, and the circuit constant of the second control unit 5E may be set based on the predetermined period TO. In the switch system 20J, at the time t44, the on signal is input to the second field effect transistor Q2 to turn the second field effect transistor Q2 on, thus causing the control switch 33 to turn off. Thereafter, when the current I2 of the voltage clamping element 2 goes zero at the time t45, the voltage Vds between the first main terminal 11 and second main terminal 12 of the semiconductor switch 1 becomes a constant voltage lower than the clamp voltage.

In the switch system 20J, as well as in the switch system 20F according to the seventh embodiment (refer to FIG. 8), the breakdown voltage of the first diode 31 is smaller than the clamp voltage of the voltage clamping element 2. Thus, in the switch system 20J, when the control switch 33 (first field effect transistor Q1) is turned on to turn the semiconductor switch 1 off, the voltage between the first main terminal 11 and second main terminal 12 of the semiconductor switch 1 is clamped by the active clamping circuit 3A. As a result, part of the energy stored in the inductance component of the line 203 of the load circuit 204 is consumed by the semiconductor switch 1. In the switch system 20J, when the switch element 15 turns on before the control switch 33 of the active clamping circuit 3A turns from on to off, the voltage between the first main terminal 11 and second main terminal 12 of the semiconductor switch 1 is clamped by the voltage clamping element 2. Also, in the switch system 20J, unless the switch element 15 turns on before the control switch 33 of the active clamping circuit 3A turns from on to off, the voltage between the first main terminal 11 and second main terminal 12 of the semiconductor switch 1 is clamped by the voltage clamping element 2 when the control switch 33 turns from on to off.

The switch system 20J according to the eleventh embodiment, as well as the switch system 20F according to the seventh embodiment, may also reduce the surge voltage applied to the semiconductor switch 1 when the semiconductor switch 1 turns off. In addition, the switch system 20J according to the eleventh embodiment may also reduce deterioration in the characteristics of the semiconductor switch 1 due to an increase in the voltage (gate voltage Vgs) between the first main terminal 11 and the second main terminal 12 of the semiconductor switch 1 while the active clamping circuit 3A is performing the clamping operation.

Twelfth Embodiment

Figure 17:
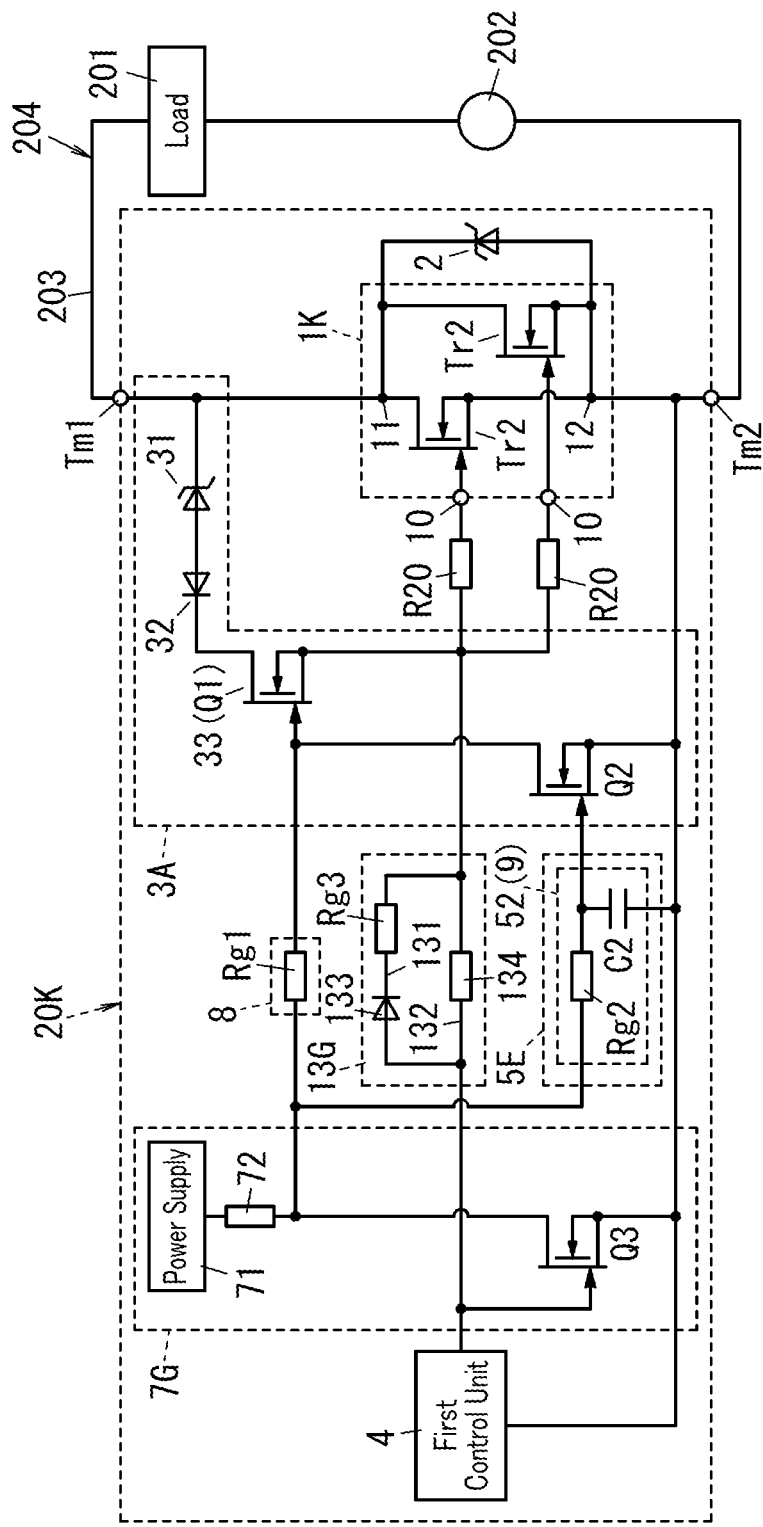
FIG. 17 is a circuit diagram of a switch system according to a twelfth embodiment.

Next, a switch system 20K according to a twelfth embodiment will be described with reference to FIG. 17.

The switch system 20K according to the twelfth embodiment is substantially the same as the switch system 20G according to the eighth embodiment (refer to FIG. 10) but includes a semiconductor switch 1K instead of the semiconductor switch 1 of the switch system 20G, which is a difference from the switch system 20G. In addition, the switch system 20K according to the twelfth embodiment includes a plurality of (e.g., two) gate resistors R20, which is another difference from the switch system 20G according to the eighth embodiment. In the following description, any constituent element of the switch system 20K according to this twelfth embodiment, having the same function as a counterpart of the switch system 20G according to the eighth embodiment, will be designated by the same reference numeral as that counterpart's, and description thereof will be omitted herein.

The semiconductor switch 1K is made up of a plurality of (e.g., two) field effect transistors Tr2 which are connected in parallel. Each of the plurality of field effect transistors Tr2 has a gate, a drain, and a source. In the semiconductor switch 1K, the first main terminal 11 is connected to the respective drains of the plurality of field effect transistors Tr2 and the second main terminal 12 is connected to the respective sources of the plurality of field effect transistors Tr2.

The plurality of gate resistors R20 correspond one to one to the respective gates of the semiconductor switch 1K and are connected between the first control unit 4 and the respective gates. The plurality of gate resistors R20 are connected to the active clamping circuit 3A.

The switch system 20K according to the twelfth embodiment, as well as the switch system 20G according to the eighth embodiment, may also reduce the surge voltage applied to the semiconductor switch 1 when the semiconductor switch 1 turns off.

In the switch system 20K according to the twelfth embodiment, the semiconductor switch 1K is made up of a plurality of field effect transistors Tr2 which are connected in parallel. This may make the current value of the current flowing through each of the plurality of field effect transistors Tr2 smaller than the current value of the current flowing through the junction field effect transistor Tr1.

In addition, the switch system 20K according to the twelfth embodiment includes the plurality of gate resistors R20. This enables increasing the impedance of the loop, including the drain and gate, of each of the plurality of field effect transistors Tr2 compared to a situation where the plurality of gate resistors R20 are not provided, thus reducing the chances of producing oscillation.

Thirteenth Embodiment

Figure 18:
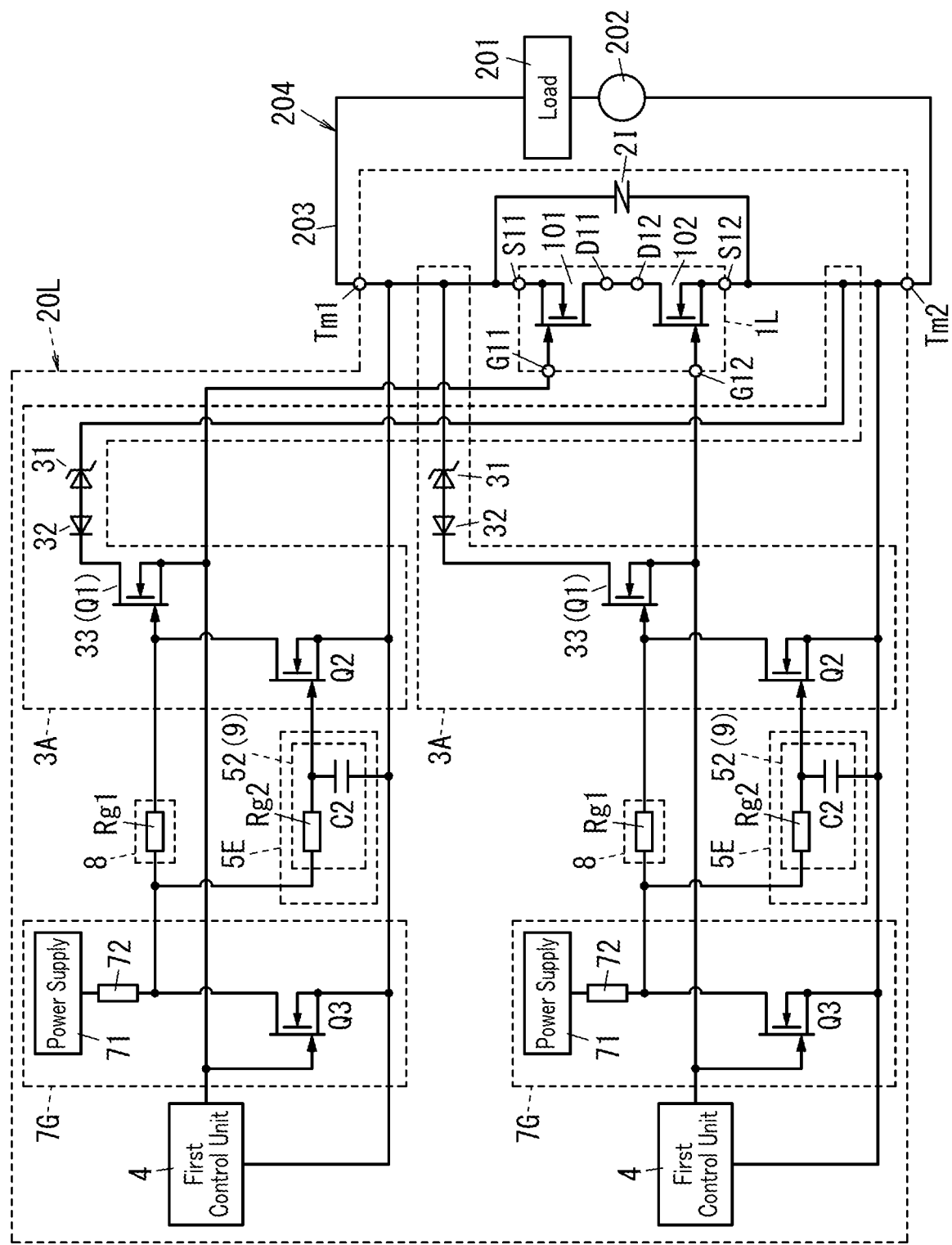
FIG. 18 is a circuit diagram of a switch system according to a thirteenth embodiment.

Next, a switch system 20L according to a thirteenth embodiment will be described with reference to FIG. 18.

The switch system 20L according to the thirteenth embodiment is substantially the same as the switch system 20G according to the eighth embodiment (refer to FIG. 10) but includes a semiconductor switch 1L instead of the semiconductor switch 1 of the switch system 20G, which is a difference from the switch system 20G. The semiconductor switch 1L is a bidirectional switch. In addition, the switch system 20L according to the thirteenth embodiment includes the voltage clamping element 2I instead of the voltage clamping element 2, which is another difference from the switch system 20G. Furthermore, the switch system 20L includes two active clamping circuits 3A, two first control units 4, two NOT circuits 7, two second control units 5E, and two first drive circuits 8, which is still another difference from the switch system 20G according to the eighth embodiment. Besides, the switch system 20L according to the thirteenth embodiment does not include the third drive circuit 13G of the switch system 20G according to the eighth embodiment, which is yet another difference from the switch system 20G according to the eighth embodiment. In the following description, any constituent element of the switch system 20L according to this thirteenth embodiment, having the same function as a counterpart of the switch system 20G according to the eighth embodiment, will be designated by the same reference numeral as that counterpart's, and description thereof will be omitted herein.

In the switch system 20L, the power supply 202 of the load circuit 204 connected between the first external terminal Tm1 and the second external terminal Tm2 may be an AC power supply, for example.

In the switch system 20L, the semiconductor switch 1L includes a first switch element 101 and a second switch element 102. Each of the first switch element 101 and the second switch element 102 may be a junction field effect transistor, for example. The junction field effect transistor may be a GaN-based GIT, for example.

The first switch element 101 includes a first gate terminal G11, a first drain terminal D11, and a first source terminal S11.

The second switch element 102 includes a second gate terminal G12, a second drain terminal D12, and a second source terminal S12.

The second switch element 102 is connected to the first switch element 101 in series. In the semiconductor switch 1L, the first drain terminal D11 of the first switch element 101 and the second drain terminal D12 of the second switch element 102 are connected to each other.

The semiconductor switch 1L includes two sets, each of which consists of a control terminal, a first main terminal, and a second main terminal. In one of the two sets, the control terminal, the first main terminal, and the second main terminal are the first gate terminal G11, the second source terminal S12, and the first source terminal S11, respectively. In the other of the two sets, the control terminal, the first main terminal, and the second main terminal are the second gate terminal G12, the first source terminal S11, and the second source terminal S12, respectively.

The voltage clamping element 2I is a varistor. The voltage clamping element 2I is connected to the semiconductor switch 1L in parallel. More specifically, the voltage clamping element 2I is connected between the first source terminal S11 and the second source terminal S12 of the semiconductor switch 1L.

In the switch system 20L, one first control unit 4 out of the two first control units 4 is connected between the first gate terminal G11 and the first source terminal S11 of the first switch element 101, while the other first control unit 4 is connected between the second gate terminal G12 and the second source terminal S12 of the second switch element 102.

The switch system 20L includes two active clamping circuits 3A as described above. In the switch system 20L, one active clamping circuit 3A out of the two active clamping circuits 3A is connected between the first gate terminal G11 and the second source terminal S12, while the other active clamping circuit 3A is connected between the second gate terminal G12 and the first source terminal S11.

The switch system 20L according to the thirteenth embodiment may reduce, while a main current is flowing from the first source terminal S11 of the semiconductor switch 1L toward the second source terminal S12 thereof, the surge voltage applied to the semiconductor switch 1L when the semiconductor switch 1L turns off. In addition, the switch system 20L according to the thirteenth embodiment may also reduce, while a main current is flowing from the second source terminal S12 of the semiconductor switch 1L toward the first source terminal S11 thereof, the surge voltage applied to the semiconductor switch 1L when the semiconductor switch 1L turns off.

Fourteenth Embodiment

Figure 19:
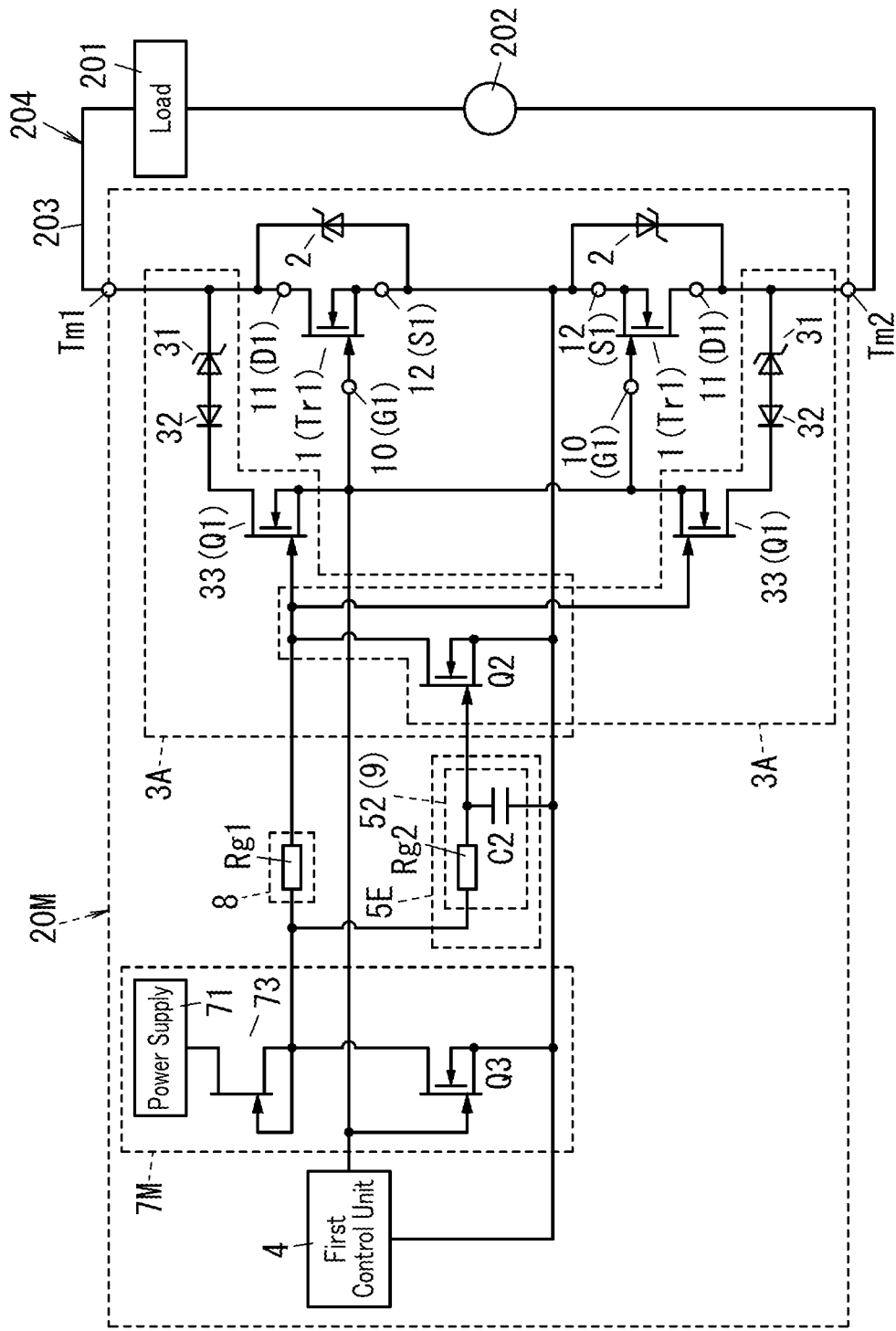
FIG. 19 is a circuit diagram of a switch system according to a fourteenth embodiment.

Next, a switch system 20M according to a fourteenth embodiment will be described with reference to FIG. 19.

The switch system 20M according to the fourteenth embodiment is substantially the same as the switch system 20G according to the eighth embodiment (refer to FIG. 10) but includes two semiconductor switches 1 and two voltage clamping elements 2 of the switch system 20G, which is a difference from the switch system 20G according to the eighth embodiment. In addition, the switch system 20M according to the fourteenth embodiment includes two active clamping circuits 3A, which is another difference from the switch system 20G according to the eighth embodiment. Furthermore, the switch system 20M according to the fourteenth embodiment does not include the third drive circuit 13G of the switch system 20G according to the eighth embodiment, which is yet another difference from the switch system 20G according to the eighth embodiment. Besides, the switch system 20M according to the fourteenth includes a NOT circuit 7M instead of the NOT circuit 7G of the switch system 20G, which is yet another difference from the switch system 20G according to the eighth embodiment. In the following description, any constituent element of the switch system 20M according to this fourteenth embodiment, having the same function as a counterpart of the switch system 20G according to the eighth embodiment, will be designated by the same reference numeral as that counterpart's, and description thereof will be omitted herein.

In each of the two semiconductor switches 1, the control terminal 10, the first main terminal 11, and the second main terminal 12 are a gate terminal G1, a drain terminal D1, and a source terminal S1, respectively. In this switch system 20M, the two semiconductor switches 1 are connected together in series by connecting their respective source terminals S1 to each other. Thus, the switch system 20M includes a bidirectional switch including the two semiconductor switches 1. In the switch system 20M, the power supply 202 of the load circuit 204 connected between the first external terminal Tm1 and the second external terminal Tm2 may be an AC power supply, for example.

The two voltage clamping elements 2 correspond one to one to the two semiconductor switches 1. Each of the two voltage clamping elements 2 is connected to a corresponding one of the two semiconductor switches 1 in parallel. The two active clamping circuits 3A correspond one to one to the two semiconductor switches 1. Each of the two active clamping circuits 3A is connected between the gate terminal G1 and drain terminal D1 of the corresponding one of the two semiconductor switches 1. Also, in this switch system 20M, the second field effect transistor Q2 is shared by the two active clamping circuits 3A.

The NOT circuit 7M includes a diode 73 instead of the resistor 72 of the NOT circuit 7G of the switch system 20G. The diode 73 may be formed by, for example, connecting together the gate and source of a normally-on junction field effect transistor.

The switch system 20M according to the fourteenth embodiment may reduce, while a main current is flowing through each semiconductor switch 1 from the first external terminal Tm1 toward the second external terminal Tm2, the surge voltage applied to each semiconductor switch 1 when the semiconductor switch 1 turns off. In addition, the switch system 20M according to the fourteenth embodiment may also reduce, while a main current is flowing through each semiconductor switch 1 from the second external terminal Tm2 toward the first external terminal Tm1, the surge voltage applied to each semiconductor switch 1 when the semiconductor switch 1L turns off.

Fifteenth Embodiment

Figure 20:
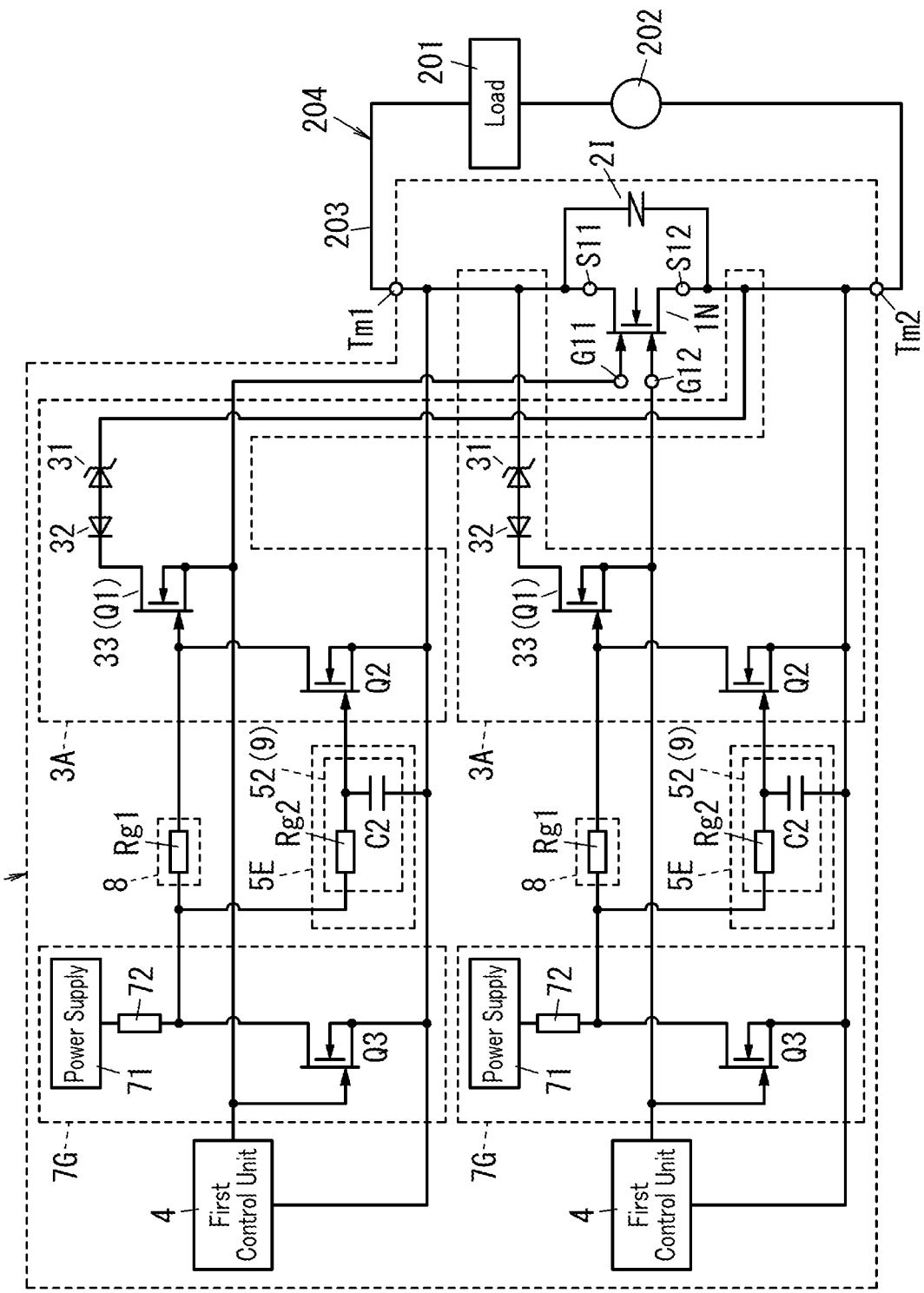
FIG. 20 is a circuit diagram of a switch system according to a fifteenth embodiment.

Next, a switch system 20N according to a fifteenth embodiment will be described with reference to FIG. 20.

The switch system 20N according to the fifteenth embodiment is substantially the same as the switch system 20L according to the thirteenth embodiment (refer to FIG. 18) but includes a semiconductor switch 1N instead of the semiconductor switch 1L of the switch system 20L, which is a difference from the switch system 20L. The semiconductor switch 1N is a dual-gate bidirectional switch. In the following description, any constituent element of the switch system 20N according to this fifteenth embodiment, having the same function as a counterpart of the switch system 20L according to the thirteenth embodiment, will be designated by the same reference numeral as that counterpart's, and description thereof will be omitted herein.

In the switch system 20N, the power supply 202 of the load circuit 204 connected between the first external terminal Tm1 and the second external terminal Tm2 may be an AC power supply, for example.

The semiconductor switch 1N is a dual-gate bidirectional switch having a first gate terminal G11, a first source terminal S11 corresponding to the first gate terminal G11, a second gate terminal G12, and a second source terminal S12 corresponding to the second gate terminal G12. The semiconductor switch 1N includes two sets, each of consists of a control terminal, a first main terminal, and a second main terminal. In one of the two sets, the control terminal, the first main terminal, and the second main terminal are the first gate terminal G11, the second source terminal S12, and the first source terminal S11, respectively. In the other of the two sets, the control terminal, the first main terminal, and the second main terminal are the second gate terminal G12, the first source terminal S11, and the second source terminal S12, respectively.

The semiconductor switch 1N is a type of GaN-based GIT. The semiconductor switch 1N includes, for example, a substrate, a buffer layer, a first nitride semiconductor layer, a second nitride semiconductor layer, a first source electrode, a first gate electrode, a second gate electrode, a second source electrode, a first p-type layer, and a second p-type layer. The buffer layer is formed on the substrate. The first nitride semiconductor layer is formed on the buffer layer. The second nitride semiconductor layer is formed on the first nitride semiconductor layer. The first source electrode, the first gate electrode, the second gate electrode, and the second source electrode are formed on the second nitride semiconductor layer. The first p-type layer is interposed between the first gate electrode and the second nitride semiconductor layer. The second p-type layer is interposed between the second gate electrode and the second nitride semiconductor layer. In the semiconductor switch 1N, the first source terminal S11 includes the first source electrode. The first gate terminal G11 includes the first gate electrode and the first p-type layer. The second gate terminal G12 includes the second gate electrode and the second p-type layer. The second source terminal S12 includes the second source electrode. The substrate may be a silicon substrate, for example. The buffer layer may be an undoped GaN layer, for example. The first nitride semiconductor layer may be, for example, an undoped GaN layer. The second nitride semiconductor layer may be, for example, an undoped AlGaN layer. Each of the first and second p-type layers may be, for example, a p-type AlGaN layer. Each of the buffer layer, the first nitride semiconductor layer, and the second nitride semiconductor layer may include impurities such as Mg, H, Si, C, and O to be inevitably contained during their growing process by metal-organic vapor phase epitaxy (MOVPE), for example.

In the semiconductor switch TN, the second nitride semiconductor layer forms a heterojunction portion along with the first nitride semiconductor layer. In the first nitride semiconductor layer, a two-dimensional electron gas has been generated in the vicinity of the heterojunction portion. A region including the two-dimensional electron gas (hereinafter referred to as a "two-dimensional electron gas layer") may also serve as an n-channel layer (electron conduction layer).

Also, in the following description, a state where a voltage equal to or higher than a first threshold voltage (of 1.3 V, for example) is not applied between the first gate terminal G11 and the first source terminal S11 will be hereinafter referred to as a "state where the first gate terminal G11 is off." Also, a state where a voltage equal to or higher than the first threshold voltage is applied between the first gate terminal G11 and the first source terminal S11 with the first gate terminal G11 having the higher potential will be hereinafter referred to as a "state where the first gate terminal G11 is on." Furthermore, a state where a voltage equal to or higher than a second threshold voltage (of 1.3 V, for example) is not applied between the second gate terminal G12 and the second source terminal S12 will be hereinafter referred to as a "state where the second gate terminal G12 is off." Also, a state where a voltage equal to or higher than the second threshold voltage is applied between the second gate terminal G12 and the second source terminal S12 with the second gate terminal G12 having the higher potential will be hereinafter referred to as a "state where the second gate terminal G12 is on."

This semiconductor switch 1N includes the first p-type layer and the second p-type layer, thus implementing a normally off transistor.

The semiconductor switch 1N may be switched from one of a bidirectionally on state, a bidirectionally off state, a first diode state, or a second diode state to another depending on the combination of a first gate voltage applied to the first gate terminal G11 and a second gate voltage applied to the second gate terminal G12. The first gate voltage is a voltage applied between the first gate terminal G11 and the first source terminal S11. The second gate voltage is a voltage applied between the second gate terminal G12 and the second source terminal S12. The bidirectionally on state is a state where an electric current is allowed to pass bidirectionally (i.e., in a first direction and a second direction opposite from the first direction). The bidirectionally off state is a state where an electric current is blocked bidirectionally. The first diode state is a state where an electric current is allowed to pass in the first direction. The second diode state is a state where an electric current is allowed to pass in the second direction.

In a state where the first gate terminal G11 is on and the second gate terminal G12 is on, the semiconductor switch TN turns into the bidirectionally on state. In a state where the first gate terminal G11 is off and the second gate terminal G12 is off, the semiconductor switch TN turns into the bidirectionally off state. In a state where the first gate terminal G11 is off and the second gate terminal G12 is on, the semiconductor switch TN turns into the first diode state. In a state where the first gate terminal G11 is on and the second gate terminal G12 is off, the semiconductor switch TN turns into the second diode state.

The switch system 20N includes two active clamping circuits 3A. In the switch system 20N, one active clamping circuit 3A out of the two active clamping circuits 3A is connected between the first gate terminal G11 and the second source terminal S12, while the other active clamping circuit 3A is connected between the second gate terminal G12 and the first source terminal S11.

The switch system 20N according to the fifteenth embodiment may reduce, while a main current is flowing from the first source terminal S11 of the semiconductor switch TN toward the second source terminal S12 thereof, the surge voltage applied to the semiconductor switch TN when the semiconductor switch TN turns off. In addition, the switch system 20N according to the fifteenth embodiment may also reduce, while a main current is flowing from the second source terminal S12 of the semiconductor switch TN toward the first source terminal S1 thereof, the surge voltage applied to the semiconductor switch TN when the semiconductor switch TN turns off.

Sixteenth Embodiment

Figure 21:
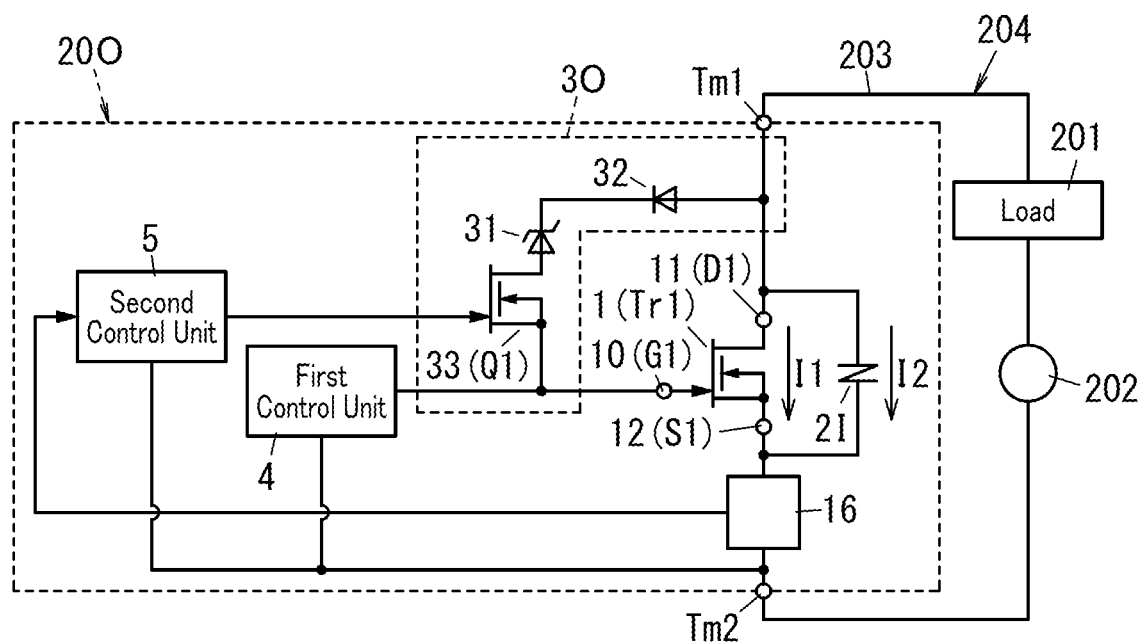
FIG. 21 is a circuit diagram of a switch system according to a sixteenth embodiment.

Next, a switch system 20O according to a sixteenth embodiment will be described with reference to FIG. 21.

The switch system 20O according to the sixteenth embodiment is substantially the same as the switch system 20 according to the first embodiment (refer to FIG. 1) but further includes a current detection unit 16, which is a difference from the switch system 20. In addition, the switch system 20O according to the sixteenth embodiment includes an active clamping circuit 30 instead of the active clamping circuit 3 of the switch system 20 according to the first embodiment, which is another difference from the switch system 20. Furthermore, the switch system 20O according to the sixteenth embodiment includes the voltage clamping element 2I instead of the voltage clamping element 2, which is another difference from the switch system 20. In the following description, any constituent element of the switch system 20O according to this sixteenth embodiment, having the same function as a counterpart of the switch system 20 according to the first embodiment, will be designated by the same reference numeral as that counterpart's, and description thereof will be omitted herein.

The current detection unit 16 detects a current flowing through the second main terminal 12 of the semiconductor switch 1. The current detection unit 16 is connected between the second main terminal 12 of the semiconductor switch 1 and the second external terminal Tm2.

The active clamping circuit 30 is connected between the control terminal 10 and the first main terminal 11 of the semiconductor switch 1. The active clamping circuit 30 includes a first diode 31, a second diode 32, and a control switch 33. In the active clamping circuit 30, the second anode of the second diode 32 is connected to the first main terminal 11 of the semiconductor switch 1, and the second cathode of the second diode 32 is connected to the control switch 33 via the first diode 31. The second cathode of the second diode 32 is connected to the first cathode of the first diode 31. The control switch 33 is connected between the first anode of the first diode 31 and the control terminal 10 of the semiconductor switch 1. The first diode 31 causes breakdown upon application of voltage between the first main terminal 11 and the second main terminal 12 of the semiconductor switch 1. The control switch 33 is a field effect transistor Q1. The drain of the field effect transistor Q1 is connected to the first anode of the first diode 31. The source of the field effect transistor Q1 is connected to the control terminal 10 of the semiconductor switch 1.

The voltage clamping element 2I is connected to the semiconductor switch 1 in parallel. More specifically, the voltage clamping element 2I is connected between the first main terminal 11 and the second main terminal 12 of the semiconductor switch 1. The voltage clamping element 2I may be a varistor, for example. However, the voltage clamping element 2I does not have to be a varistor but may also be a Zener diode (such as a TVS diode).

In the switch system 20O, the second control unit 5 controls the control switch 33 according to the output of the current detection unit 16. More specifically, the second control unit 5 changes the conductive period of the control switch 33 according to the output of the current detection unit 16. When finding the current value detected by the current detection unit 16 while the active clamping circuit 30 is performing the clamping operation larger than a predetermined value, the larger the current value is, the shorter the conductive period of the control switch 33 is made by the second control unit 5. When the current value detected by the current detection unit 16 becomes equal to or larger than a threshold value, the second control unit 5 turns the control switch 33 on to make the active clamping circuit 30 start performing the clamping operation. When finding that the current value detected by the current detection unit 16 while the active clamping circuit 30 is performing the clamping operation reaches a predetermined value larger than the threshold value, the larger the current value is, the earlier the second control unit 5 performs the control of turning the control switch 33 from on to off. As used herein, the predetermined value is a current value falling within a safe operating range of the voltage clamping element 2I.

In the switch system 20O, the breakdown voltage of the first diode 31 is smaller than the clamp voltage of the voltage clamping element 2I. Thus, in the switch system 20O, when the control switch 33 (field effect transistor Q1) is turned on to turn the semiconductor switch 1 off, the voltage between the first main terminal 11 and second main terminal 12 of the semiconductor switch 1 is clamped by the active clamping circuit 30. As a result, part of the energy stored in the inductance component of the line 203 of the load circuit 204 is consumed by the semiconductor switch 1. In the switch system 20O, when the control switch 33 of the active clamping circuit 30 turns from on to off, the voltage between the first main terminal 11 and second main terminal 12 of the semiconductor switch 1 is clamped by the voltage clamping element 2I.

The switch system 20O according to the sixteenth embodiment, as well as the switch system 20 according to the first embodiment, may also reduce the surge voltage applied to the semiconductor switch 1 when the semiconductor switch 1 turns off.

Seventeenth Embodiment

Figure 22:
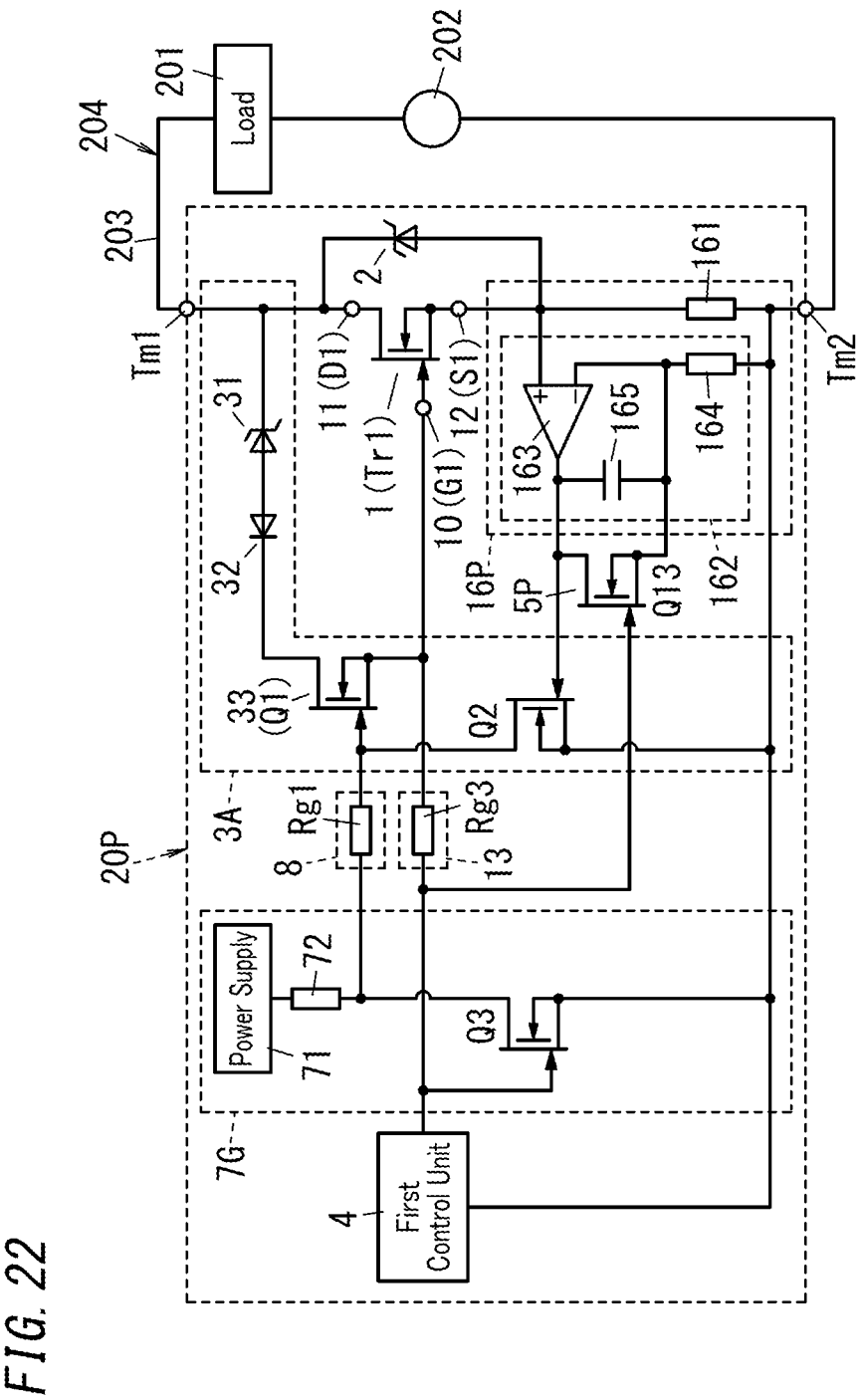
FIG. 22 is a circuit diagram of a switch system according to a seventeenth embodiment.

Next, a switch system 20P according to a seventeenth embodiment will be described with reference to FIG. 22.

The switch system 20P according to the seventeenth embodiment is substantially the same as the switch system 20F according to the seventh embodiment (refer to FIG. 8) but further includes a current detection unit 16P, which is a difference from the switch system 20F. In addition, the switch system 20P includes a second control unit 5P instead of the second control unit 5E of the switch system 20F, which is another difference from the switch system 20F. Furthermore, the switch system 20P includes the NOT circuit 7G of the switch system 20G according to the eighth embodiment (refer to FIG. 10) instead of the NOT circuit 7F of the switch system 20F, which is still another difference from the switch system 20F. In the following description, any constituent element of the switch system 20P according to this seventeenth embodiment, having the same function as a counterpart of the switch system 20F according to the seventh embodiment, will be designated by the same reference numeral as that counterpart's, and description thereof will be omitted herein.

The current detection unit 16P detects a current flowing through the second main terminal 12 of the semiconductor switch 1.

The second control unit 5P includes a third field effect transistor Q13. The third field effect transistor Q13 has a third gate, a third drain, and a third source.

The current detection unit 16P includes a detecting resistor 161 and an integration circuit 162. The detecting resistor 161 is connected to the second main terminal 12 of the semiconductor switch 1 and connected to the semiconductor switch 1 in series. More specifically, the detecting resistor 161 is connected between the second main terminal 12 of the semiconductor switch 1 and the second external terminal Tm2. The integration circuit 162 integrates voltage across the detecting resistor 161. The integration circuit 162 includes an operational amplifier 163 and a capacitor 165. The integration circuit 162 further includes a biasing resistor 164. In the integration circuit 162, the second main terminal 12 of the semiconductor switch 1 is connected to a non-inverting input terminal of the operational amplifier 163, and the capacitor 165 is connected between an inverting input terminal and output terminal operational amplifier 163. The output terminal of the operational amplifier 163 is connected to the second gate of the second field effect transistor Q2. Also, in the integration circuit 162, the biasing resistor 164 is connected between the inverting input terminal of the operational amplifier 163 and the second external terminal Tm2.

In the switch system 20P, the second gate of the second field effect transistor Q2 is connected to the output terminal of the integration circuit 162. In the switch system 20P, the third drain of the third field effect transistor Q13 is connected to the output terminal of the integration circuit 162. In the switch system 20P, the third gate of the third field effect transistor Q13 is connected to a signal path between the first control unit 4 and the control terminal 10 of the semiconductor switch 1.

In the switch system 20P, while the first control unit 4 is outputting a first on signal, the semiconductor switch 1 and the third field effect transistor Q13 are in on state, and therefore, the output terminal and inverting input terminal of the operational amplifier 163 are short-circuited. When the first control signal output from the first control unit 4 changes from the first on signal into a first off signal, the third field effect transistor Q13 turns off. In the current detection unit 16P, the integration circuit 162 starts performing the integration operation, the instant the third field effect transistor Q13 turns off. In the switch system 20P, when the integrated value of the integration circuit 162 reaches a threshold value, the output signal of the integration circuit 162 causes the second field effect transistor Q2 to turn on. In the active clamping circuit 3A, when the second field effect transistor Q2 turns on, the first field effect transistor Q1 turns off, thus ending the clamping operation.

The current detection unit 16 includes the integration circuit 162. Thus, the time it takes for the potential at the non-inverting input terminal of the operational amplifier 163 to become higher than the potential at the inverting input terminal (e.g., 6V) varies according to the current value of the current flowing through the detecting resistor 161. The biasing resistor 164 is provided to bias the potential at the non-inverting input terminal of the operational amplifier 163 (i.e., a reference potential) at a predetermined potential (e.g., 6 V). In the current detection unit 16P, the larger the current value of the current flowing through the detecting resistor 161 is, the shorter the time it takes to turn the second field effect transistor Q2 on is and the shorter the time it takes to turn the first field effect transistor Q1 off. This allows the switch system 20P to change the conductive period of the control switch 33 of the active clamping circuit 3A according to the current value of the current flowing through the detecting resistor 161.

The switch system 20P according to the seventeenth embodiment, as well as the switch system 20F according to the seventh embodiment, may also reduce the surge voltage applied to the semiconductor switch 1 when the semiconductor switch 1 turns off.

Eighteenth Embodiment

Figure 23:
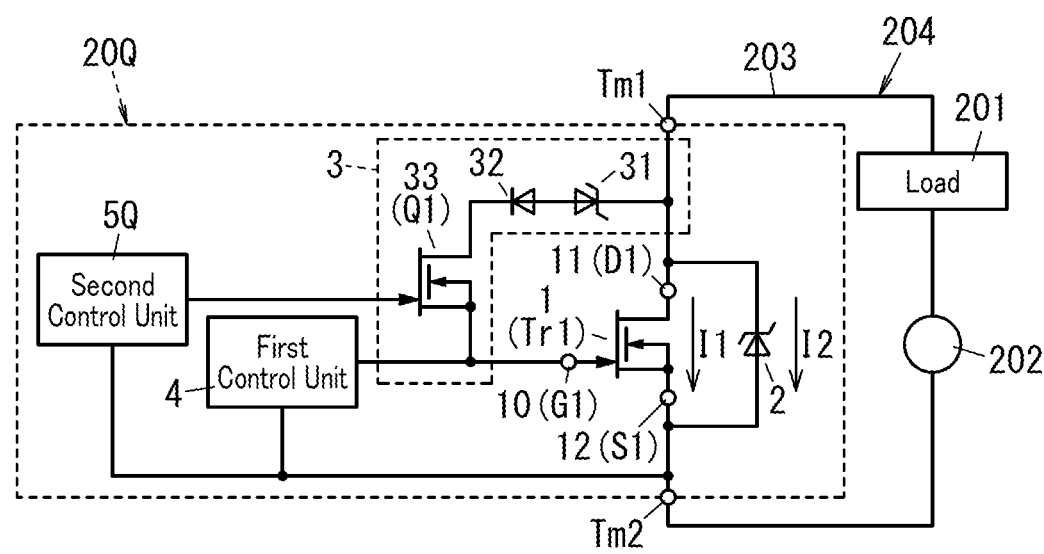
FIG. 23 is a circuit diagram of a switch system according to an eighteenth embodiment.

Next, a switch system 20Q according to an eighteenth embodiment will be described with reference to FIGS. 23 and 24.

The switch system 20Q according to the eighteenth embodiment is substantially the same as the switch system 20 according to the first embodiment (refer to FIG. 1) but includes a second control unit 5Q instead of the second control unit 5, which is a difference from the switch system 20. In the following description, any constituent element of the switch system 20Q according to this eighteenth embodiment, having the same function as a counterpart of the switch system 20 according to the first embodiment, will be designated by the same reference numeral as that counterpart's, and description thereof will be omitted herein.

In the switch system 20Q according to the eighteenth embodiment, before the first control unit 4 outputs a first off signal to turn the semiconductor switch 1 off while outputting a first on signal to turn the semiconductor switch 1 on, the second control unit 5 outputs a second off signal to turn the control switch 33 off. In the switch system 20Q, the second control unit 5Q outputs a second on signal to turn the control switch 33 on when a first period (designated by T1 in FIG. 24) has passed since the output of the first off signal from the first control unit 4. In the switch system 20Q, the second control unit 5Q outputs a second off signal to turn the control switch 33 off when a second period (designated by T2 in FIG. 24) has passed since the output of the first off signal from the first control unit 4. The switch system 20Q satisfies T1<(T2−T1) and T1≤T3, where T1 is the first period (refer to FIG. 24), T2 is the second period (refer to FIG. 24), and T3 is a third period (refer to FIG. 24) between a point in time when the first control unit 4 has output the first off signal and a point in time when a current I2 flowing through the voltage clamping element 2 becomes equal to zero (refer to FIG. 24).

Next, an exemplary operation of the switch system 20Q will be described with reference to FIG. 24. In FIG. 24, the waveform labeled as "semiconductor switch (Tr1)" indicates how the first control signal supplied to the control terminal 10 of the semiconductor switch 1 (junction field effect transistor Tr1) changes with time. Also, in FIG. 24, the waveform labeled as "control switch (Q1)" indicates how the second control signal supplied to the control switch 33 (field effect transistor Q1) changes with time. Furthermore, in FIG. 24, "Vgs" denotes a voltage between the gate terminal G1 and the source terminal S1 with respect to the source terminal S1 of the junction field effect transistor Tr1. Thus, "Vgs" denotes the voltage between the control terminal 10 and second main terminal 12 of the semiconductor switch 1. Furthermore, in FIG. 24, "Vds" denotes a voltage between the drain terminal D1 and the source terminal S1 with respect to the source terminal S1 of the junction field effect transistor Tr1. Thus, "Vds" denotes the voltage between the first main terminal 11 and second main terminal 12 of the semiconductor switch 1. The voltage clamping element 2 is connected to the semiconductor switch 1 in parallel. Thus, the voltage across the voltage clamping element 2 is the same as the voltage Vds between the first main terminal 11 and second main terminal 12 of the semiconductor switch 1.

Figure 24:
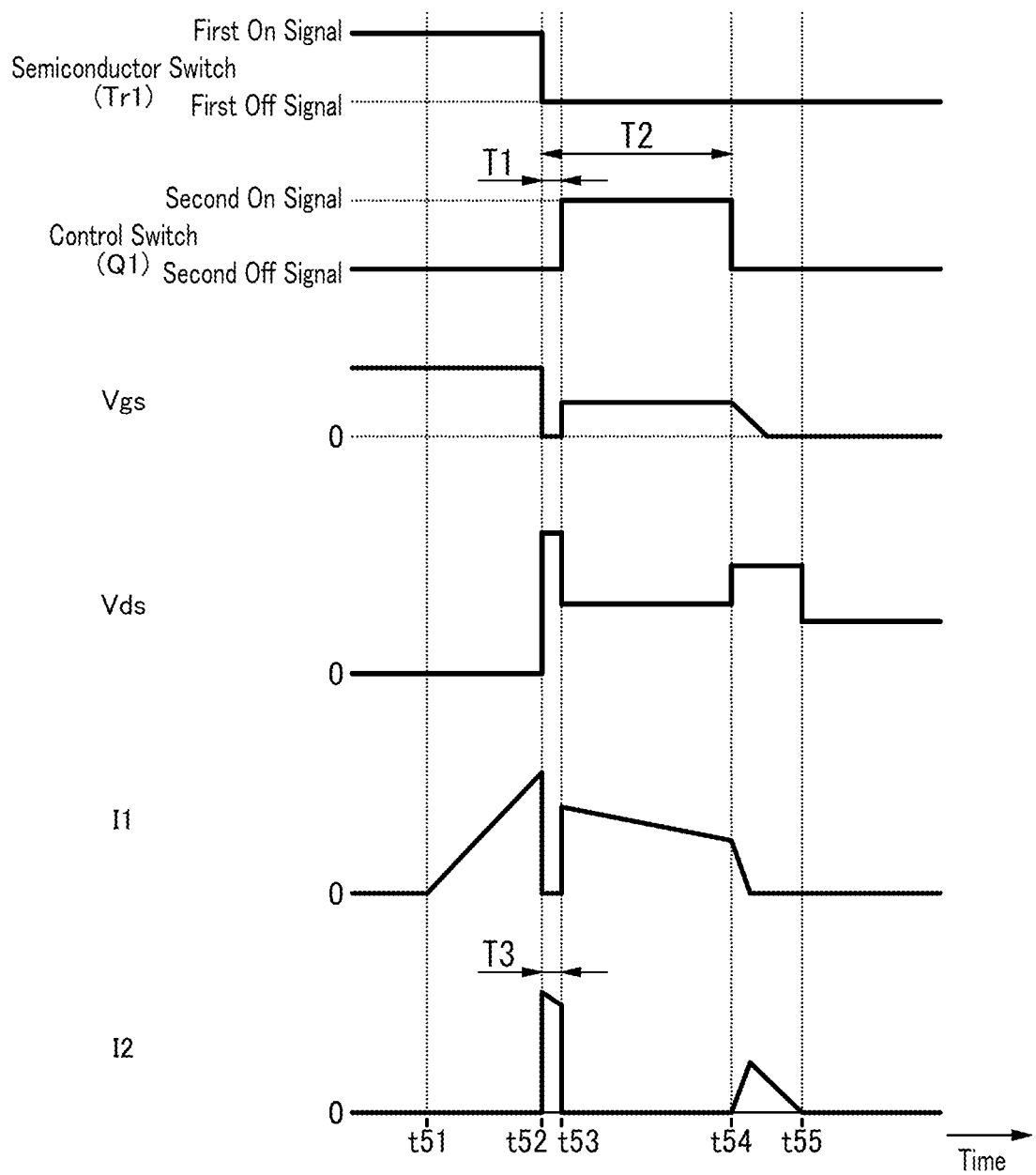
FIG. 24 illustrates how the switch system operates.

FIG. 24 illustrates how the switch system 20Q operates, for example, in a situation where a short-circuit failure occurs to the load circuit 204 at a time t51 to cause the main current I1 of the semiconductor switch 1 to start to increase.

When the first control signal output from the first control unit 4 changes from a first on signal into a first off signal at a time t52, the main current I1 flowing through the semiconductor switch 1 becomes zero and a current I2 flows through the voltage clamping element 2.

Thereafter, when the second control signal output from the second control unit 5Q changes from a second off signal into a second on signal at a time t53, the control switch 33 of the active clamping circuit 3 is turned on. In the switch system 20Q, the breakdown voltage of the first diode 31 is smaller than the clamp voltage of the voltage clamping element 2. Thus, the voltage Vds between the first main terminal 11 and second main terminal 12 of the semiconductor switch 1 is clamped by the active clamping circuit 3, and part of the energy stored in the inductance component of the line 203 of the load circuit 204 is consumed by the semiconductor switch 1.

Thereafter, at a time t54, when a second period T2 passes since the time t52, the second control signal output from the second control unit 5Q changes from the second on signal into the second off signal. In response, a current I2 starts to flow again through the voltage clamping element 2, the voltage Vds between the first main terminal 11 and second main terminal 12 of the semiconductor switch 1 is clamped at the clamp voltage of the voltage clamping element 2, and the absolute value of a current variation ratio (−dI1/dt) of the main current I1 of the semiconductor switch 1 increases to cause the main current I1 to decrease steeply to zero. In the switch system 20Q, when the main current I1 of the semiconductor switch 1 goes zero, the current I2 of the voltage clamping element 2 starts to decrease.

When the current I2 of the voltage clamping element 2 goes zero at a time t55, the voltage Vds between the first main terminal 11 and second main terminal 12 of the semiconductor switch 1 becomes a constant voltage lower than the clamp voltage.

The switch system 20Q may make the current value of the main current I1 flowing through the semiconductor switch 1 at the time t54 smaller than the current value of the main current I1 flowing through the semiconductor switch 1 at the time t52. This allows the switch system 20Q to reduce the clamp voltage of the voltage clamping element 2 and thereby lower the voltage Vds between the first main terminal 11 and second main terminal 12 of the semiconductor switch 1.

The switch system 20Q according to the eighteenth embodiment may also reduce the surge voltage applied to the semiconductor switch 1 when the semiconductor switch 1 turns off.

Nineteenth Embodiment

Figure 25:
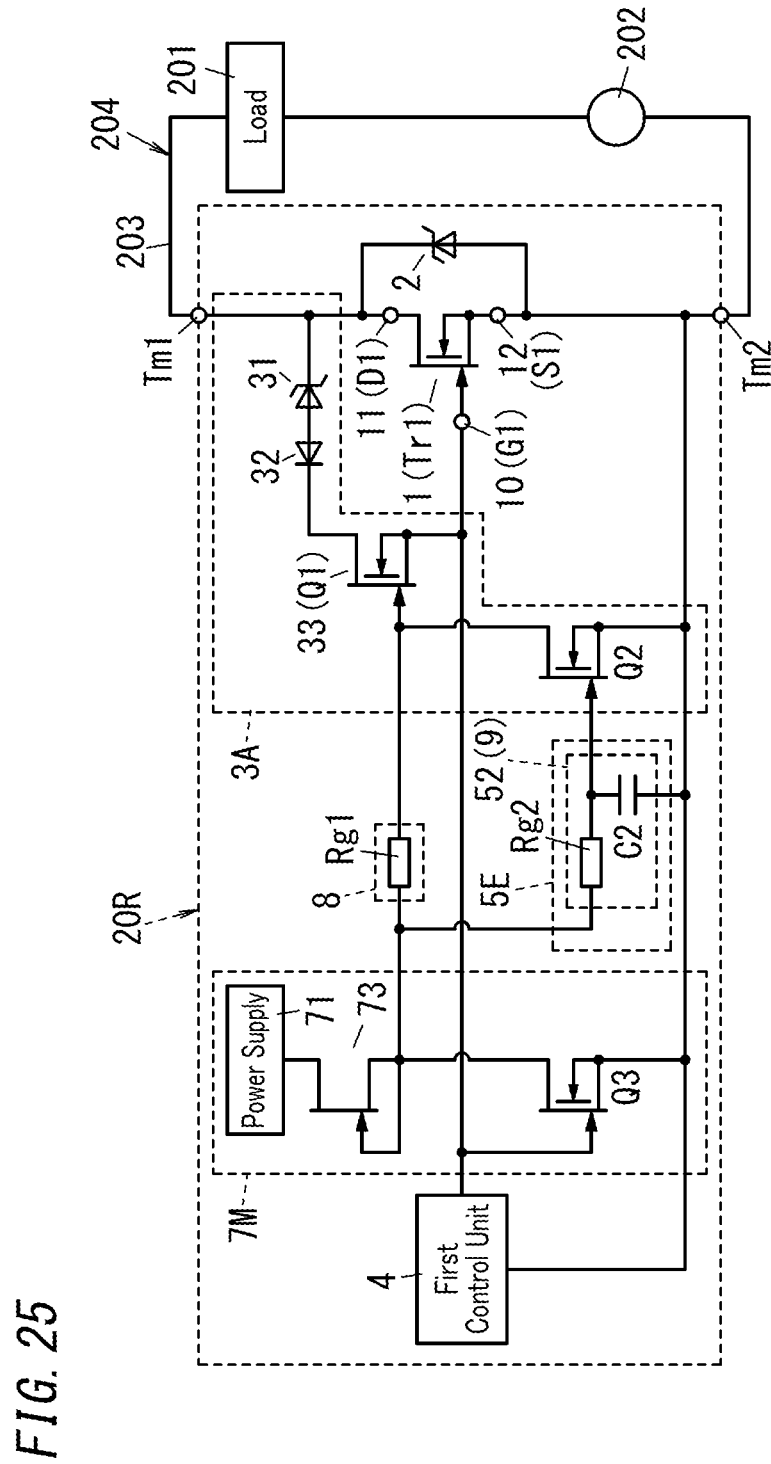
FIG. 25 is a circuit diagram of a switch system according to a nineteenth embodiment.

Next, a switch system 20R according to a nineteenth embodiment will be described with reference to FIG. 25.

The switch system 20R according to the nineteenth embodiment is substantially the same as the switch system 20F according to the seventh embodiment (refer to FIG. 8) but includes a NOT circuit 7M instead of the NOT circuit 7F, which is a difference from the switch system 20F. In addition, the switch system 20R according to the nineteenth embodiment does not include the third drive circuit 13 of the switch system 20F according to the seventh embodiment, which is another difference from the switch system 20F. In the following description, any constituent element of the switch system 20R according to this nineteenth embodiment, having the same function as a counterpart of the switch system 20F according to the seventh embodiment, will be designated by the same reference numeral as that counterpart's, and description thereof will be omitted herein.

The NOT circuit 7M includes a power supply 71, a diode 73, and a third field effect transistor Q3. The power supply 71 is a DC power supply. The diode 73 is formed by connecting together the gate and source of the field effect transistor. The diode 73 is connected to the power supply 71 in series. The third field effect transistor Q3 has a third gate, a third drain, and a third source. The third field effect transistor Q3 is connected to the diode 73 in series. In the third field effect transistor Q3, the third drain thereof is connected to the diode 73 and the third source thereof is connected to the second source of the second field effect transistor Q2 and the second main terminal 12 of the semiconductor switch 1. The third field effect transistor Q3 may be, for example, a junction field effect transistor. However, this is only an example and should not be construed as limiting. Alternatively, the third field effect transistor Q3 may also be a MOSFET. The first control unit 4 and the third gate of the third field effect transistor Q3 are connected to a signal path between the first control unit 4 and the semiconductor switch 1.

In the switch system 20R according to the nineteenth embodiment, as well as the switch system 20Q according to the eighteenth embodiment, before the first control unit 4 outputs a first off signal to turn the semiconductor switch 1 off while outputting a first on signal to turn the semiconductor switch 1 on, the second control unit 5E outputs a second off signal to turn the control switch 33 off. In the switch system 20R, the second control unit 5E outputs a second on signal to turn the control switch 33 on when a first period has passed since the output of the first off signal from the first control unit 4. In the switch system 20R, the second control unit 5E outputs a second off signal to turn the control switch 33 off when a second period (i.e., a time delay determined by the delay circuit 52) has passed since the output of the first off signal from the first control unit 4. The switch system 20R satisfies T1≤(T2−T1) and T1≤T3, where T1 is the first period (refer to FIG. 24), T2 is the second period (refer to FIG. 24), and T3 is a third period (refer to FIG. 24) between a point in time when the first control unit 4 has output the first off signal and a point in time when a current I2 flowing through the voltage clamping element 2 becomes equal to zero.

The switch system 20R according to the nineteenth embodiment may also reduce the surge voltage applied to the semiconductor switch 1 when the semiconductor switch 1 turns off.

(Variations)

Note that the first to nineteenth embodiments described above are only exemplary ones of various embodiments of the present disclosure and should not be construed as limiting. Rather, the first to nineteenth embodiments may be readily modified in various manners depending on a design choice or any other factor without departing from the scope of the present disclosure.

For example, the semiconductor switch 1 does not have to be a junction field effect transistor Tr1 but may also be, for example, a MOSFET or an insulated gate bipolar transistor (IGBT).

(Aspects)

The first through nineteenth embodiments and their variations described above are specific implementations of the following aspects of the present disclosure.

A switch system (20; 20A; 20B; 20C; 20D; 20E; 20F; 20G; 20J; 20K; 20O; 20P) according to a first aspect includes a semiconductor switch (1; 1K), a voltage clamping element (2), an active clamping circuit (3; 3A; 30), a first control unit (4), and a second control unit (5; 5A; 5D; 5E). The semiconductor switch (1; 1K) has a control terminal (10), a first main terminal (11), and a second main terminal (12). The voltage clamping element (2) is connected to the semiconductor switch (1; 1K) in parallel. The active clamping circuit (3; 3A; 30) is connected between the control terminal (10) and the first main terminal (11) of the semiconductor switch (1; 1K). The first control unit (4) controls the semiconductor switch (1; 1K). The second control unit (5; 5A; 5D; 5E) controls the active clamping circuit (3; 3A; 30). The active clamping circuit (3; 3A; 30) includes a first diode (31), a second diode (32), and a control switch (33). The first diode (31) has a first anode and a first cathode. The first diode (31) causes breakdown upon application of voltage between the first main terminal (11) and the second main terminal (12) of the semiconductor switch (1; 1K). The second diode (32) has a second anode and a second cathode. The second anode of the second diode (32) is connected to the first anode of the first diode (31). The control switch (33) is connected between the first anode of the first diode (31) and the control terminal (10) of the semiconductor switch (1). The second control unit (5; 5A; 5D; 5E) is configured to control the control switch (33). A breakdown voltage of the first diode (31) is smaller than a clamp voltage of the voltage clamping element (2).

The switch system (20; 20A; 20B; 20C; 20D; 20E; 20F; 20G; 20J; 20K; 20O; 20P) according to the first aspect may reduce a surge voltage applied to the semiconductor switch (1; 1K) when the semiconductor switch (1; 1K) turns off.

In a switch system (20A; 20B; 20C; 20D; 20E; 20F; 20G) according to a second aspect, which may be implemented in conjunction with the first aspect, the control switch (33) is a first field effect transistor (Q1) having a first gate, a first drain, and a first source. The active clamping circuit (3A) further includes a second field effect transistor (Q2). The second field effect transistor (Q2) has a second gate, a second drain, and a second source. The second field effect transistor (Q2) is connected between the first gate of the first field effect transistor (Q1) and the second main terminal (12) of the semiconductor switch (1; 1K). The second control unit (5A; 5D; 5E) controls the second field effect transistor (Q2).

The switch system (20A; 20B; 20C; 20D; 20E; 20F; 20G) according to the second aspect may turn the first field effect transistor (Q1) off by making the second control unit (5A; 5D; 5E) turn the second field effect transistor (Q2) on.

A switch system (20B) according to a third aspect, which may be implemented in conjunction with the second aspect, further includes a delay circuit (6). The delay circuit (6) is connected between a signal path that connects the second control unit (5A) to the first gate of the first field effect transistor (Q1) and the second gate of the second field effect transistor (Q2).

In the switch system (20B) according to the third aspect, the first field effect transistor (Q1) turns on when the second control unit (5A) outputs a control signal that turns the first field effect transistor (Q1) on, and the first field effect transistor (Q1) turns off when the second field effect transistor (Q2) turns on after a time delay introduced by the delay circuit (6). Thus, the switch system (20B) according to the third aspect may determine the conductive period of the first field effect transistor (Q1) by the time delay introduced by the delay circuit (6). In addition, the switch system (20B) according to the third aspect may control the first field effect transistor (Q1) and the second field effect transistor (Q2) using a single second control unit (5A).

A switch system (20C; 20D; 20E; 20F; 20G) according to a fourth aspect, which may be implemented in conjunction with the second aspect, further includes a NOT circuit (7; 7F; 7G). The NOT circuit (7; 7F; 7G) is connected between a signal path that connects the first control unit (4) to the control terminal (10) of the semiconductor switch (1; 1K) and the first gate of the first field effect transistor (Q1). The second control unit (5A; 5D; 5E) is connected to the second gate of the second field effect transistor (Q2).

The switch system (20C; 20D; 20E; 20F; 20G) according to the fourth aspect may control the semiconductor switch (1; 1K) and the field effect transistor (Q1) using the first control unit (4).

In a switch system (20D; 20E; 20F; 20G) according to a fifth aspect, which may be implemented in conjunction with the fourth aspect, the second control unit (5D) includes a delay circuit (52). The delay circuit (52) is connected between an output terminal of the NOT circuit (7; 7F; 7G) and the second gate of the second field effect transistor (Q2).

The switch system (20D; 20E; 20F; 20G) according to the fifth aspect allows the second control unit (5D; 5E) to use a control signal supplied from the first control unit (4), thus contributing to cutting down the cost.

A switch system (20E; 20F; 20G) according to a sixth aspect, which may be implemented in conjunction with the fifth aspect, further includes a first drive circuit (8). The first drive circuit (8) has a first gate resistor (Rg1). The first gate resistor (Rg1) is connected between the output terminal of the NOT circuit (7; 7F; 7G) and the first gate of the first field effect transistor (Q1). The delay circuit (52) is implemented as a second drive circuit (9) including a second gate resistor (Rg2) and a capacitor (C2). The second gate resistor (Rg2) is connected between the output terminal of the NOT circuit (7; 7F; 7G) and the second gate of the second field effect transistor (Q2). The capacitor (C2) is connected between the second gate and the second source of the second field effect transistor (Q2).

The switch system (20E; 20F; 20G) according to the sixth aspect allows the delay circuit (52) to be formed by the second gate resistor (Rg2) and the capacitor (C2), thus contributing to cutting down the cost of the delay circuit (52).

A switch system (20F) according to a seventh aspect, which may be implemented in conjunction with the sixth aspect, further includes a third drive circuit (13). The third drive circuit (13) is connected between the first control unit (4) and the control terminal (10) of the semiconductor switch (1; 1K). The NOT circuit (7) includes a power supply (71), a resistor (72), a third field effect transistor (Q3), and a fourth drive circuit (74). The resistor (72) is connected to the power supply (71) in series. The third field effect transistor (Q3) has a third gate, a third drain, and a third source. The third field effect transistor (Q3) is connected to the resistor (72) in series. The fourth drive circuit (74) is connected between the first control unit (4) and the third gate of the third field effect transistor (Q3).

A switch system (20G) according to an eighth aspect, which may be implemented in conjunction with the sixth aspect, further includes a third drive circuit (13). The third drive circuit (13G) is connected between the first control unit (4) and the control terminal (10) of the semiconductor switch (1; 1K). The NOT circuit (7G) includes a power supply (71), a resistor (72), and a third field effect transistor (Q3). The resistor (72) is connected to the power supply (71) in series. The third field effect transistor (Q3) has a third gate, a third drain, and a third source. The third field effect transistor (Q3) is connected to the resistor (72) in series. The third drive circuit (13G) has a first path (131) to turn the semiconductor switch (1; 1K) on and a second path (132) to turn the semiconductor switch (1; 1K) off. The first path (131) includes a third diode (133) and a third gate resistor (Rg3). The third diode (133) has a third anode and a third cathode. The third cathode of the third diode (133) is connected to the control terminal (10) of the semiconductor switch (1; 1K). The third gate resistor (Rg3) is connected to the third diode (133) in series. The second path (132) includes a resistor (134) having a smaller resistance value than the third gate resistor (Rg3). The resistor (134) is connected between the first control unit (4) and the control terminal (10) of the semiconductor switch (1; 1K). In the switch system (20G), the first field effect transistor (Q1) of the active clamping circuit (3A) turns on before the semiconductor switch (1; 1K) turns off.

In the switch system (20G) according to the eighth aspect, if the semiconductor switch (1; 1K) is a GaN-based GIT, the first path (131) is used to turn the semiconductor switch (1; 1K) on, thus reducing the chances of causing a decline in the gate voltage. In addition, in this switch system (20G), the second path (132) is used to turn the semiconductor switch (1; 1K) off. This reduces the chances of the semiconductor switch (1; 1K) turning off before the control switch (33) of the active clamping circuit (3A) turns on.

A switch system (20H) according to a ninth aspect includes a semiconductor switch (1; 1K), a voltage clamping element (2), an active clamping circuit (3H), a first control unit (4), and a second control unit (5H). The semiconductor switch (1; 1K) has a control terminal (10), a first main terminal (11), and a second main terminal (12). The voltage clamping element (2) is connected to the semiconductor switch (1; 1K) in parallel. The active clamping circuit (3H) is connected between the control terminal (10) and the first main terminal (11) of the semiconductor switch (1; 1K). The first control unit (4) controls the semiconductor switch (1; 1K). The second control unit (5H) controls the active clamping circuit (3H). The active clamping circuit (3H) includes a first diode (31), a second diode (32), and a control switch (33H). The first diode (31) has a first anode and a first cathode. The first diode (31) causes breakdown upon application of voltage between the first main terminal (11) and the second main terminal (12) of the semiconductor switch (1; 1K). The second diode (32) has a second anode and a second cathode. The second anode of the second diode (32) is connected to the first anode of the first diode (31). The control switch (33H) is connected between the first anode of the first diode (31) and the control terminal (10) of the semiconductor switch (1; 1K). The control switch (33H) is a pnp transistor (Qp1) having a base, a collector, and an emitter. The emitter of the pnp transistor (Qp1) is connected to the second cathode of the second diode (32). The collector of the pnp transistor (Qp1) is connected to the control terminal (10) of the semiconductor switch (1; 1K). The second control unit (5H) includes a first resistor (R1), a second resistor (R2), a field effect transistor (Q4), and a delay circuit (54). The first resistor (R1) is connected between the base and the emitter of the pnp transistor (Qp1). The second resistor (R2) is connected to the base of the pnp transistor (Qp1) and connected to the first resistor (R1) in series. The field effect transistor (Q4) has a gate, a drain, and a source. The field effect transistor (Q4) is connected between the second resistor (R2) and the second main terminal (12) of the semiconductor switch (1; 1K). The delay circuit (54) is connected between the first control unit (4) and the gate of the field effect transistor (Q4). The delay circuit (54) includes a gate resistor (Rg4) and a capacitor (C4). The gate resistor (Rg4) is connected between the first control unit (4) and the gate of the field effect transistor (Q4). The capacitor (C4) is connected between the gate and the source of the field effect transistor (Q4). A breakdown voltage of the first diode (31) is smaller than a clamp voltage of the voltage clamping element (2).

The switch system (20H) according to the ninth aspect may reduce a surge voltage applied to the semiconductor switch (1; 1K) when the semiconductor switch (1; 1K) turns off.

A switch system (20I) according to a tenth aspect includes a semiconductor switch (1; 1K), a voltage clamping element (2I), an active clamping circuit (3I), a first control unit (4), and a second control unit (5I). The semiconductor switch (1; 1K) has a control terminal (10), a first main terminal (11), and a second main terminal (12). The voltage clamping element (2I) is connected to the semiconductor switch (1; 1K) in parallel. The active clamping circuit (3I) is connected between the control terminal (10) and the first main terminal (11) of the semiconductor switch (1; 1K). The first control unit (4) controls the semiconductor switch (1; 1K). The second control unit (5I) controls the active clamping circuit (3I). The active clamping circuit (3I) includes a first diode (31), a second diode (32), and a control switch (33). The first diode (31) has a first anode and a first cathode. The first diode (31) causes breakdown upon application of voltage between the first main terminal (11) and the second main terminal (12) of the semiconductor switch (1; 1K). The second diode (32) has a second anode and a second cathode. The second cathode of the second diode (32) is connected to the first cathode of the first diode (31). The control switch (33) is connected between the first anode of the first diode (31) and the control terminal (10) of the semiconductor switch (1; 1K). The control switch (33) is a field effect transistor (Q1) having a gate, a drain, and a source. The drain of the field effect transistor (Q1) is connected to the first anode of the first diode (31). The source of the field effect transistor (Q1) is connected to the control terminal (10) of the semiconductor switch (1; 1K). The second control unit (5I) includes a capacitor (55) and a Zener diode (56). The capacitor (55) has a first terminal and a second terminal. The first terminal of the capacitor (55) is connected to the gate of the field effect transistor (Q1). The second terminal of the capacitor (55) is connected to the first cathode of the first diode (31) and the second cathode of the second diode (32). The Zener diode (56) has a third anode and a third cathode. The third cathode of the Zener diode (56) is connected to the first terminal of the capacitor (55) and the gate of the field effect transistor (Q1). The third anode of the Zener diode (56) is connected to the source of the field effect transistor (Q1).

The switch system (20I) according to the tenth aspect may reduce a surge voltage applied to the semiconductor switch (1; 1K) when the semiconductor switch (1; 1K) turns off.

A switch system (20; 20A; 20B; 20C; 20D; 20E; 20F; 20G; 20H; 20I; 20J) according to an eleventh aspect, which may be implemented in conjunction with any one of the first to tenth aspects, further includes a detection circuit (14) and a switch element (15). The detection circuit (14) is connected between the control terminal (10) and the second main terminal (12) of the semiconductor switch (1). The detection circuit (14) detects a voltage between the control terminal (10) and the second main terminal (12) of the semiconductor switch (1; 1K). The switch element (15) is connected between the control terminal (10) and the second main terminal (12) of the semiconductor switch (1; 1K). In the switch system (20; 20A; 20B; 20C; 20D; 20E; 20F; 20G; 20H; 20I; 20J), the switch element (15) turns on when the voltage detected by the detection circuit (14) exceeds a threshold voltage (Vth).

In the switch system (20; 20A; 20B; 20C; 20D; 20E; 20F; 20G; 20H; 20I; 20J) according to the eleventh aspect, when the switch element (15) turns on, the semiconductor switch (1; 1K) turns off. This reduces the chances of causing deterioration in the characteristic of the semiconductor switch (1; 1K) due to an increase in voltage between the control terminal (10) and second main terminal (12) of the semiconductor switch (1; 1K).

In a switch system (20; 20A; 20B; 20C; 20D; 20E; 20F; 20G; 20H; 20I; 20J) according to a twelfth aspect, which may be implemented in conjunction with the eleventh aspect, the semiconductor switch (1) is a junction field effect transistor (Tr1). With respect to a gate voltage (Vgs) of the junction field effect transistor (Tr1), the threshold voltage (Vth) is larger than a gate voltage (Vg1) of the junction field effect transistor (Tr1) in on state and smaller than an output voltage of a DC power supply included in the first control unit (4).

The switch system (20; 20A; 20B; 20C; 20D; 20E; 20F; 20G; 20H; 20I; 20J) according to the twelfth aspect may reduce deterioration in the characteristics of the semiconductor switch (1) due to an increase in the gate voltage (Vgs) of the junction field effect transistor (Tr1) while the active clamping circuit (3; 3A) is performing a clamping operation.

In a switch system (20; 20A; 20B; 20C; 20D; 20E; 20F; 20G; 20H; 20I; 20J; 20K) according to a thirteenth aspect, which may be implemented in conjunction with any one of the first to twelfth aspects, the semiconductor switch (1K) is made up of a plurality of field effect transistors (Tr2) that are connected in parallel. Each of the plurality of field effect transistors (Tr2) has a gate, a drain, and a source. The first main terminal (11) of the semiconductor switch (1K) is connected to respective drains of the plurality of field effect transistors (Tr2). The second main terminal (12) of the semiconductor switch (1K) is connected to respective sources of the plurality of field effect transistors (Tr2). The switch system (20; 20A; 20B; 20C; 20D; 20E; 20F; 20G; 20H; 20I; 20J; 20K) further includes a plurality of gate resistors (R20). The plurality of gate resistors (R20) are associated one to one with respective gates and connected between the first control unit (4) and the respective gates. The plurality of gate transistors (R20) are connected to the active clamping circuit (3; 3A).

The switch system (20; 20A; 20B; 20C; 20D; 20E; 20F; 20G; 20H; 20I; 20J; 20K) according to the thirteenth aspect allows the semiconductor switch (1K) to have a permissible current with an increased current value.

In a switch system (20L) according to a fourteenth aspect, which may be implemented in conjunction with any one of the first to thirteenth aspects, the semiconductor switch (1L) includes a first switch element (101) and a second switch element (102). The first switch element (101) has a first gate terminal (G11), a first drain terminal (D11), and a first source terminal (S11). The second switch element (102) has a second gate terminal (G12), a second drain terminal (D12), and a second source terminal (S12). The second switch element (102) is connected to the first switch element (101) in series. In the semiconductor switch (1L), the first drain terminal (D11) of the first switch element (101) and the second drain terminal (D12) of the second switch element (102) are connected to each other. The semiconductor switch (1L) includes two sets, each consisting of the control terminal, the first main terminal, and the second main terminal. In one of the two sets, the control terminal, the first main terminal, and the second main terminal are the first gate terminal (G11), the second source terminal (S12), and the first source terminal (S11), respectively. In the other of the two sets, the control terminal, the first main terminal, and the second main terminal are the second gate terminal (G12), the first source terminal (S11), and the second source terminal (S12), respectively. The switch system (20L) includes two active clamping circuits (3A), each of which is the active clamping circuit (3A). In the switch system (20L), one of the two active clamping circuits (3A) is connected between the first gate terminal (G11) and the second source terminal (S12), and the other active clamping circuit (3A) is connected between the second gate terminal (G12) and the first source terminal (S11).

The switch system (20L) according to the fourteenth aspect is applicable to a load circuit (204) including an AC power supply.

A switch system (20M) according to a fifteenth aspect, which may be implemented in conjunction with any one of the first to thirteenth aspects, includes two semiconductor switches (1), each of which is the semiconductor switch (1), two voltage clamping elements (2), each of which is the voltage clamping element (2), and two active clamping circuits (3A), each of which is the active clamping circuit (3A). In each of the two semiconductor switches (1), the control terminal (10), the first main terminal (11), and the second main terminal (12) thereof are a gate terminal (G1), a drain terminal (D1), and a source terminal (S1), respectively. In the switch system (20M), the two semiconductor switches (1) are connected in series by connecting respective source terminals (S1) thereof together. The two voltage clamping elements (2) are associated one to one with the two semiconductor switches (1), respectively. Each of the two voltage clamping elements (2) is connected to an associated one of the two semiconductor switches (1) in parallel. The two active clamping circuits (3A) are associated one to one with the two semiconductor switches (1), respectively. Each of the two active clamping circuits (3A) is connected between the gate terminal (G1) and the drain terminal (D1) of an associated one of the two semiconductor switches (1).

The switch system (20M) according to the fifteenth aspect is applicable to a load circuit (204) including an AC power supply.

In a switch system (20N) according to a sixteenth aspect, which may be implemented in conjunction with any one of the first to thirteenth aspects, the semiconductor switch (1N) is a dual-gate bidirectional switch having a first gate terminal (G11), a first source terminal (S11) corresponding to the first gate terminal (G11), a second gate terminal (G12), and a second source terminal (S12) corresponding to the second gate terminal (G12). The semiconductor switch (1N) includes two sets, each consisting of the control terminal, the first main terminal, and the second main terminal. In one of the two sets, the control terminal, the first main terminal, and the second main terminal are the first gate terminal (G11), the second source terminal (S12), and the first source terminal (S11), respectively. In the other of the two sets, the control terminal, the first main terminal, and the second main terminal are the second gate terminal (G12), the first source terminal (S11), and the second source terminal (S12), respectively. The switch system (20N) includes two active clamping circuits (3A), each of which is the active clamping circuit (3A). In the switch system (20N), one of the two active clamping circuits (3A) is connected between the first gate terminal (G11) and the second source terminal (S12), and the other active clamping circuit (3A) is connected between the second gate terminal (G12) and the first source terminal (S11).

The switch system (20N) according to the sixteenth aspect is applicable to a load circuit (204) including an AC power supply.

A switch system (20; 20A; 20B; 20C; 20D; 20E; 20F; 20G; 20H; 20J; 20K; 20L; 20M; 20N; 20O; 20P; 20Q; 20R) according to a seventeenth aspect, which may be implemented in conjunction with any one of the first to sixteenth aspects, further includes a current detection unit (16). The current detection unit (16) detects a current flowing through the second main terminal (12) of the semiconductor switch (1; 1K; 1L; 1N). The second control unit (5; 5A; 5H; 5E) changes a conductive period of the control switch (33; 33H) according to output of the current detection unit (16).

The switch system (20; 20A; 20B; 20C; 20D; 20E; 20F; 20G; 20H; 20J; 20K; 20L; 20M; 20N; 20O; 20P; 20Q; 20R) according to the seventeenth aspect may reduce the chances of allowing an overcurrent to flow through the voltage clamping element (2) to cause deterioration in the performance of the voltage clamping element (2).

A switch system (20P) according to an eighteenth aspect, which may be implemented in conjunction with the second aspect, further includes a current detection unit (16P). The second control unit (5P) includes a third field effect transistor (Q13). The current detection unit (16P) detects a current flowing through the second main terminal (12) of the semiconductor switch (1). The third field effect transistor (Q13) has a third gate, a third drain, and a third source. The current detection unit (16P) includes a detecting resistor (161) and an integration circuit (162). The detecting resistor (161) is connected to the second main terminal (12) of the semiconductor switch (1) and connected to the semiconductor switch (1) in series. The integration circuit (162) integrates voltage across the detecting resistor (161). In the switch system (20P), the second gate of the second field effect transistor (Q2) is connected to an output terminal of the integration circuit (162). In the switch system (20P), the third drain of the third field effect transistor (Q13) is connected to the output terminal of the integration circuit (162). In the switch system (20P), the third gate of the third field effect transistor (Q13) is connected to a signal path between the first control unit (4) and the control terminal (10) of the semiconductor switch (1).

In the switch system (20P) according to the eighteenth aspect, the timing when the second field effect transistor (Q2) turns on varies according to the amount of current flowing through the second main terminal (12) of the semiconductor switch (1), thus changing the duration for which the first field effect transistor (Q1) is energized.

In a switch system (20) according to a nineteenth aspect, which may be implemented in conjunction with the first aspect, the second control unit (5) outputs a second on signal to turn the control switch (33) on, while the first control unit (4) is outputting a first on signal to turn the semiconductor switch (1) on before outputting a first off signal to turn the semiconductor switch (1) off. In the switch system (20), the second control unit (5) outputs a second off signal to turn the control switch (33) off when a predetermined period (TO) has passed since output of the first off signal from the first control unit (4).

In a switch system (20Q; 20R) according to a twentieth aspect, which may be implemented in conjunction with the first aspect, the second control unit (5Q; 5E) outputs a second off signal to turn the control switch (33) off, while the first control unit (4) is outputting a first on signal to turn the semiconductor switch (1) on before outputting a first off signal to turn the semiconductor switch (1) off. In the switch system (20Q; 20R), the second control unit (5) outputs a second on signal to turn the control switch (33) on when a first period has passed since output of the first off signal from the first control unit (4). In the switch system (20Q; 20R), the second control unit (5Q; 5E) outputs a second off signal to turn the control switch (33) off when a second period has passed since the output of the first off signal from the first control unit (4). The switch system (20Q; 20R) satisfies T1≤(T2−T1) and T1≤T3, where T1 is the first period, T2 is the second period, and T3 is a third period between a point in time when the first control unit 4 has output the first off signal and a point in time when a current (I2) flowing through the voltage clamping element (2) becomes equal to zero.

REFERENCE SIGNS LIST 1, 1K, 1L, 1N Semiconductor Switch
10 Control Terminal
11 First Main Terminal
12 Second Main Terminal
101 First Switch Element
102 Second Switch Element
2, 2i Voltage Clamping Element
3, 3A, 3H, 3I, 30 Active Clamping Circuit
31 First Diode
32 Second Diode
33, 33H Control Switch
4 First Control Unit
5, 5A, 5D, 5E, 5H, 5I, 5Q Second Control Unit
52 Delay Circuit
54 Delay Circuit
55 Capacitor
56 Zener Diode
6 Delay Circuit
7, 7F, 7G, 7M Not Circuit
71 Power Supply
72 Resistor
74 Fourth Drive Circuit
8 First Drive Circuit
9 Second Drive Circuit
13, 13G Third Drive Circuit
131 First Path
132 Second Path
133 Third Diode
134 Resistor
14 Detection Circuit
15 Switch Element
16 Current Detection Unit
16P Current Detection Unit
161 Detecting Resistor
162 Integration Circuit 20, 20A, 20B, 20C, 20D, 20E, 20F, 20G, 20H, 20I, 20J, 20K, 20L, 20M, 20N, 20O, 20P, 20Q, 20R Switch System
C2 Capacitor
C4 Capacitor
D1 Drain Terminal
D11 First Drain Terminal
D12 Second Drain Terminal
G1 Gate Terminal
G11 First Gate Terminal
G12 Second Gate Terminal
Q1 Field Effect Transistor (First Field Effect Transistor)
Q2 Second Field Effect Transistor
Q3 Third Field Effect Transistor
Q4 Field Effect Transistor
Q13 Third Field Effect Transistor
Qp1 pnp Transistor
R1 First Resistor
R2 Second Resistor
Rg1 First Gate Resistor
Rg2 Second Gate Resistor
Rg3 Third Gate Resistor
Rg4 Gate Resistor
R20 Gate Resistor
S1 Source Terminal
Tr1 Junction Field Effect Transistor
Tr2 Field Effect Transistor

The invention claimed is:

1. A switch system comprising:
a semiconductor switch having a control terminal, a first main terminal, and a second main terminal;
a voltage clamping element connected to the semiconductor switch in parallel;
an active clamping circuit connected between the control terminal and the first main terminal of the semiconductor switch;
a first control unit configured to control the semiconductor switch;
a second control unit configured to control the active clamping circuit; and
a NOT circuit,
the active clamping circuit including:
a first diode having a first anode and a first cathode and causing breakdown upon application of voltage between the first main terminal and the second main terminal of the semiconductor switch;
a second diode having a second anode and a second cathode, the second anode of the second diode being connected to the first anode of the first diode; and
a control switch connected between the first anode of the first diode and the control terminal of the semiconductor switch,
the second control unit being configured to control the control switch,
a breakdown voltage of the first diode being smaller than a clamp voltage of the voltage clamping element,
wherein
the control switch is a first field effect transistor having a first gate, a first drain, and a first source,
the active clamping circuit further includes a second field effect transistor having a second gate, a second drain, and a second source and connected between the first gate of the first field effect transistor and the second main terminal of the semiconductor switch,
the second control unit is configured to control the second field effect transistor,
the NOT circuit is connected between a signal path that connects the first control unit to the control terminal of the semiconductor switch and the first gate of the first field effect transistor, and
the second control unit is connected to the second gate of the second field effect transistor.

2. The switch system of claim 1, wherein
the second control unit includes a delay circuit, and
the delay circuit is connected between an output terminal of the NOT circuit and the second gate of the second field effect transistor.

3. The switch system of claim 2, further comprising a first drive circuit having a first gate resistor connected between the output terminal of the NOT circuit and the first gate of the first field effect transistor, wherein
the delay circuit is implemented as a second drive circuit, the second drive circuit including:
a second gate resistor connected between the output terminal of the NOT circuit and the second gate of the second field effect transistor; and
a capacitor connected between the second gate and the second source of the second field effect transistor.

4. The switch system of claim 3, further comprising a third drive circuit connected between the first control unit and the control terminal of the semiconductor switch, wherein
the NOT circuit includes:
a power supply;
a resistor connected to the power supply in series;
a third field effect transistor having a third gate, a third drain, and a third source and connected to the resistor in series; and
a fourth drive circuit connected between the first control unit and the third gate of the third field effect transistor.

5. The switch system of claim 3, further comprising a third drive circuit connected between the first control unit and the control terminal of the semiconductor switch, wherein
the NOT circuit includes:
a power supply;
a resistor connected to the power supply in series; and
a third field effect transistor having a third gate, a third drain, and a third source and connected to the resistor in series,
the third drive circuit has:
a first path configured to turn the semiconductor switch on; and
a second path configured to turn the semiconductor switch off,
the first path includes:
a third diode having a third anode and a third cathode, the third cathode of the third diode being connected to the control terminal of the semiconductor switch; and
a third gate resistor connected to the third diode in series,
the second path includes a resistor connected between the first control unit and the control terminal of the semiconductor switch and having a smaller resistance value than the third gate resistor, and
the first field effect transistor of the active clamping circuit being configured to turn on before the semiconductor switch turns off.

6. A switch system comprising:
a semiconductor switch having a control terminal, a first main terminal, and a second main terminal;
a voltage clamping element connected to the semiconductor switch in parallel;

an active clamping circuit connected between the control terminal and the first main terminal of the semiconductor switch;
a first control unit configured to control the semiconductor switch;
a second control unit configured to control the active clamping circuit;
a detection circuit connected between the control terminal and the second main terminal of the semiconductor switch to detect a voltage between the control terminal and the second main terminal of the semiconductor switch; and
a switch element connected between the control terminal and the second main terminal of the semiconductor switch,
the active clamping circuit including:
a first diode having a first anode and a first cathode and causing breakdown upon application of voltage between the first main terminal and the second main terminal of the semiconductor switch;
a second diode having a second anode and a second cathode, the second anode of the second diode being connected to the first anode of the first diode; and
a control switch connected between the first anode of the first diode and the control terminal of the semiconductor switch,
the second control unit being configured to control the control switch,
a breakdown voltage of the first diode being smaller than a clamp voltage of the voltage clamping element, wherein
the switch element is configured to turn on when the voltage detected by the detection circuit exceeds a threshold voltage.

7. The switch system of claim 6, wherein
the semiconductor switch is a junction field effect transistor,
with respect to a gate voltage of the junction field effect transistor, the threshold voltage is larger than a gate voltage of the junction field effect transistor in on state and smaller than an output voltage of a DC power supply included in the first control unit.

8. The switch system of claim 1, wherein
the semiconductor switch is made up of a plurality of field effect transistors that are connected in parallel,
each of the plurality of field effect transistors has a gate, a drain, and a source,
the first main terminal of the semiconductor switch is connected to respective drains of the plurality of field effect transistors,
the second main terminal of the semiconductor switch is connected to respective sources of the plurality of field effect transistors,
the switch system further includes a plurality of gate resistors associated one to one with respective gates of the plurality of field effect transistors and connected between the first control unit and the respective gates, and
the plurality of gate transistors are connected to the active clamping circuit.

9. The switch system of claim 1, comprising:
a first switch element having a first gate terminal, a first drain terminal, and a first source terminal; and
a second switch element having a second gate terminal, a second drain terminal, and a second source terminal and connected to the first switch element in series, wherein
in the semiconductor switch, the first drain terminal of the first switch element and the second drain terminal of the second switch element are connected to each other,
the semiconductor switch includes two sets, each consisting of the control terminal, the first main terminal, and the second main terminal,
in one of the two sets,
the control terminal, the first main terminal, and the second main terminal are the first gate terminal, the second source terminal, and the first source terminal, respectively,
in the other of the two sets,
the control terminal, the first main terminal, and the second main terminal are the second gate terminal, the first source terminal, and the second source terminal, respectively,
the switch system includes two active clamping circuits, each of which is the active clamping circuit, and
one of the two active clamping circuits is connected between the first gate terminal and the second source terminal and the other of the two active clamping circuits is connected between the second gate terminal and the first source terminal.

10. The switch system of claim 1, comprising:
two semiconductor switches, each of which is the semiconductor switch;
two voltage clamping elements, each of which is the voltage clamping element; and
two active clamping circuits, each of which is the active clamping circuit, wherein
in each of the two semiconductor switches,
the control terminal, the first main terminal, and the second main terminal thereof are a gate terminal, a drain terminal, and a source terminal, respectively,
the two semiconductor switches are connected in series by connecting respective source terminals thereof together,
the two voltage clamping elements are associated one to one with the two semiconductor switches, respectively, each of the two voltage clamping elements being connected to an associated one of the two semiconductor switches in parallel, and
the two active clamping circuits are associated one to one with the two semiconductor switches, respectively, each of the two active clamping circuits being connected between the gate terminal and the drain terminal of an associated one of the two semiconductor switches.

11. The switch system of claim 1, wherein
the semiconductor switch is a dual-gate bidirectional switch having a first gate terminal, a first source terminal corresponding to the first gate terminal, a second gate terminal, and a second source terminal corresponding to the second gate terminal,
the semiconductor switch includes two sets, each consisting of the control terminal, the first main terminal, and the second main terminal,
in one of the two sets,
the control terminal, the first main terminal, and the second main terminal are the first gate terminal, the second source terminal, and the first source terminal, respectively,
in the other of the two sets,
the control terminal, the first main terminal, and the second main terminal are the second gate terminal, the first source terminal, and the second source terminal, respectively, the switch system includes two active clamping circuits, each of which is the active clamping circuit, and one of the two active clamping circuits is connected between the first gate terminal and the second source terminal and the other of the two active clamping circuits is connected between the second gate terminal and the first source terminal.

12. A switch system comprising:

a semiconductor switch having a control terminal, a first main terminal, and a second main terminal;

a voltage clamping element connected to the semiconductor switch in parallel;

an active clamping circuit connected between the control terminal and the first main terminal of the semiconductor switch;

a first control unit configured to control the semiconductor switch;

a second control unit configured to control the active clamping circuit; and a current detection unit configured to detect a current flowing through the second main terminal of the semiconductor switch, the active clamping circuit including:

a first diode having a first anode and a first cathode and causing breakdown upon application of voltage between the first main terminal and the second main terminal of the semiconductor switch;

a second diode having a second anode and a second cathode, the second anode of the second diode being connected to the first anode of the first diode; and a control switch connected between the first anode of the first diode and the control terminal of the semiconductor switch, the second control unit being configured to control the control switch, a breakdown voltage of the first diode being smaller than a clamp voltage of the voltage clamping element, wherein the second control unit is configured to change a conductive period of the control switch according to output of the current detection unit.

* * * * *